US 7,317,205 B2

(12) United States Patent
Yamazaki et al.

(10) Patent No.: US 7,317,205 B2
(45) Date of Patent: Jan. 8, 2008

(54) LIGHT EMITTING DEVICE AND METHOD OF MANUFACTURING A SEMICONDUCTOR DEVICE

(75) Inventors: Shunpei Yamazaki, Tokyo (JP); Hideaki Kuwabara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/238,050

(22) Filed: Sep. 10, 2002

(65) Prior Publication Data
US 2003/0075733 A1   Apr. 24, 2003

(30) Foreign Application Priority Data
Sep. 10, 2001   (JP)   ............................. 2001-273912
Sep. 18, 2001   (JP)   ............................. 2001-282714

(51) Int. Cl.
*H01L 29/94*   (2006.01)
(52) U.S. Cl. .................... 257/59; 257/66; 257/72; 257/E21.133; 257/E27.131
(58) Field of Classification Search .............. 257/71, 257/200, 296, 359, 59, 330, 72; 315/169.1, 315/169.2, 169.3
See application file for complete search history.

(56) References Cited

U.S. PATENT DOCUMENTS

| 4,309,225 | A |   | 1/1982 | Fan et al. |
| 4,330,363 | A |   | 5/1982 | Biegesen et al. |
| 4,536,231 | A |   | 8/1985 | Kasten |
| 4,822,752 | A |   | 4/1989 | Sugahara et al. |
| 5,336,879 | A | * | 8/1994 | Sauer ....................... 250/208.1 |
| 5,432,122 | A |   | 7/1995 | Chae |
| 5,521,107 | A |   | 5/1996 | Yamazaki et al. |
| 5,583,369 | A |   | 12/1996 | Yamazaki et al. |
| 5,589,406 | A |   | 12/1996 | Kato et al. |
| 5,650,636 | A | * | 7/1997 | Takemura et al. ............ 257/59 |
| 5,712,191 | A |   | 1/1998 | Nakajima et al. |

(Continued)

FOREIGN PATENT DOCUMENTS

EP   0-878-789   11/1998

(Continued)

OTHER PUBLICATIONS

Kazutaka Inukui et al., SID'00, Disgest, May 16-18, 2000, vol. 31, pp. 924-927.*

(Continued)

*Primary Examiner*—Steven Loke
*Assistant Examiner*—Dao H. Nguyen
(74) *Attorney, Agent, or Firm*—Nixon Peabody LLP; Jeffrey L. Costellia

(57) ABSTRACT

Semiconductor layers for serving as active layers of a plurality of thin film transistors in a pixel are arranged in the same direction and irradiated with laser light with the scanning direction matched to the channel length direction of the semiconductor layers. It is possible to coincide the crystal growth direction with the carrier moving direction, and high field effect mobility can be obtained. Also, semiconductor layers for serving as active layers of a plurality of thin film transistors in a driving circuit and in a CPU are arranged in the same direction, and are irradiated with laser light with the scanning direction matched to the channel length direction of the semiconductor layers.

60 Claims, 32 Drawing Sheets

U.S. PATENT DOCUMENTS

| | | | |
|---|---|---|---|
| 5,729,308 A | 3/1998 | Yamazaki et al. | |
| 5,789,763 A | 8/1998 | Kato et al. | |
| 5,824,574 A | 10/1998 | Yamazaki et al. | |
| 5,904,770 A | 5/1999 | Ohtani et al. | |
| 5,929,464 A | 7/1999 | Yamazaki et al. | |
| 5,932,893 A | 8/1999 | Miyanaga et al. | |
| 5,937,282 A | 8/1999 | Nakajima et al. | |
| 5,943,593 A | 8/1999 | Noguchi et al. | |
| 5,946,561 A | 8/1999 | Yamazaki et al. | |
| 5,953,597 A | 9/1999 | Kusumoto et al. | |
| 5,956,603 A | 9/1999 | Talwar et al. | |
| 5,976,959 A | 11/1999 | Huang | |
| 5,981,974 A * | 11/1999 | Makita | 257/72 |
| 6,013,928 A | 1/2000 | Yamazaki et al. | |
| 6,096,581 A | 8/2000 | Zhang et al. | |
| 6,100,860 A | 8/2000 | Takayama et al. | |
| 6,118,149 A * | 9/2000 | Nakagawa et al. | 257/330 |
| 6,204,099 B1 | 3/2001 | Kusumoto et al. | |
| 6,232,156 B1 | 5/2001 | Ohtani et al. | |
| 6,242,289 B1 | 6/2001 | Nakajima et al. | |
| 6,265,745 B1 | 7/2001 | Kusumoto et al. | |
| 6,417,031 B2 | 7/2002 | Ohtani et al. | |
| 6,417,896 B1 | 7/2002 | Yamazaki et al. | |
| 6,424,326 B2 | 7/2002 | Yamazaki et al. | |
| 6,465,268 B2 | 10/2002 | Hirakata et al. | |
| 6,475,840 B1 | 11/2002 | Miyanaga et al. | |
| 6,479,837 B1 | 11/2002 | Ogawa et al. | |
| 6,498,369 B1 | 12/2002 | Yamazaki et al. | |
| 6,509,212 B1 | 1/2003 | Zhang et al. | |
| 6,515,428 B1 * | 2/2003 | Yeh et al. | 315/169.3 |
| 6,552,768 B1 | 4/2003 | Matsuda | |
| 6,556,711 B2 | 4/2003 | Koga et al. | |
| 6,582,996 B1 | 6/2003 | Hara et al. | |
| 6,646,288 B2 | 11/2003 | Yamazaki et al. | |
| 6,661,180 B2 * | 12/2003 | Koyama | 315/169.3 |
| 6,680,577 B1 | 1/2004 | Inukai et al. | |
| 6,709,905 B2 | 3/2004 | Kusumoto et al. | |
| 6,730,550 B1 | 5/2004 | Yamazaki et al. | |
| 6,737,672 B2 | 5/2004 | Hara et al. | |
| 6,743,650 B2 | 6/2004 | Hirakata et al. | |
| 6,828,951 B2 | 12/2004 | Yamazaki et al. | |
| 7,061,186 B2 | 6/2006 | Inukai et al. | |
| 7,173,279 B2 | 2/2007 | Yamazaki et al. | |
| 2001/0045563 A1 | 11/2001 | Kusumoto et al. | |
| 2001/0051398 A1 | 12/2001 | Hirakata et al. | |
| 2002/0014623 A1 | 2/2002 | Kusumoto et al. | |
| 2002/0097350 A1 * | 7/2002 | Haven et al. | 349/43 |
| 2003/0016196 A1 * | 1/2003 | Lueder et al. | 345/82 |
| 2003/0017634 A1 | 1/2003 | Hirakata et al. | |
| 2003/0024905 A1 | 2/2003 | Tanaka | |
| 2003/0025166 A1 | 2/2003 | Yamazaki et al. | |
| 2003/0047732 A1 | 3/2003 | Yamazaki et al. | |
| 2003/0052336 A1 | 3/2003 | Yamazaki et al. | |
| 2003/0059990 A1 | 3/2003 | Yamazaki | |
| 2003/0062845 A1 | 4/2003 | Yamazaki et al. | |
| 2003/0075733 A1 | 4/2003 | Yamazaki et al. | |
| 2003/0100169 A1 | 5/2003 | Tanaka et al. | |
| 2004/0106237 A1 | 6/2004 | Yamazaki | |
| 2007/0114532 A1 | 5/2007 | Yamazaki et al. | |

FOREIGN PATENT DOCUMENTS

| | | |
|---|---|---|
| EP | 1-045-447 | 10/2000 |
| EP | 1 058 311 A2 | 12/2000 |
| JP | 62-104117 | 5/1987 |
| JP | 02-140915 | 5/1990 |
| JP | 02-181419 | 7/1990 |
| JP | 06-289431 | 10/1994 |
| JP | 07-092501 | 4/1995 |
| JP | 08-195357 | 7/1996 |
| JP | 10-319907 | 12/1998 |
| JP | 10-339889 | 12/1998 |
| JP | 11-271731 | 10/1999 |
| JP | 2000-221907 | 8/2000 |
| JP | 2000-356788 | 12/2000 |
| TW | 409293 | 2/1999 |
| WO | WO 00/13213 | 3/2000 |

OTHER PUBLICATIONS

U.S. Appl. No. 09/633,869.

Hara, Akito et al. "Ultra-high Performance Poly-Si TFTs on a Glass By a Stable Scanning CW Laser Lateral Crystallization" AM-LCD '01, pp. 227-230.

Takeuchi, F. et al. "Performance of poly-Si TFTs Fabricated by a Stable Scanning CW Laser Crystallization" AM-LCD '01, pp. 251-254.

U.S. Appl. No. 10/219,815, filed Aug. 16, 2002 "Method for Fabricating Semiconductor Device" (Filing Receipt, Specification, Claims and Drawings).

U.S. Appl. No. 10/224,628, filed Aug. 21, 2002 "Method for Manufacturing Semiconductor Device" (Filing Receipt, Specification, Claims and Drawings).

Akito Hara et al.; Ultra-High Performance Poly-Si TFTs on a Glass by a Stable Scanning CW Laser Lateral Crystallization; AM-LCD'01 Digest of Technical Papers; pp. 227-230.

U.S. Appl. No. 09/633,869, filed Aug. 7, 2000, "Method for Laser-Processing Semiconductor Device" (Specification, Claims and Drawings).

* cited by examiner

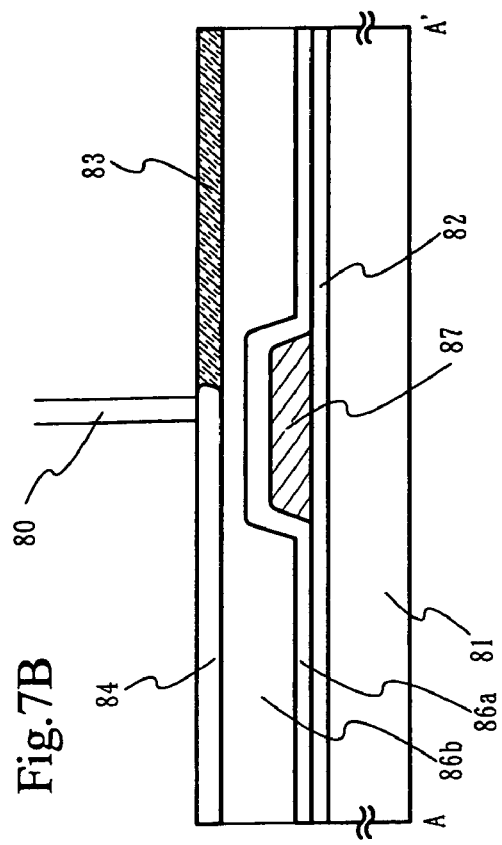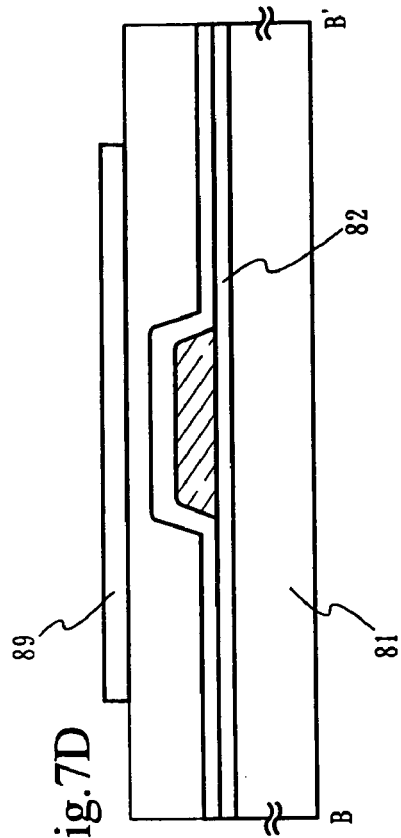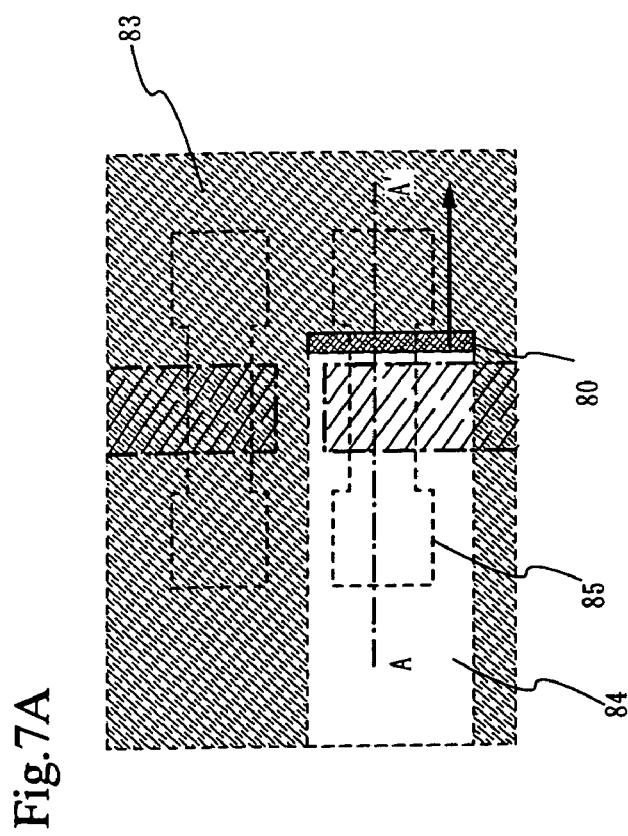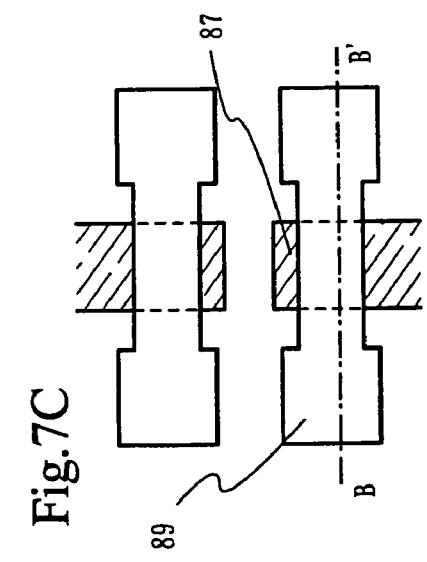

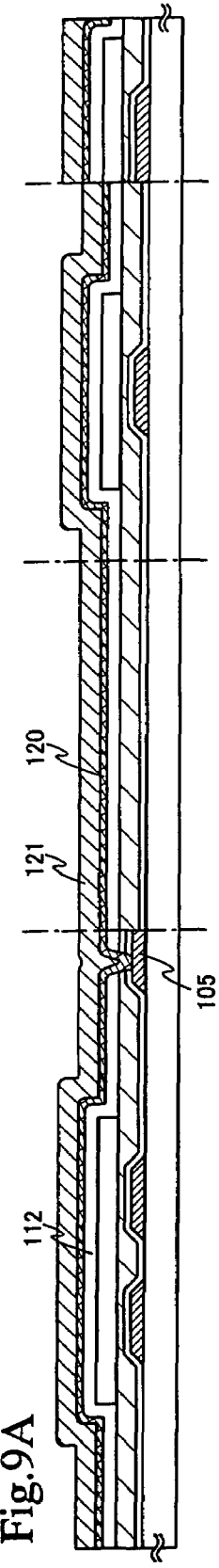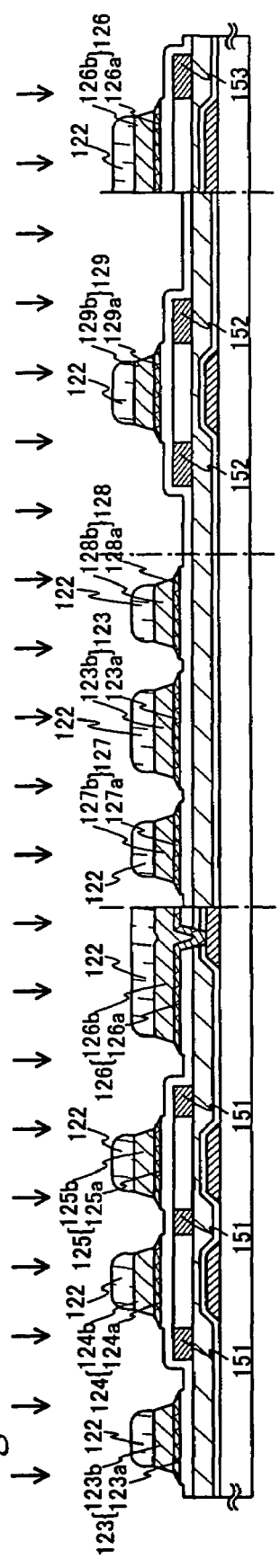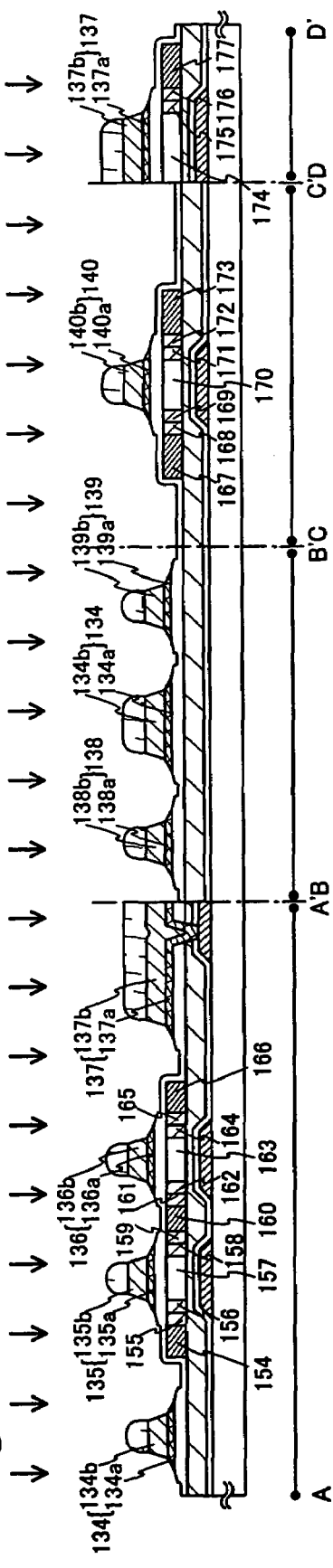

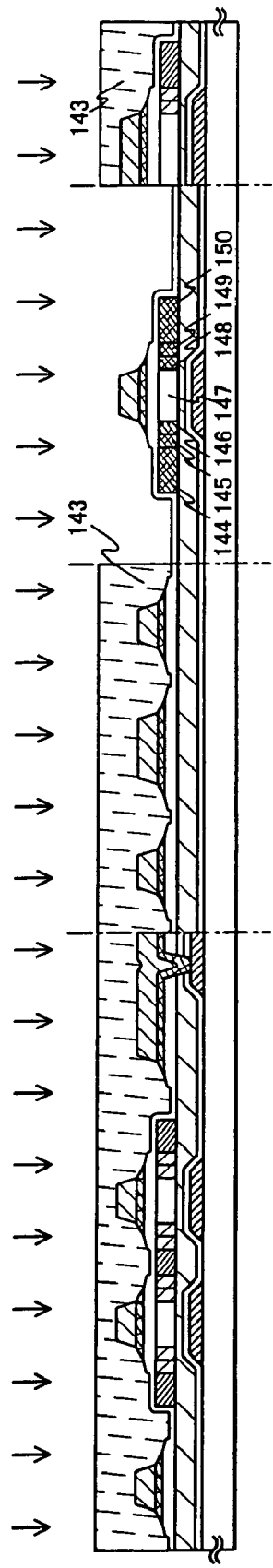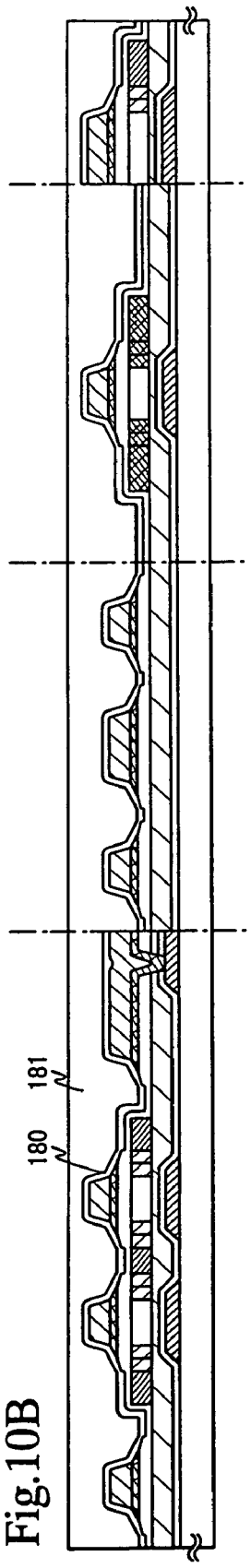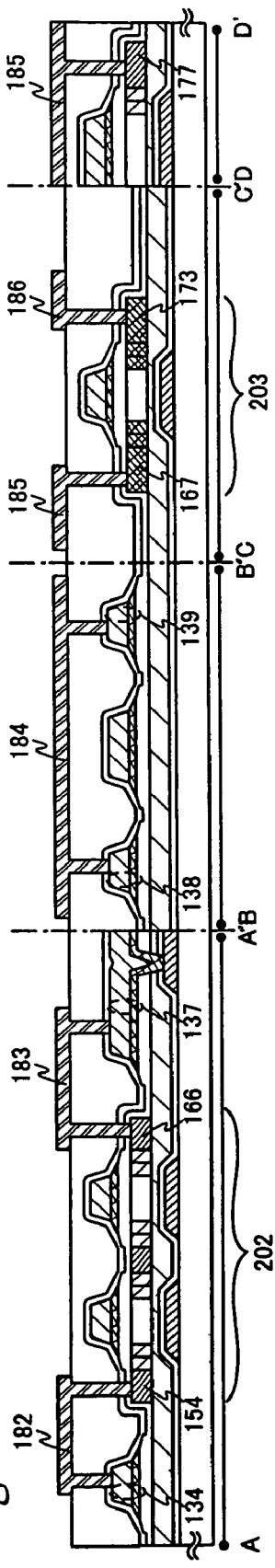

Vcom, or Vx

LIGHT EMITTING DEVICE AND METHOD OF MANUFACTURING A SEMICONDUCTOR DEVICE

BACKGROUND OF THE INVENTION

1. Field of the Invention

The present invention relates to the manufacturing method of semiconductor device, in particular, present invention relates to a light emitting device comprising a light emitting element formed on a plastic substrate. The invention also relates to an EL module in which ICs including a controller, or the like, is mounted with an EL panel. Note that, in this specification, the light emitting device includes the EL panel and for the EL module. Electronic equipment using the light emitting device is also included in the present invention.

Noted that in the present specification, the term "semiconductor device" generally indicates a device which is capable of functioning by utilizing semiconductor characteristics, and a light emitting device, an electro-optical device, a semiconductor circuit and an electronic device are all included in the semiconductor device.

2. Description of the Related Art

Recently, technology for forming TFTs (Thin Film Transistor) on a substrate has been greatly progressed, and its application to an active matrix display device is actively developed. In particular, a TFT using a polysilicon film have a higher field effect mobility (also referred to as mobility) than that of a conventional TFT using an amorphous silicon film, and thus, and is capable of high-speed operations. Therefore, a driver circuits that consist of TFTs using a polysilicon film is provided on the same substrate as pixels, and the development for controlling respective pixels is performed actively. Since driver circuits and pixels on one substrate are incorporated into an active matrix display device, there are various advantages such as reduction in the manufacturing cost, miniaturization of the display device, improvement in yield, and improvement in throughput.

In addition, an active matrix light emitting device (hereinafter, simply referred to as light emitting device), which has as a self-luminous element an EL element with a layer containing an organic compound as a light emitting layer, is actively researched. The light emitting device is also referred to as organic EL displays (OELDs) or organic light emitting diodes (OLEDs).

An EL element is self-luminous to have high visibility, and is optimal for making a display thin since a backlight like used for a liquid crystal display (LCD) is not required. Further, an angle of view has no limits. Therefore, a light emitting device using an EL element has thus come under the spotlight as a substitute display device for CRTs and LCDs.

An active matrix driving system for displaying an image by arranging a plurality of TFTs in each pixel and sequentially writing a video signal is known as one mode of a light emitting device using EL elements. The TFT is an indispensable element for realizing the active matrix driving system.

Conventional TFT was almost manufactured by using amorphous silicon. However, the TFT using amorphous silicon is low in electric field effect mobility, and cannot be operated at a frequency required to process the video signal. Accordingly, the TFT was used only as a switching element arranged in each pixel. A data line driving circuit for outputting the video signal to a data line, and a scanning line driving circuit for outputting a scanning signal to a scanning line were constructed by an external IC (driver IC) attached and mounted by TAB (Tape Automated Bonding) or COG (Chip on Glass).

However, when a pixel density is increased, a pixel pitch is narrowed. Accordingly, it is considered that there is a limit in a system of mounting the driver IC. For example, when UXGA (a pixel number of 1200×1600) is supposed, 6000 connecting terminals are required in an RGB color system even in simply estimating the number of connecting terminals. An increase in the number of connecting terminal causes an increase in generating probability of a contact defect. Further, the area (frame area) of a peripheral portion of a pixel section is increased and the compactness of a semiconductor device with and the design of an external appearance, as a display, are damaged. The necessity of the display device integrated with a driving circuit is clarified from such a background. The number of connecting terminals is greatly reduced and the frame area can be also reduced by integrally forming the pixel portion and the scanning line driving circuit and data line driving circuit on the same substrate.

As a means to realize the active matrix display device in which pixels and drive circuits are set on one substrate, a method for forming a TFT from a semiconductor film having crystalline structure, typically a polysilicon film, is proposed. However, even when the TFT is formed by using the polysilicon, its electrical characteristics are finally not equivalent to the characteristics of a MOS transistor formed in a monocrystal silicon substrate. For example, the electric field effect mobility of a conventional TFT is equal to or smaller than $1/10$ in comparison with the monocrystal silicon. Further, the TFT using polysilicon has a problem that is dispersion is caused easily in its characteristics due to a defect formed in a boundary of a crystal grain.

In the light emitting device, at least a TFT functioning as a switching element and a TFT for supplying an electric current to an EL element are generally arranged in each pixel. A low off-electric current ($I_{off}$) is required in the TFT functioning as the switching element while high driving ability (an on-electric current $I_{on}$), the prevention of deterioration due to a hot carrier effect and the improvement of reliability are required in the TFT for supplying the electric current to the EL element. Further, high driving ability (the on-electric current $I_{on}$), the prevention of deterioration due to the hot carrier effect and the improvement of reliability are also required in the TFT of the data line driving circuit.

Moreover, since the luminance of a pixel is determined by the ON current ($I_{on}$) of TFT which is electrically connected with an EL element and supplies current to the EL element without depending on the drive method, there is a problem dispersion is caused in luminance if ON current is not constant in case of displaying white on overall surface. For example, in case of adjusting luminance by light emitting time and performing 64 gray scales, the ON current of the TFT which is electrically connected with the EL element and supplies current to the EL element is dispersed 1.56% (=$1/64$) from a fiducial point to shift one gray scale.

SUMMARY OF THE INVENTION

The present invention is performed in view of the above-mentioned problem, and improvement of characteristics of TFTs (specifically the increase of ON current and reduction of OFF current) and reduction of characteristic dispersion of each TFT are considered as an object of the present invention. At least, reducing the dispersion of the ON current ($I_{on}$)

of TFT which is electrically connected with an EL element and supplies current to the EL element in pixels is considered as an object.

The present invention is characterized in that TFT characteristics are improved in a light emitting device using an EL element by arranging channel length directions of regions that function as channels (called channel forming regions) of plural thin film transistors in a pixel all in the same direction and by setting the scanning direction in laser light irradiation the same as the channel length direction to make the crystal growth direction coincide with the carrier moving direction and to obtain high field effect mobility.

Examples of usable laser light include a gas laser such as an excimer laser, an Ar laser, or a Kr laser, a solid-state laser such as a YAG laser, a $YVO_4$ laser, a YLF laser, a $YAlO_3$ laser, a glass laser, a ruby laser, an alexandrite laser, and a Ti:sapphire laser, and a semiconductor laser. The solid-state laser employed is one that uses a crystal such as YAG, $YVO_4$, YLF, or $YAlO_3$ doped with Cr, Nd, Er, Ho, Ce, Co, Ti, or Tm. The fundamental wave of the solid laser is varied with depending on the material used in doping, and is around 1 μm. The harmonic for the fundamental wave is obtained by using a non-linear optical element. The mode of laser oscillation may be continuous wave type or pulse oscillation type, and the shape of the laser beam may be linear or rectangular. In crystallizing a semiconductor film that has an amorphous structure, it is preferred to choose a continuous wave solid-state laser and use the second harmonic to fourth harmonic of the fundamental wave in order to obtain crystals with a large grain size.

In the case of crystallizing a non-single crystal semiconductor film by irradiating a continuous wave laser beam, the solid-liquid interface is held and crystals can grow continuously in the scanning direction of the laser beam.

Accordingly, an aspect of the present invention disclosed in this specification is a light emitting device comprising at least one pixel and at least one light emitting element in a pixel portion formed on an insulating surface, wherein the pixel portion comprises at least first and second thin film transistors, the first thin film transistor is connected to a pixel electrode that is an anode or a cathode of the light emitting element, the light emitting element comprises a layer comprising an organic compound as a light emitting layer, and the first and second thin film transistors have the same channel length direction.

The present invention is applicable not only to the case where one pixel of a pixel portion is driven by two TFTs (e.g., a switching TFT and a driving TFT) but also to the case where three TFTs (e.g., a switching TFT, a driving TFT, and an erasing TFT) are used to drive each pixel. Accordingly, another aspect of the present invention is a light emitting device comprising at least one pixel and at least one light emitting element in a pixel portion formed on an insulating surface, wherein the pixel portion comprises at least first, second, and third transistors, the first thin film transistor is connected to a pixel electrode the light emitting element, the light emitting element comprises a layer comprising an organic compound as a light emitting layer, and the first to third thin film transistors are arranged to have the same channel length direction.

The present invention is also applicable to a light emitting device in which one pixel in a pixel portion is driven by more than three TFTs. In the above structures, the pixel portion and the driving circuit may be placed on the same substrate. Accordingly, the present invention is characterized in that a driving circuit including plural thin film transistors is placed on the insulating surface and that the thin film transistors of the driving circuit are arranged so that the channel length directions of the thin film transistors coincide with one another.

In the above structures, the present invention is characterized in that the channel length direction is the same as the scanning direction of laser light that is irradiated semiconductor layers of the thin film transistors.

According to the present invention, there is another aspect that each of the thin film transistors of a pixel or the driving circuit in each light emitting device described above has a semiconductor film, a first electrode, a first insulating film, a second electrode, and a second insulating film (gate insulating film). The semiconductor film functions as an active layer. The first insulating film is sandwiched between the semiconductor film and the first electrode. The second electrode functions as a gate electrode. The second insulating film is sandwiched between the semiconductor film and the second electrode. The first electrode and the second electrode overlap each other while a channel formation region of the semiconductor film is interposed between the first and second electrodes. The semiconductor film has two impurity regions (one is a source region and the other is a drain region) and the channel formation region sandwiched between the two impurity regions.

In the present invention, a constant voltage (common voltage) is applied to the first electrode or the first electrode is electrically connected to the second electrode to receive the same electric potential. In this way, fluctuation in ON current ($I_{on}$) of the TFT can be reduced.

In a TFT to which reduction of OFF current is more important than increase of ON current, for example, a TFT used as a switching element, it is preferable to apply a constant voltage (common voltage) to the first electrode. When a constant voltage (common voltage) is applied to the first electrode, the constant voltage is smaller than the threshold voltage of the thin film transistor in the case of an n-channel TFT and is larger than the threshold voltage of the thin film transistor in the case of a p-channel TFT. By applying a common voltage to the first electrode, fluctuation in threshold can be reduced as well as OFF current compared to the case where only one electrode is provided.

On the other hand, in a TFT to which increase of ON current is more important than reduction of OFF current, for example, a TFT of a buffer or the like in a driving circuit, it is preferred to electrically connect the first electrode to the second electrode to have the same electric potential. When the first electrode and the second electrode are electrically connected to each other to have the same electric potential, the same voltage is applied to the first electrode and the second electrode, which makes a depletion layer expand as if the semiconductor film is substantially reduced in thickness. Therefore, the sub-threshold coefficient (S value) can be set smaller and, in addition, the field effect mobility can be improved. An increase in ON current is realized compared to the case where there is only one electrode. Accordingly, by using the thus-structured TFT in a driving circuit, the driving voltage can be lowered. Moreover, the increased ON current makes it possible to reduce the TFT in size (especially channel width). The integration density can therefore be improved.

In the above thin film transistor, if the first electrode causes a convex portion on the surface of the first insulating film on which the semiconductor film is to be formed, the convex portion could bring unevenness to the semiconductor film surface and cause fluctuation in grain size among crystals during the process of crystallizing the semiconductor film. For this reason, the first insulating film is preferably leveled by chemical mechanical polishing.

A construction of the present invention to realize the above structure relates to a method of manufacturing a semiconductor device, comprising:

a first step of forming a first electrode on a substrate that has an insulating surface;

a second step of forming a first insulating film on the first electrode;

a third step of leveling a surface of the first insulating film;

a fourth step of forming a semiconductor film on the first insulating film;

a fifth step of irradiating continuous wave laser light to crystallize the semiconductor film;

a sixth step of forming a second insulating film on the semiconductor film;

a seventh step of selectively etching the first insulating film and the second insulating film to form a contact hole that reaches the first electrode; and an eighth step of decreasing impurities on a surface of the second insulating film;

a ninth step of forming a second electrode that is electrically connected to the first electrode through the contact hole and partially overlaps the semiconductor film on the second insulating film.

Another construction of the present invention relates to a method of manufacturing a semiconductor device, comprising:

a first step of forming a first electrode on a substrate that has an insulating surface;

a second step of forming a first insulating film on the first electrode;

a third step of leveling a surface of the first insulating film;

a fourth step of forming a second insulating film on the first insulating film;

a fifth step of forming a semiconductor film on the second insulating film;

a sixth step of irradiating continuous wave laser light to crystallize the semiconductor film;

a seventh step of forming a third insulating film on the semiconductor film;

an eighth step of selectively etching the first insulating film, the second insulating film, and the third insulating film to form a first contact hole that reaches the first electrode; and a ninth step of decreasing impurities on the third insulating film surface;

a tenth step of forming a second electrode that is electrically connected to the first electrode through the contact hole and partially overlaps the semiconductor film on the third insulating film.

Still another construction of the present invention relates to a method of manufacturing a semiconductor device, comprising:

a first step of forming a first electrode on a substrate that has an insulating surface;

a second step of forming a first insulating film on the first electrode;

a third step of leveling a surface of the first insulating film;

a fourth step of forming a semiconductor film on the first insulating film;

a fifth step of irradiating continuous wave laser light to crystallize the semiconductor film;

a sixth step of forming a second insulating film on the semiconductor film;

a seventh step of forming on the second insulating film a second electrode that partially overlaps the semiconductor film;

an eighth step of forming a third insulating film on the second electrode;

a ninth step of selectively etching the first insulating film, the second insulating film, and the third insulating film to form a first contact hole that reaches the first electrode and a second contact hole that reaches the second electrode; and a tenth step of forming a third electrode that is electrically connected to the first electrode and to the second electrode through the first contact hole and the second contact hole.

Yet still another construction of the present invention relates to a method of manufacturing a semiconductor device, comprising:

a first step of forming a first electrode on a substrate that has an insulating surface;

a second step of forming a first insulating film on the first electrode;

a third step of a leveling a surface of the first insulating film;

a fourth step of forming a second insulating film on the first insulating film;

a fifth step of forming a semiconductor film on the second insulating film;

a sixth step of irradiating continuous wave laser light to crystallize the semiconductor film;

a seventh step of forming a third insulating film on the semiconductor film;

an eighth step of forming on the third insulating film a second electrode that partially overlaps the semiconductor film;

an ninth step of forming a fourth insulating film on the second electrode;

a tenth step of selectively etching the first insulating film, the second insulating film, the third insulating film, and the fourth insulating film to form a first contact hole that reaches the first electrode and a second contact hole that reaches the second electrode; and a eleventh step of forming a third electrode that is electrically connected to the first electrode and to the second electrode through the first contact hole and the second contact hole.

In the above constructions regarding a method of manufacturing a semiconductor device, the present invention is characterized in that the third step of leveling the surface of the first insulating film is performed by chemical mechanical polishing.

According to the present invention, it is possible to obtain a semiconductor device provided with a CPU. Accordingly, another aspect of the present invention is a semiconductor device which has a plurality of thin film transistors on a substrate that has an insulating surface, wherein a central processing unit (also called a CPU) comprising a control unit and a computing unit is provided on the substrate, the central processing unit has at least a first thin film transistor and a second thin film transistor, and the channel length direction of the first thin film transistor coincides with the channel length direction of the second thin film transistor.

According to the present invention, it is possible to obtain a semiconductor device provided with a CPU and memory on the same substrate. Accordingly, a further construction of the present invention is a semiconductor device comprising a plurality of thin film transistors on a substrate that has an insulating surface, wherein a central processing unit comprising a control unit and a computing unit, and a memory unit (also called memory) are provided on the substrate, that the memory unit has at least a first thin film transistor and a second thin film transistor, and that the channel length direction of the first thin film transistor coincides with the channel length direction of the second thin film transistor.

The CPU and display unit (including the pixel portion) may be formed on the same substrate, and also, the CPU, the memory, and the display unit (including the pixel portion) may be formed thereon.

In the above constructions, the present invention is characterized in that the channel length direction is the same as the scanning direction of laser light that is irradiated semiconductor layers of the thin film transistors.

In this specification, all layers formed between an anode and cathode of an EL element together constitute an organic light emitting layer. Specifically, the organic light emitting layer includes a light emitting layer, a hole injection layer, an electron injection layer, a hole transporting layer, an electron transporting layer, etc. The basic structure of an EL element is a laminate of an anode, light emitting layer, and cathode layered in this order. The basic structure may be modified into a laminate of an anode, hole injection layer, light emitting layer, and cathode layered in this order, or a laminate of an anode, hole injection layer, light emitting layer, electron transporting layer, and cathode layered in this order.

An EL element has a layer (hereinafter referred to as organic light emitting layer) containing an organic compound (an organic light emitting material) that provides luminescence (electro luminescence) generated by applying electric field, as well as an anode and a cathode. Luminescence obtained from organic compounds is divided into light emission (fluorescence) in returning to the base state from singlet excitation and light emission (phosphorescence) in returning to the base state from triplet excitation. A light emitting device of the present invention may use one of the above two types of light emission or both. An organic compound layer may contain an inorganic material.

BRIEF DESCRIPTION OF THE DRAWINGS

In the accompanying drawings:

FIGS. 7A to 7D are sectional views illustrating the arrangement of a semiconductor layer and the scanning direction of laser light (Embodiment Mode 1);

FIGS. 9A to 9C are sectional views illustrating a process of manufacturing a light emitting device (Embodiment 1);

FIGS. 10A to 10C are sectional views illustrating a process of manufacturing a light emitting device (Embodiment 1);

DETAILED DESCRIPTION OF THE PREFERRED EMBODIMENTS

Embodiment modes of the present invention will be described below.

Embodiment Mode 1

The following is a brief explanation on a typical procedure of manufacturing a TFT. The explanation is given with reference to FIGS. 1A to 1E.

Figure 1A:
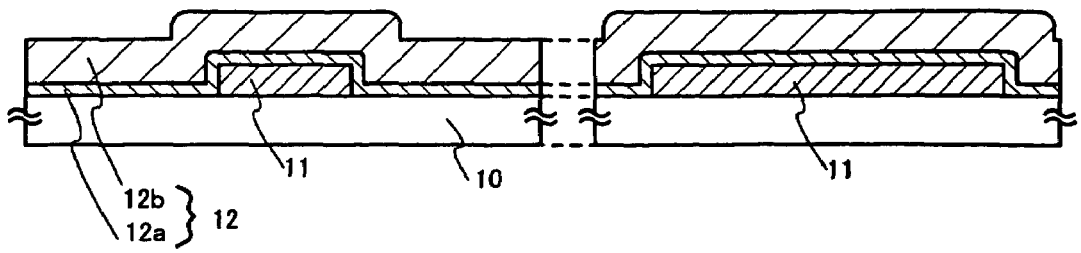
FIGS. 1A to 1E are sectional views illustrating a process of manufacturing a TFT (Embodiment Mode 1)
Figure 1B:
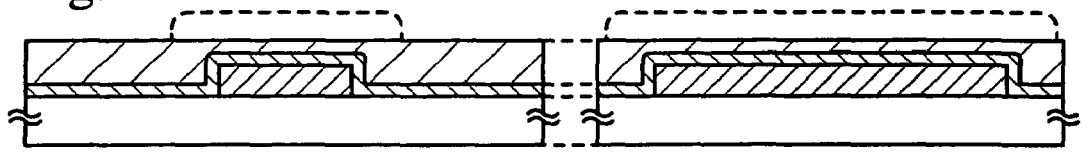
Figure 1C:
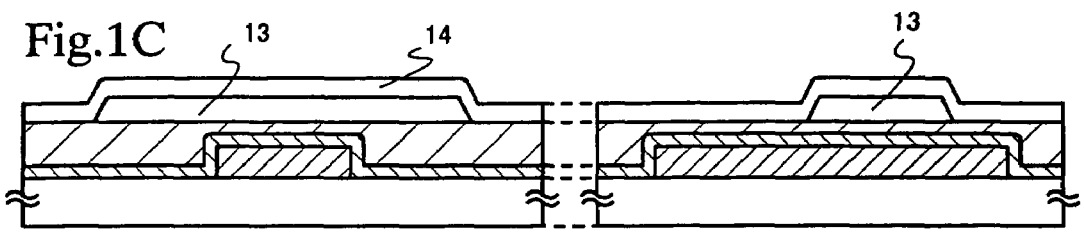

In FIG. 1A, reference symbol 10 denotes a substrate which has an insulating surface, 11, a first electrode, and 12, a first insulating film.

First, a conductive film is formed on the substrate 10 and is patterned to form the first electrode 11 constituted of a metal or an alloy. Typically, the first electrode is formed from an alloy containing one or more kinds of elements selected from the group consisting of aluminum (Al), tungsten (W), molybdenum (Mo), tantalum (Ta), and titanium (Ti), or from an alloy containing silicon and one or more of the above elements. Alternatively, a laminate of several conductive films may be used for the first electrode. The first electrode 11 is 150 to 400 nm in thickness.

The first electrode 11 is a scanning line connected to a gate electrode that is formed later. The first electrode 11 may function as a light-shielding layer for protecting an active layer to be formed later from light. Here, a quartz substrate is used as the substrate 10, and a laminate of a polysilicon film containing phosphorus (50 nm in thickness) and a tungsten silicide (W—Si) film (100 nm in thickness) is used as the first electrode 11. The polysilicon film protects the substrate from contamination by tungsten silicide.

Next, the first insulating film 12 (a silicon oxide film, a silicon nitride film, a silicon oxynitride film, or like other insulating film) is formed to a thickness of 100 to 1000 nm (typically 300 to 500 nm) to cover the first electrode 11. Here, a first insulating film A (12a) that is a silicon oxide film formed by CVD to be a thickness of 100 nm and a first insulating film B (12b) that is a silicon oxide film formed by LPCVD to be a thickness of 280 nm are layered. (FIG. 1A)

The surface of the first insulating film 12 is uneven because of the previously formed first electrode 11. Therefore the first insulating film 12 is subjected to leveling treatment. (FIG. 1B) If the first insulating film is a laminate of plural insulating films, only a portion of the uppermost insulating film that is positioned above the first electrode 11 may be polished. Alternatively, polishing may be continued until lower insulating films are exposed.

The leveling treatment employs a known technique for improving the levelness, for example, a polishing process called as chemical mechanical polishing (hereinafter referred to as CMP). When CMP is used, a preferred polishing agent (slurry) of CMP for the first insulating film 12 is fumed silica particles dispersed in a KOH-added aqueous solution. Fumed silica is obtained by thermal pyrolysis of silicon chloride gas. The first insulating film with 0.1 to 0.5 μm is removed by CMP to level the surface. The surface of the first insulating film may not necessarily be polished. The level difference of the surface in the leveled first insulating film is desirably 5 nm or less, more desirably, 1 nm or less. With the improved levelness of the first insulating film, a gate insulating film that is formed later can be made thin and the mobility of the TFT can be improved. In addition, the improved levelness can reduce OFF current of a TFT formed.

Next, the surface of the first insulating film is washed with an etchant containing fluoric acid in order to remove impurities such as K (potassium) used in CMP. Then a semiconductor film which has a crystal structure is formed (thickness: 10 to 100 nm).

The semiconductor film which has a crystal structure may be formed by LPCVD or other methods. However, it is preferred to form a semiconductor film which has an amorphous structure and then to obtain the semiconductor film which has a crystal structure by crystallization treatment. The semiconductor film which has an amorphous structure is formed from a semiconductor material containing silicon as its main component, typically an amorphous silicon film or an amorphous silicon germanium film. Plasma CVD, reduced pressure CVD, or sputtering is used to form the amorphous semiconductor film.

Figure 5:
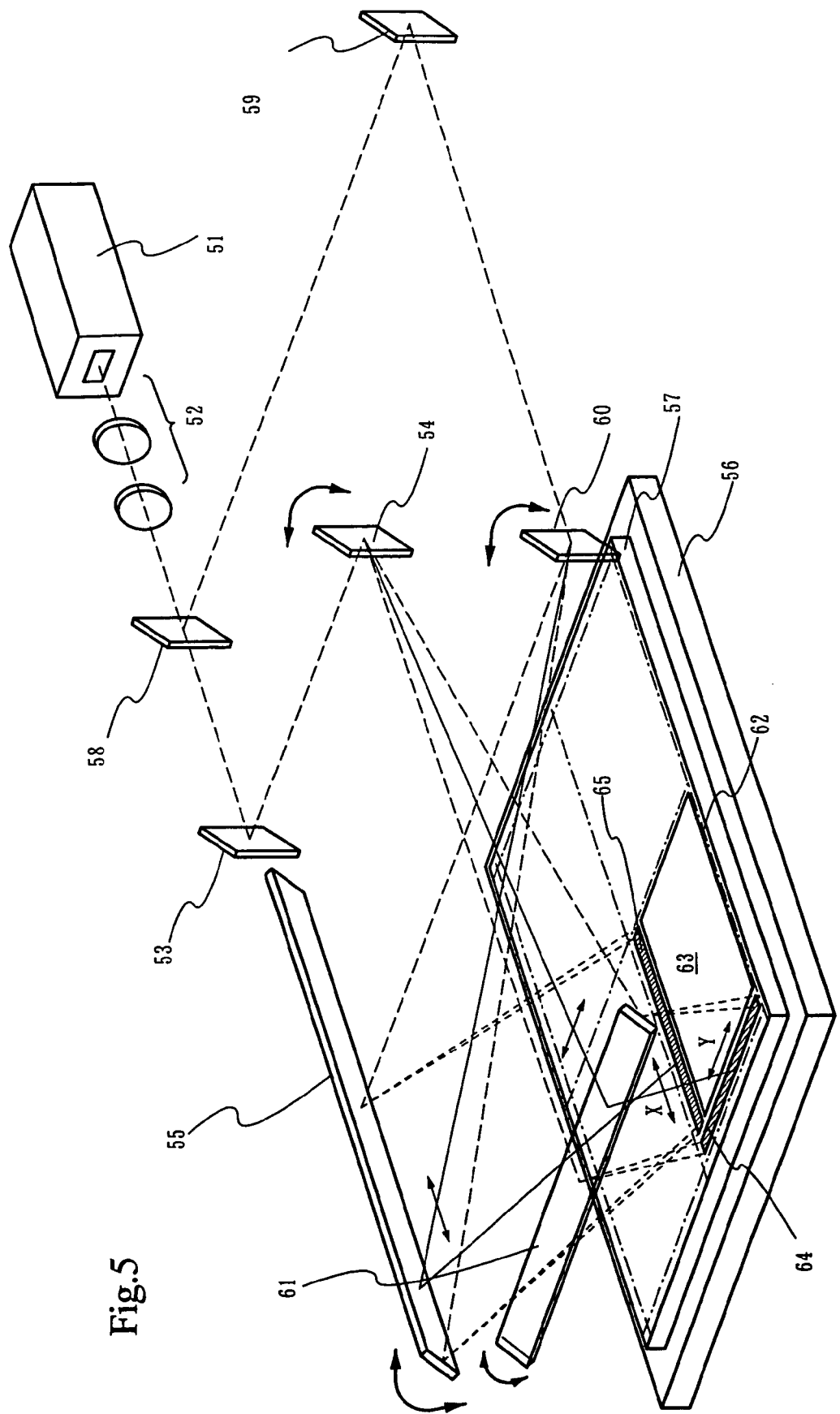
FIG. 5 is a perspective view illustrating a laser processing apparatus (Embodiment Mode 1)
Figure 6:
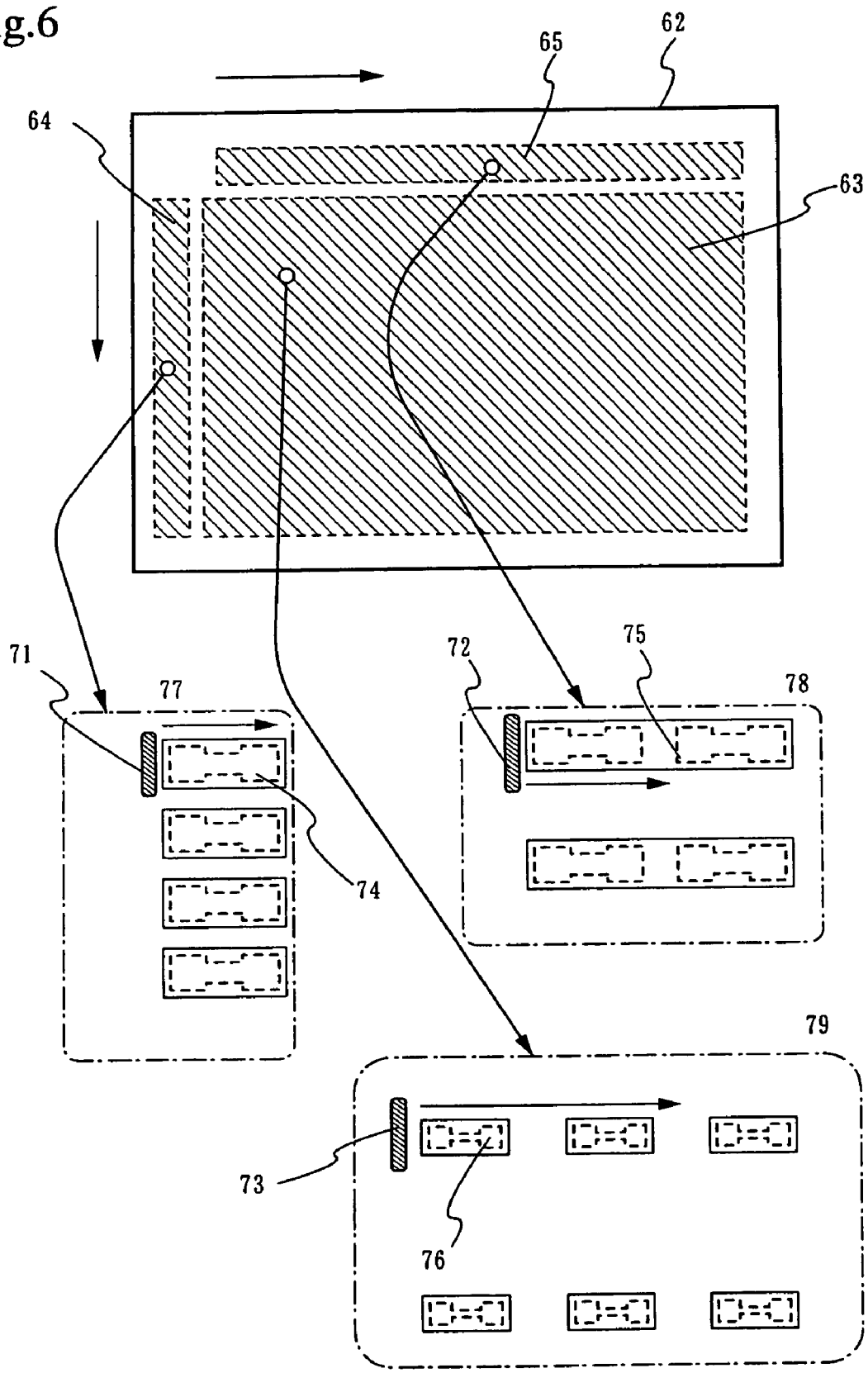
FIG. 6 is a top view illustrating the arrangement of a semiconductor layer and the scanning direction of laser light (Embodiment Mode 1)

Here, the semiconductor film which has a crystal structure is obtained by using laser processing apparatus shown in FIG. 5, arranging semiconductor layers as shown in FIG. 6, and a scanning method shown in FIGS. 7A to 7D.

The laser processing apparatus shown in the drawing has a continuous wave type or pulse oscillation type solid-state laser 51, lenses 52 for collecting laser beams, such as collimator lenses or cylindrical lenses, a fixed mirror 53 for changing the light path of a laser beam, a galvanometer mirror 54 for two-dimensional, radial scan of laser beam, and a movable mirror 55 for receiving a laser beam from the galvanometer mirror 54 and directing the laser beam to a face of an irradiated object on a mount base 56. The optical axis of the galvanometer mirror 54 crosses the optical axis of the movable mirror 55 and the mirrors are rotated in a direction θ shown in FIG. 5. This allows a laser beam to scan the entire surface of a substrate 57 placed on the mount base 56. The movable mirror 55 can also serve as a fθ mirror to correct the beam shape on a face of an irradiated object by correcting the light path difference. With the galvanometer mirror 54 and the movable mirror 55, the laser processing apparatus shown in FIG. 5 allows a laser beam to scan in one axis direction of the substrate 57 placed on the mount base 56. If a half mirror 58, a fixed mirror 59, a galvanometer mirror 60, and a movable mirror 61 are added to the laser processing apparatus shown in FIG. 5, laser beams are allowed to scan in two axis directions (directions X and Y) simultaneously. With this structure, processing time can be shortened. The galvanometer mirrors 54 and 60 may be replaced by polygon mirrors.

A preferred laser is a solid-state laser that uses a crystal such as YAG, $YVO_4$, YLF, or $YAl_5O_{12}$ doped with Nd, Tm, or Ho. Although the fundamental wave of the oscillation wavelength is varied with depending on the material used in doping, light with a wavelength between 1 μm and 2 μm is oscillated. In crystallizing the semiconductor film which has an amorphous structure, the second harmonic to fourth harmonic of the oscillation wavelength is preferred so that a laser beam is selectively absorbed in the semiconductor film. Typically, the second harmonic (532 nm) or third harmonic (355 nm) of a Nd : $YVO_4$ laser (fundamental wave: 1064 nm) is employed. The harmonic is obtained by using a non-linear optical element to convert laser light outputted from a continuous wave $YVO_4$ laser with 10 W power. Alternatively, a $YVO_4$ crystal and a non-linear optical element are placed in a resonator to emit the harmonic. Preferably, the laser light is shaped by an optical system so as to have a rectangular shape or an elliptical shape on an irradiated surface and then irradiates the processed object. The energy density needed at this point is 0.01 to 100 $MW/cm^2$ (preferably 0.1 to 10 $MW/cm^2$). The semiconductor film is moved relatively to the laser light at a rate of 0.5 to 2000 cm/s during irradiation. It is preferable for laser light to irradiate the surface of the semiconductor film at an angle so that the incident light and reflected light at the back surface of the substrate do not interfere each other. In this case, a change in incident angle of laser light brings a great change in reflectivity, and therefore it is desirable to set the angle so that a change in reflectivity of laser light is contained within 5%.

In addition to the solid-state laser, a gas laser such as an argon laser, a krypton laser, or an excimer laser may be employed.

The oscillation mode may be pulse oscillation mode or continuous wave mode. The continuous wave mode is preferred in order to obtain crystals with large grain size through continuous crystal growth while keeping the semiconductor film molten.

When a TFT is formed on a substrate from a semiconductor film crystallized by laser annealing to have a crystal structure, high field effect mobility can be obtained by matching the crystal growth direction with the carrier moving direction. In other words, the field effect mobility can be enhanced substantially by making the crystal growth direction and the channel length direction coincide with each other. When a semiconductor film which has an amorphous structure is crystallized by irradiating a continuous wave laser beam, a solid-liquid interface is held and crystals can grow continuously in the scanning direction of the laser beam. The scanning direction of the laser beam is not limited to a single direction and the laser beam may run to and fro.

FIG. 6 shows in detail the irradiation direction of the laser beam in relation to a substrate 62 on which TFTs are formed later. Regions where a pixel portion 63 and driving circuit portions 64 and 65 are formed are denoted by dotted lines in the substrate 62 on which TFTs are formed later. Here, a semiconductor film which has an amorphous structure is patterned into island-like semiconductor films as shown in FIG. 6 and then crystallized by laser light irradiation. Then, patterning is conducted again to obtain shapes indicated by the dotted lines. Thus obtained is a semiconductor film 13 in FIG. 1C.

The driving circuit portion 64, for example, is a region where a scanning line driving circuit is formed. A semiconductor region 74 of a TFT and the scanning direction of a laser beam 71 are shown in an enlarged view 77 (a region surrounded by a dot-dash line) of a part of the driving circuit portion 64. The semiconductor region 74 can take arbitrary shape. Whatever shape the semiconductor region 74 takes, its channel length direction matches the laser beam scanning direction (the direction of the arrow in the drawing). The driving circuit portion 65 extending in the direction that intersects the driving circuit portion 64 is a region for forming a data line driving circuit. A semiconductor region 75 in the driving circuit portion 64 is aligned with the scanning direction of a laser beam 72 (See an enlarged view 78). Similarly, a channel length direction of a semiconductor region 76 in the pixel portion 63 is aligned with the scanning direction of a laser beam 73, as shown in an enlarged view 79. An insulating film may be formed prior to the laser beam irradiation.

Alternatively, the patterning before crystallization may not be carried out and the laser light irradiation for crystallization may be performed to a semiconductor film which has an amorphous structure over the entire surface of the substrate. When a semiconductor film which has an amorphous structure is formed over the entire surface, semiconductor regions for forming TFTs can be specified by alignment markers on ends of the substrate or the like.

A description will be given with reference to FIGS. 7A and 7D on a process of forming an active layer of a TFT from a semiconductor film which has a crystal structure, which is obtained by crystallizing a semiconductor film which has an amorphous structure over the entire surface of a substrate. FIG. 7B is a sectional view in which an insulating film 82 is formed on a substrate 81, a first electrode 87 is formed on the insulating film 82, and a semiconductor film 83 which has an amorphous structure is formed on first insulating films 86a and 86b that cover the first electrode. When the substrate 81 is a glass substrate, the insulating film 82 prevents an alkali metal or other impurities of the substrate from diffusing into the semiconductor film. The semiconductor film is irradiated with a laser beam 80 to be crystallized, and a semiconductor film 84 which has a crystal structure is thus obtained. The laser beam is obtained from the laser processing apparatus shown in FIG. 5. As shown in FIG. 7A, the scanning direction of the laser beam 80 is determined in accordance with the position of an assumed semiconductor region 85 for a TFT. The beam shape is arbitrary and may be rectangular, linear, or elliptical. An elliptical beam is preferred to crystallize a semiconductor film which has an amorphous structure. A laser beam collected by an optical system may vary in energy intensity between its center and edges. Therefore, it is desirable to avoid irradiating the semiconductor region 85 with an edge of laser beam.

The laser beam may run only in one direction or may run to and fro for reciprocating scanning. In the latter case, the laser energy density may be changed for each scanning so as to grow crystals in stages. The reciprocating scanning may double as dehydrogenating treatment that is often necessary in crystallizing amorphous silicon. In this case, the energy density is set low to release hydrogen in the first time scanning and then the energy density is raised to complete crystallization in the second time scanning.

In this laser beam irradiation method, crystals can grow to reach large grain size by irradiating continuous wave laser beam. Of course, the details of the parameter, such as the scanning speed and energy density of the laser beam, have to be set appropriately. By setting the scanning speed to 10 to 80 cm/sec, crystals with large grain size can be obtained. It is said that the crystal growth rate is 1 m/sec when a pulse laser is used to experience melting and solidification. If the scanning speed of the laser beam is set slower than the above crystal growth rate to cool gradually, it allows crystals to grow continuously at the solid-liquid interface and the crystals can obtain large grain size.

Thereafter, the thus obtained crystalline semiconductor film is etched to be divided form an island-like semiconductor region 89, as shown in FIGS. 7C and 7D. Then, if necessary, a wiring, an interlayer insulating film, and the like are formed to form an element.

In manufacturing an EL module, plural TFTs which have different functions are provided in its pixel portion. For example, the pixel portion is provided with a driving TFT connected to a pixel electrode to control a current that flows into an EL element and a switching TFT. In this case also, it is desirable to give all TFTs the same channel length direction and to make the channel length direction coincide with the scanning direction of the laser beam.

The present invention is not limited to the above crystallization method using laser light. Other laser crystallization methods, a crystallization technique using nickel as a metal element that accelerates crystallization of silicon, a solid phase growth method, or other crystallization techniques may be employed in combination.

After the semiconductor film 13 is obtained by the above laser light crystallization, the surface of the semiconductor film is washed with an etchant that contains fluoric acid to remove an oxide film or impurities. Then a second insulating film 14 mainly containing silicon is formed to serve as a gate insulating film. (FIG. 1C) Desirably, it is carried out continuously to wash the surface and form the second insulating film 14 without exposing the substrate to the air.

Figure 1D:
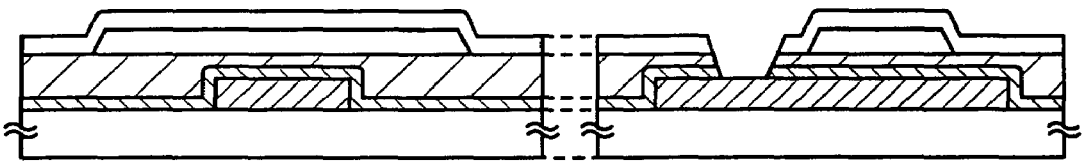

Formed next is a contact hole reaching the first electrode 11. Here, a mask is formed from resist by a known photolithography method, and then etching is selectively performed to form the contact hole. When the resist mask is removed by buffer fluoric acid (HF) and, Na and other impurities on the surface of the second insulating film 14 are removed simultaneously. (FIG. 1D)

Next, a second electrode 15 is formed to be electrically connected to the first electrode 11 through the contact hole. With the first electrode 11 and the second electrode 15 electrically connected to each other, the sub-threshold coefficient become smaller and the ON current is increased as the dielectric constant of the first insulating film 12 approaches the dielectric constant of the second insulating film 14.

Next, the semiconductor film is appropriately doped with an impurity element that gives a semiconductor the n type conductivity (such as P or As), here, phosphorus, to form impurity regions 13b. One of the impurity regions 13b serves as a source region and the other serves as a drain region. The semiconductor film has a cannel formation region 13a and the impurity regions 13b sandwiching the channel formation region 13a. After doped with phosphorus, the semiconductor film is subjected to heat treatment, irradiation of intense light, or laser light irradiation in order to activate the impurity element. This not only activates the impurity element but also repairs the plasma damage to the second insulating film (gate insulating film) and the plasma damage to the interface between the second insulating film (gate insulating film) and the semiconductor layer. It is particularly effective to activate the impurity element by irradiating the front or back of the semiconductor film with the second harmonic of YAG laser at a temperature between room temperature and 300° C. A YAG laser is a preferable activation measure since it does not require much maintenance.

Figure 1E:
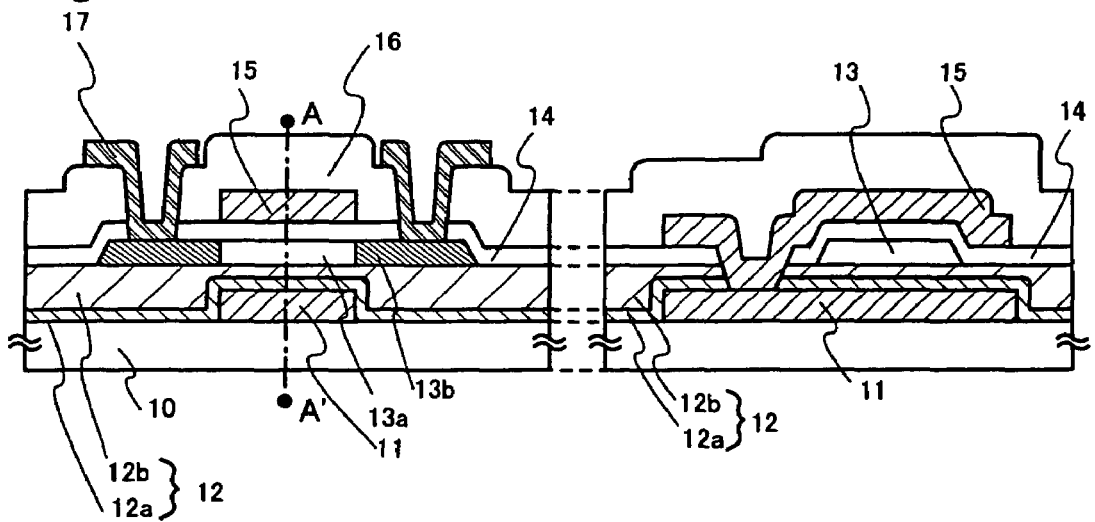

The subsequent steps to complete the TFT include forming a third insulating film 16, hydrogenation, forming contact holes that reach the impurity regions 13b, and forming wirings 17 one of which serves as a source electrode and the other of which serves as a drain electrode. (FIG. 1E)

The field effect mobility and the sub-threshold coefficient become smaller and the ON current is increased as the uniform thickness of the first insulating film 12 in an area where the first electrode 11 overlaps the channel formation region 13a approaches the uniform thickness of the second insulating film 14 in an area where the second electrode 15 overlaps the channel formation region. When the thickness of the first insulating film in an area overlapping the first electrode 11 is given as d1 and the thickness of the second insulating film in an area overlapping the second electrode 15 is given as d2, $|d1-d2|/d1 \leq 0.1$ and $|d1-d2|/d2 \leq 0.1$ are desirably satisfied. More desirably, $|d1-d2|/d1 \leq 0.05$ and $|d1-d2|/d2 \leq 0.05$ are satisfied.

Most desirably, the threshold of the thin film transistor of when the ground voltage is applied to the first electrode 11 is set almost equal to the threshold of the thin film transistor of when the ground voltage is applied to the second electrode 15 while the first electrode 11 and the second electrode 15 are not electrically connected to each other, and then the first electrode 11 and the second electrode 15 are electrically connected to each other. In this way, the filed effect mobility and sub-threshold coefficient can be reduced more and the ON current can be increased more.

This structure allows the semiconductor film to have channels over and under (dual channels), thereby improving the TFT characteristics.

At the same time the first electrode 11 is formed, wirings for transmitting various signals or power can be formed. If combined with planarization treatment by CMP, it does not affect the semiconductor film and others to be formed on the wirings. The wiring density can be enhanced by multi-layer wiring.

In FIG. 1E, a sectional view taken along the line A–A' of the left-hand sectional view is shown in the right-hand. The first electrode 11 and the second electrode 15 are directly connected to each other in the example shown here. A common voltage may be applied to one of the electrodes. If a common voltage is applied to the first electrode, fluctuation in threshold can be reduced and the OFF current can be lowered compared to the case in which only one electrode is provided.

TFTs are divided into top gate type (planar type), bottom gate type (reverse stagger type), and other types by arrangement of a gate insulating film and gate electrode. Regardless of TFT types, the semiconductor film has to be thinned in order to reduce the sub-threshold coefficient. In forming a TFT from a semiconductor film obtained by crystallizing an amorphous semiconductor film, the crystallinity becomes poor as the amorphous semiconductor film is reduced in thickness and a simple effect of thinned semiconductor film cannot be obtained. However, electrically connecting the first electrode to the second electrode so that the two electrodes above and below the semiconductor film overlap each other as shown in FIG. 1E provides substantially the same effect as reducing the thickness of the semiconductor film, namely, fast depletion upon application of voltage, reduction in field effect mobility and sub-threshold coefficient, and increase in ON current.

The present invention is not limited to the TFT structure of FIG. 1E and, if necessary, may take a lightly doped drain (LDD) structure in which an LDD region is interposed between a channel formation region and a drain region (or a source region). In the LDD structure, a region lightly doped with an impurity element is interposed between a channel formation region and a source region or drain region heavily doped with an impurity element. The lightly-doped region is called an LDD region. The present invention may also employ a GOLD (gate-drain overlapped LDD) structure in which an LDD region is arranged to overlap a gate electrode with a gate insulating film interposed therebetween.

The example here uses an n-channel TFT. However, it can be a p-channel TFT if a p type impurity element is used instead of the n type impurity element.

Embodiment Mode 2

An example of manufacturing a TFT by a procedure different from the one in the above Embodiment Mode 1 is shown in FIGS. 2A to 2E.

Figure 2A:
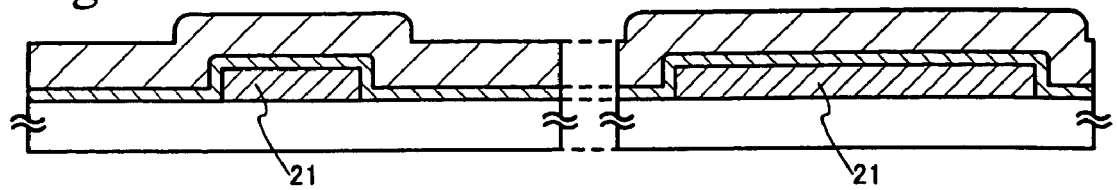
FIGS. 2A to 2E are sectional views illustrating a process of manufacturing a TFT (Embodiment Mode 2)
Figure 2B:
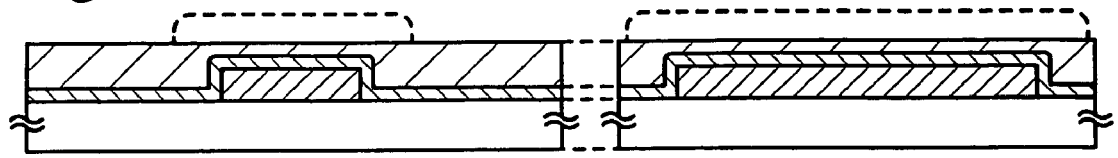

FIG. 2A is identical with FIG. 1A. FIG. 2B is identical with FIG. 1B. This embodiment mode follows Embodiment Mode 1 until the state of FIG. 2B is reached.

After the state shown in FIG. 2B is reached, a second insulating film 28 is formed. An insulating film mainly containing silicon is used as the second insulating film 28. On the second insulating film 28, a semiconductor film 23 is formed following the procedure of Embodiment Mode 1 described above.

Next, the surface of the semiconductor film is washed with an etchant that contains fluoric acid to remove an oxide film or impurities. Then a third insulating film 24 mainly containing silicon is formed to serve as a gate insulating film. (FIG. 2C) Desirably, the surface washing and formation of third insulating film 24 are carried out continuously without exposing the substrate to the air.

Figure 2C:
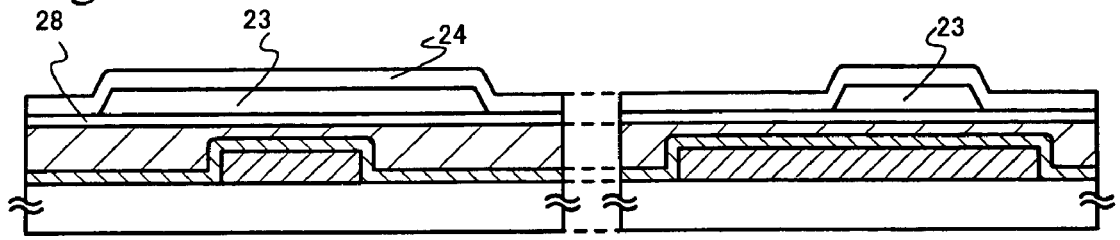
Figure 2D:
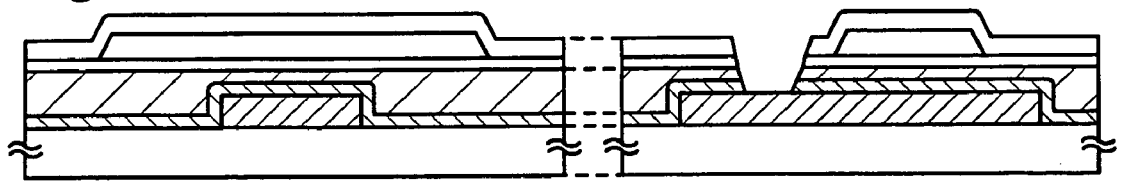

Formed next is a contact hole reaching the first electrode 21. Here, a mask is formed from resist by a known photolithography method and then selectively etched to form the contact hole. The resist mask is removed by buffer fluoric acid (HF) and, at the same time, Na or other impurities on the surface of the third insulating film 24 are removed. (FIG. 2D)

Next, a second electrode 25 is formed to be electrically connected to the first electrode 21 through the contact hole. With the first electrode 21 and the second electrode 25 electrically connected to each other, the field effect mobility and the sub-threshold coefficient become smaller and the ON current is increased as the dielectric constant of the first insulating film 22, the dielectric constant of the second insulating film 28, and the dielectric constant of the third insulating film 24 approach to each other.

Next, the semiconductor film is appropriately doped with an impurity element that gives a semiconductor the n type conductivity (such as P or As), here, phosphorus, to form impurity regions 23b. One of the impurity regions 23b serves as a source region and the other serves as a drain region. The semiconductor film has a cannel formation region 23a and the impurity regions 23b sandwiching the channel formation region 23a. After doped with phosphorus, the semiconductor film is subjected to heat treatment, irradiation of intense light, or laser light irradiation in order to activate the impurity element.

The subsequent steps to complete the TFT include forming a fourth insulating film 26, hydrogenation, forming contact holes that reach the impurity regions 23b, and forming wirings 27 one of which serves as a source electrode and the other of which serves as a drain electrode. (FIG. 2E)

Figure 2E:
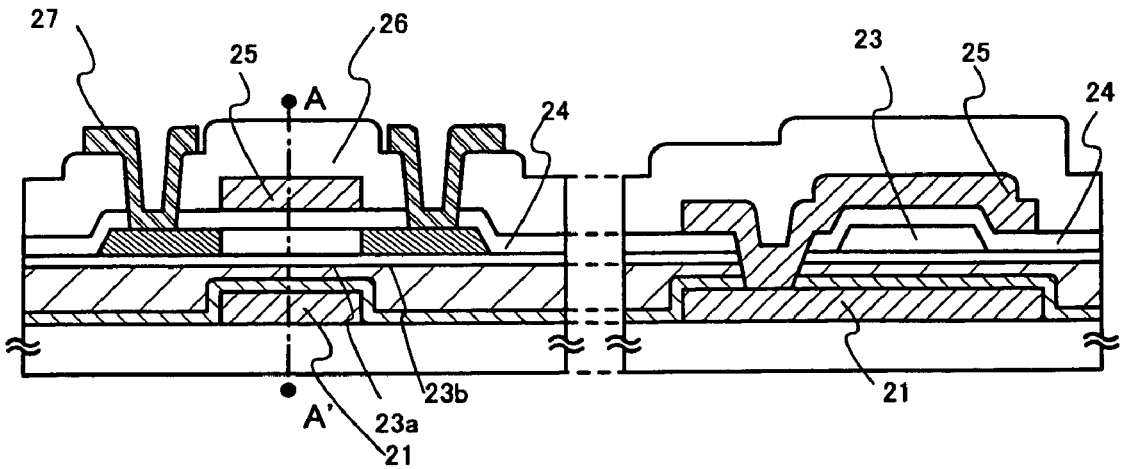

In FIG. 2E, a sectional view taken along the line A–A' of the left-hand sectional view is shown in the right-hand.

Embodiment Mode 3

An example of manufacturing a TFT by a procedure different from the one in the above Embodiment Mode 1 is shown in FIGS. 3A to 3E.

Figure 3A:
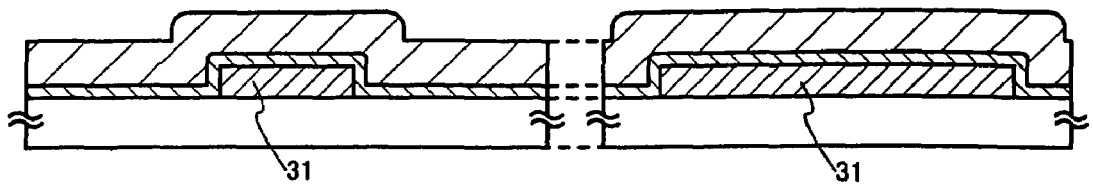
FIGS. 3A to 3E are sectional views illustrating a process of manufacturing a TFT (Embodiment Mode 3)
Figure 3B:
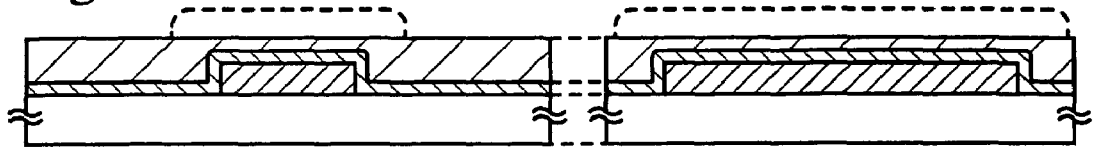
Figure 3C:
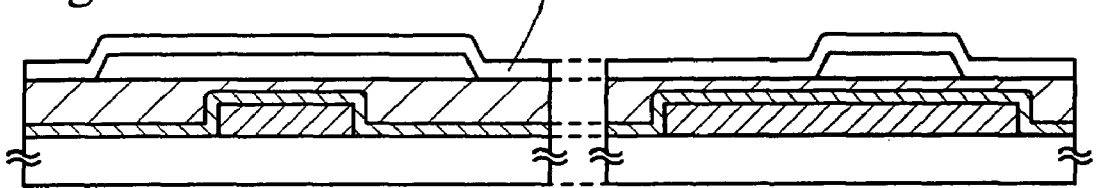

FIG. 3A is identical with FIG. 1A. FIG. 3B is identical with FIG. 1B. FIG. 3C is identical with FIG. 1C. This embodiment mode follows Embodiment Mode 1 until the state of FIG. 3C is reached.

Figure 3D:
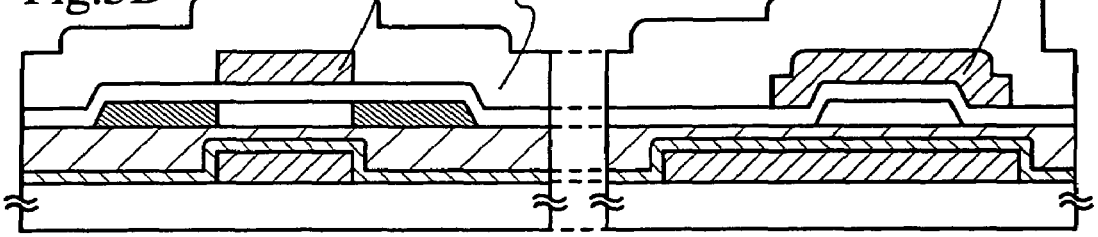

After the state of FIG. 3C is reached, the surface of the second insulating film (gate insulating film) 34 is washed to form a second electrode 35 that serves as a gate electrode. Next, the semiconductor film is appropriately doped with an impurity element that gives a semiconductor the n type conductivity (such as P or As), here, phosphorus, to form impurity regions 33b. One of the impurity regions 33b serves as a source region and the other serves as a drain region. After doped with the impurity element, the semiconductor film is subjected to heat treatment, irradiation of intense light, or laser light irradiation in order to activate the impurity element. Then a third insulating film 36 is formed to cover the second electrode 35 and the semiconductor film is hydrogenated. (FIG. 3D)

Formed next are contact holes reaching the impurity regions 33b, a contact hole reaching the first electrode 31, and a contact hole reaching the second electrode. These contact holes may be formed simultaneously or separately. Wirings 37 one of which serves as a source electrode and the other of which serves as a drain electrode are formed, and a wiring 39 for connecting the first electrode 31 and the second electrode 35 to each other is formed to complete the TFT. (FIG. 3E) The wirings 37 and the wiring 39 may be formed from the same material or different materials.

Figure 3E:
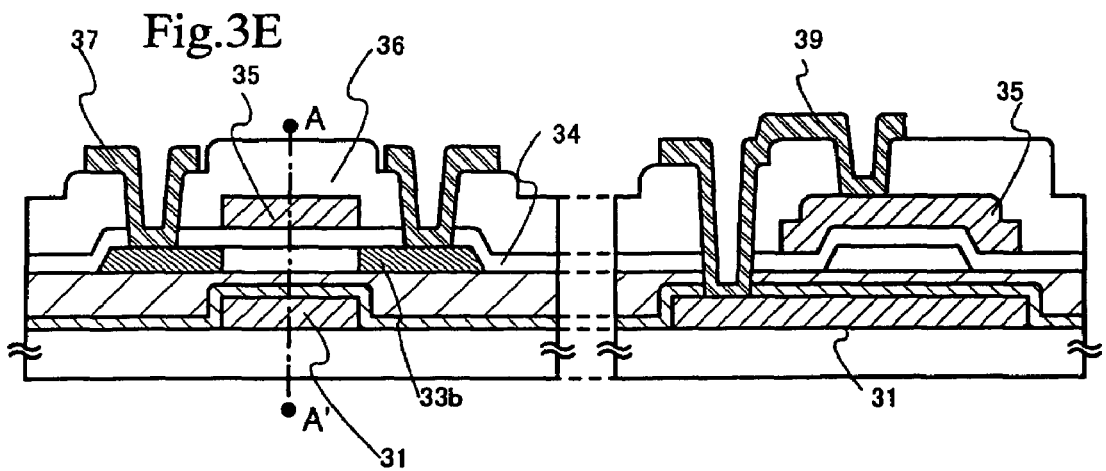

In FIG. 3E, a sectional view taken along the line A–A' of the left-hand sectional view is shown in the right-hand.

Embodiment Mode 4

An example of manufacturing a TFT by a procedure different from the one in the above Embodiment Mode 2 is shown in FIGS. 4A to 4E.

Figure 4A:
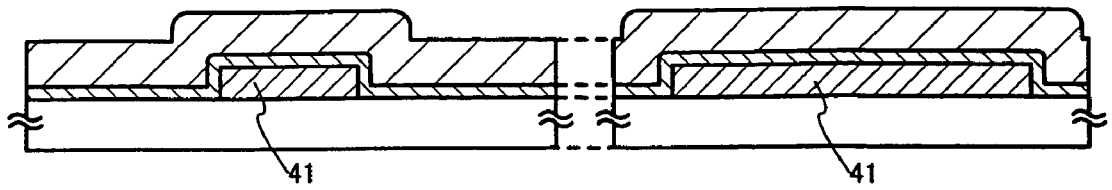
FIGS. 4A to 4E are sectional views illustrating a process of manufacturing a TFT (Embodiment Mode 4)
Figure 4B:
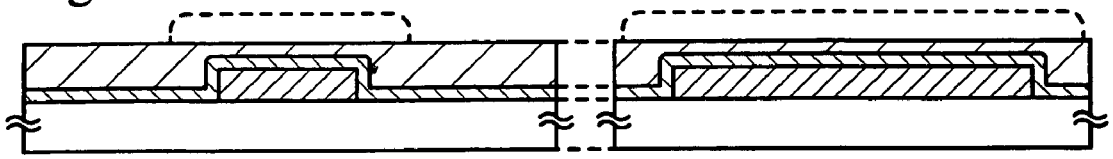
Figure 4C:
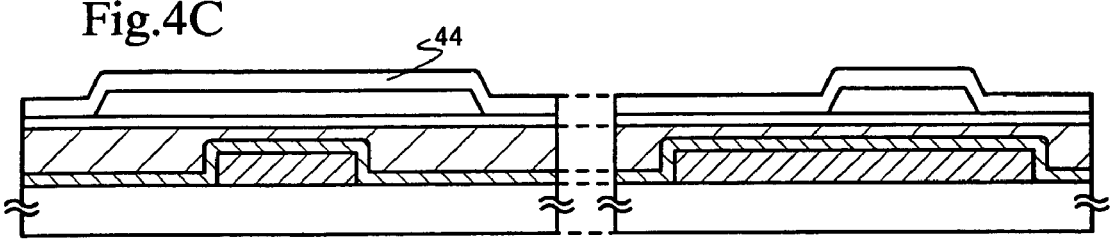

FIG. 4A is identical with FIG. 2A. FIG. 4B is identical with FIG. 2B. FIG. 4C is identical with FIG. 2C. This embodiment mode follows Embodiment Mode 1 and Embodiment Mode 2 until the state of FIG. 2C is reached.

After the state of FIG. 4C is reached, the surface of the third insulating film 44 (gate insulating film) is washed to form a second electrode 45 that serves as a gate electrode.

Figure 4D:
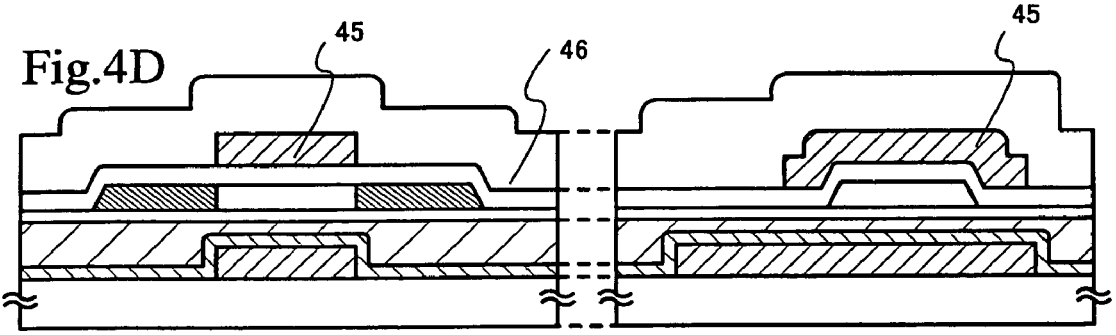

Next, the semiconductor film is appropriately doped with an impurity element that gives a semiconductor the n type conductivity (such as P or As), here, phosphorus, to form impurity regions 33b. One of the impurity regions 43b serves as a source region and the other serves as a drain region. After doped with the impurity element, the semiconductor film is subjected to heat treatment, irradiation of intense light, or laser light irradiation in order to activate the impurity element. Then a fourth insulating film 46 is formed to cover the second electrode 45 and the semiconductor film is hydrogenated. (FIG. 4D)

Formed next are contact holes reaching the impurity regions 43b, a contact hole reaching the first electrode 41, and a contact hole reaching the second electrode. These contact holes may be formed simultaneously or separately. Wirings 47 one of which serves as a source electrode and the other of which serves as a drain electrode are formed, and a wiring 49 for connecting the first electrode 41 and the second electrode 45 to each other is formed to complete the TFT. (FIG. 4E) The wirings 47 and the wiring 49 may be formed from the same material or different materials.

Figure 4E:
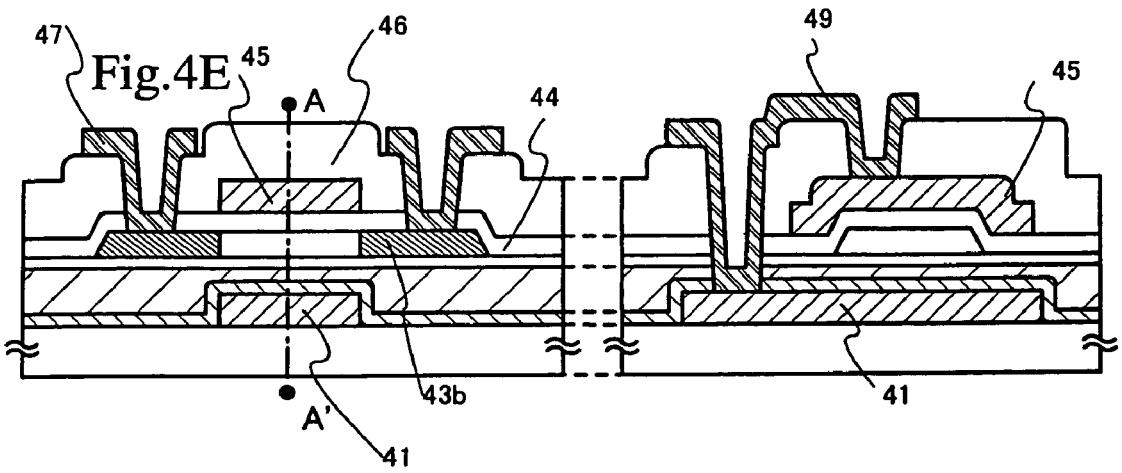

In FIG. 4E, a sectional view taken along the line A–A' of the left-hand sectional view is shown in the right-hand.

Embodiment Mode 5

An example of specific circuit structure in an EL module is shown in FIGS. 25A to 27B.

Figure 25A:
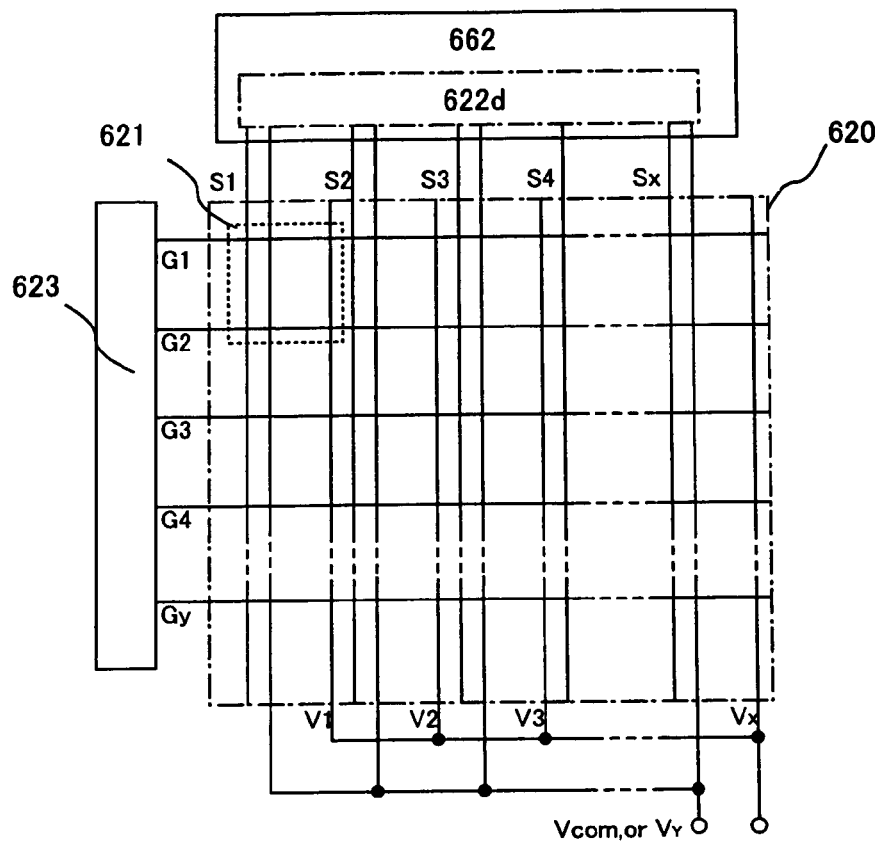
FIGS. 25A and 25B are equivalent circuit diagrams of a light emitting device (Embodiment Mode 5)

In FIG. 25A, reference symbol 620 denotes a pixel portion in which a plurality of pixels form a matrix pattern. Each of the pixels is denoted by 621. Denoted by 622 is a signal line driving circuit, and 623, a scanning line driving circuit.

Although the signal line driving circuit 622 and the scanning line driving circuit 623 are formed on the same substrate where the pixel portion 620 is formed in FIG. 25A, the present invention is not limited to this structure. The signal line driving circuit 622 and the scanning line driving circuit 623 may be formed on a substrate different from the one on which the pixel portion 620 is formed and may be connected to the pixel portion 620 through a connector such as an FPC. The module of FIG. 25A has one signal line driving circuit 622 and one scanning line driving circuit 623 but the present invention is not limited to this structure. The number of signal line driving circuit 622 and the number of scanning line driving circuit 623 can be set at designer's discretion.

In this specification, connection means electric connection.

The pixel portion 620 in FIG. 25A has signal lines S1 to Sx, power supply lines V1 to Vx, scanning lines G1 to Gy, and wirings to which a common electric potential (Vcom) or an arbitrary voltage ($V_y$) is applied. The number of signal lines may not always match the number of power supply lines. Other wirings may be added to these wirings.

The power supply lines V1 to Vx are kept at a given electric potential. FIG. 25A shows the structure of a light emitting device that displays a monochrome image but the present invention may be a light emitting device for displaying a color image. In this case, not all of the power supply lines V1 to Vx are kept at the same level of electric potential and power supply lines for different colors have different levels of electric potential.

The wirings to which a common electric potential (Vcom) or an arbitrary voltage ($V_y$) is applied are also connected to a constant current circuit 622d of the signal line driving circuit 622.

Figure 25B:
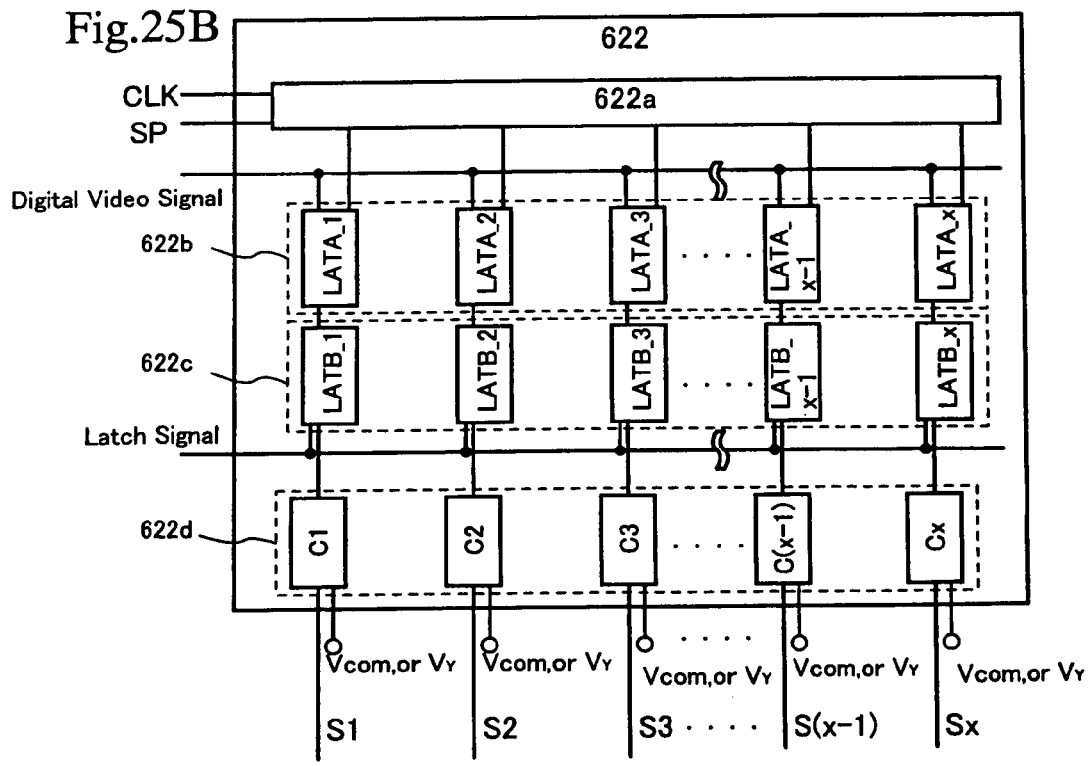

FIG. 25B is a block diagram showing an example of detailed structure of the signal line driving circuit 622 that is shown in FIG. 25A. Denoted by 622a is a shift register, 622b, a memory circuit A, 622c, a memory circuit B, and 622d, the constant current circuit.

Clock signals CLK and start pulse signals SP are inputted to the shift register 622a. Digital video signals are inputted to the memory circuit A 622b and latch signals are inputted to the memory circuit B 622c. A constant signal current Ic outputted from the constant current circuit 622d is inputted to the signal lines.

When clock signals CLK and start pulse signals SP are inputted from given wirings to the shift register 622a, timing signals are generated. The timing signals are respectively inputted to plural latches A (LATA_1 to LATA_x) of the memory circuit A 622b. The timing signals generated in the shift register 622a may be buffered and amplified by a buffer or the like before they are respectively inputted to the plural latches A (LATA_1 to LATA_x) of the memory circuit A 622b.

As the timing signals are inputted to the memory circuit A 622b, one bit of digital video signals to be inputted to video signals lines are sequentially written and held in the plural latches A (LATA_1 to LATA_x) in sync with the timing signals.

To input digital video signals to the memory circuit A 622b, here digital video signals are sequentially inputted to the plural latches A (LATA_1 to LATA_x) of the memory circuit A 622b. However, the present invention is not limited thereto and may employ so-called division driving in which plural stages of latches of the memory circuit A 622b are divided into several groups and digital video signals are inputted to each group concurrently. The number of groups in division driving is called division number. For instance, if four stages of latches make one group, it is four-division driving.

A time period required to write digital video signals in all stages of latches of the memory circuit A 622b once is called a line period. In practice, the line period described above plus a horizontal retrace period are sometimes regarded as a line period.

As one line period is ended, latch signals are supplied through latch signals lines to a plurality of latches B (LATB_1 to LATB_x) of the memory circuit B 622c. In this instant, the digital video signals that have been held in the plural latches A (LATA_1 to LATA_x) of the memory circuit A 622b are written at once in the plural latches B (LATB_1 to LATB_x) of the memory circuit B 622c to be held therein.

After sending the digital video signals to the memory circuit B 622c, the memory circuit A 622b sequentially receives next one bit of digital video signals in response to timing signals from the shift register 622a.

During the one line period that comes the second time, the digital video signals written and held in the memory circuit B 622c are inputted to the constant current circuit 622d.

Figure 27A:
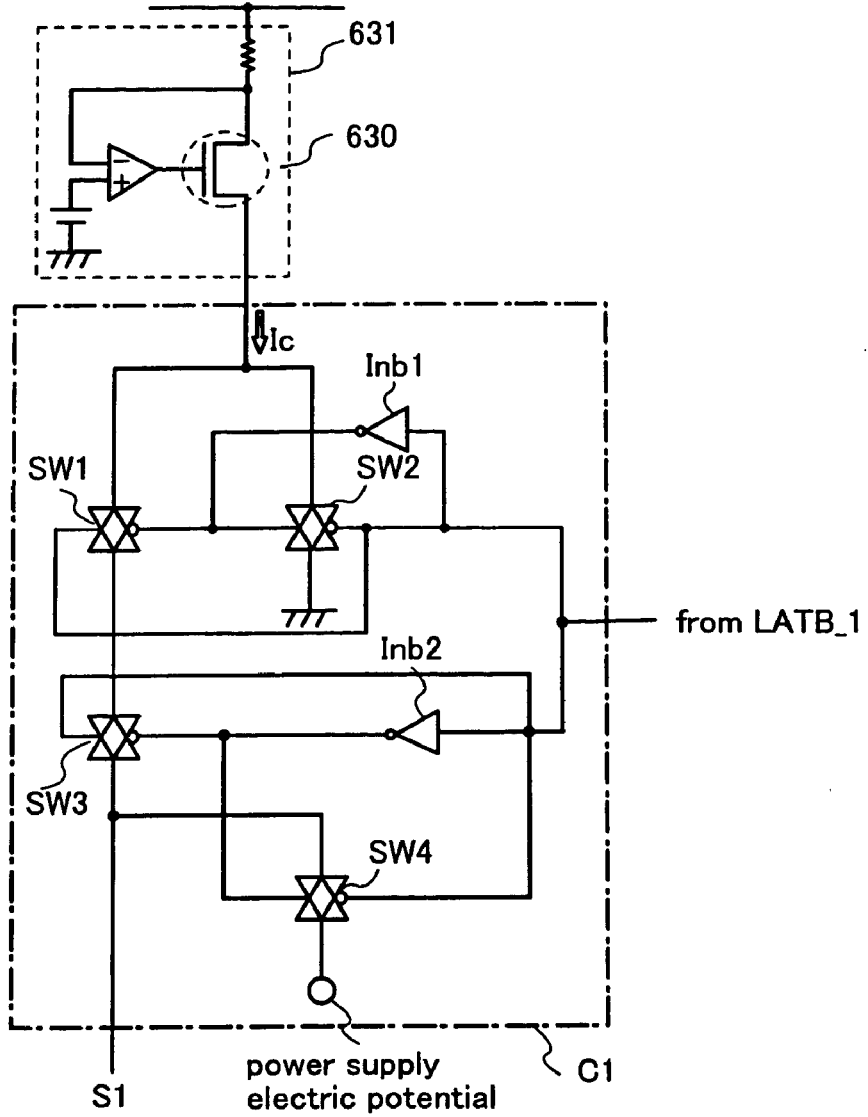
FIGS. 27A and 27B are equivalent circuit diagrams of a current setting circuit (Embodiment Mode 5)
Figure 27B:
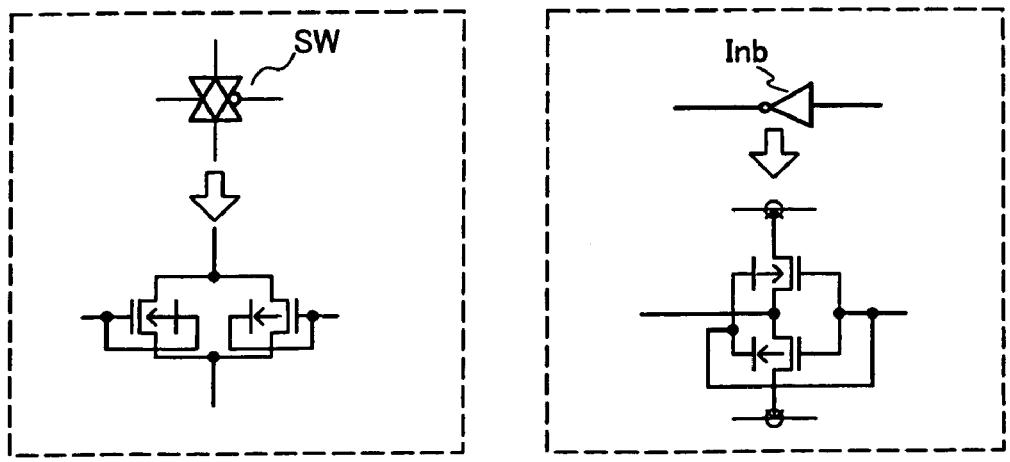

FIG. 27A shows a more detailed structure of a current setting circuit C1. Current setting circuits C2 to Cx also have this same structure. FIG. 27B shows equivalent circuits of SW and Inb in FIG. 27A. In an example shown in FIG. 27B, wirings for forming channels above and below a semiconductor film (dual channels) are directly connected to gate electrodes and Vx=V$_Y$ is satisfied. However, some or all of wirings may be set to a common voltage (Vcom) or ground voltage. This can reduce fluctuation in threshold and can lower OFF current compared to the case where only one electrode is provided.

The current setting circuit C1 has a constant current source 631, four transmission gates SW1 to SW4, and two inverters Inb1 and Inb2. The polarity of a transistor 630 of the constant current source 631 is the same as the polarity of transistors Tr1 and Tr2 of a pixel.

Switching of SW1 to SW4 is controlled by digital video signals outputted from LATB_1 of the memory circuit B 622c. Digital video signals inputted to SW1 and SW3 and digital video signals inputted to SW2 and SW4 are inverted by Inb1 and Inb2. Accordingly, SW2 and SW4 are OFF when SW1 and SW3 are ON whereas SW2 and SW4 are ON when SW1 and SW3 are OFF.

When SW1 and SW3 are ON, a given amount of current Ic which is not 0 is inputted from the constant current source 631 through SW1 and SW3 to the signal line S1.

On the other hand, when SW2 and SW4 are ON, a current Ic from the constant current source 631 is dropped to the ground through SW2. Also, the power supply electric potential of the power supply lines V1 to Vx is given to the signal line S1 through SW4 and Ic=0 is satisfied.

Reference is made again to FIG. 25B. The operation described above is carried out simultaneously in all of the current setting circuits (C1 to Cx) of the constant current circuit 622d in one line period. Therefore the value of signal current Ic to be inputted to every signal line is chosen by digital video signals.

Next, the structure of the scanning line driving circuit will be described.

The scanning line driving circuit has a shift register and a buffer. It may have a level shifter in some cases.

Timing signals are generated in the scanning line driving circuit when clock signals CLK and start pulse signals SP are inputted to its shift register. The timing signals generated are buffered and amplified in the buffer and then supplied to a designated scanning line.

Gates of transistors of one line of pixels are connected to each scanning line. Since transistors of one line of pixels have to be turned ON at once, the buffer used should be capable of allowing a large amount of current to flow.

A circuit capable of selecting a scanning line, such as a decoder circuit, may be employed instead of the shift register.

Voltages of scanning lines may be controlled by a plurality of scanning line driving circuits associated with the respective scanning lines. Alternatively, voltages of several or all scanning lines may be controlled by one scanning line driving circuit.

The signal line driving circuit and scanning line driving circuit for driving a light emitting device of the present invention are not limited to the structures shown here.

Figure 26:
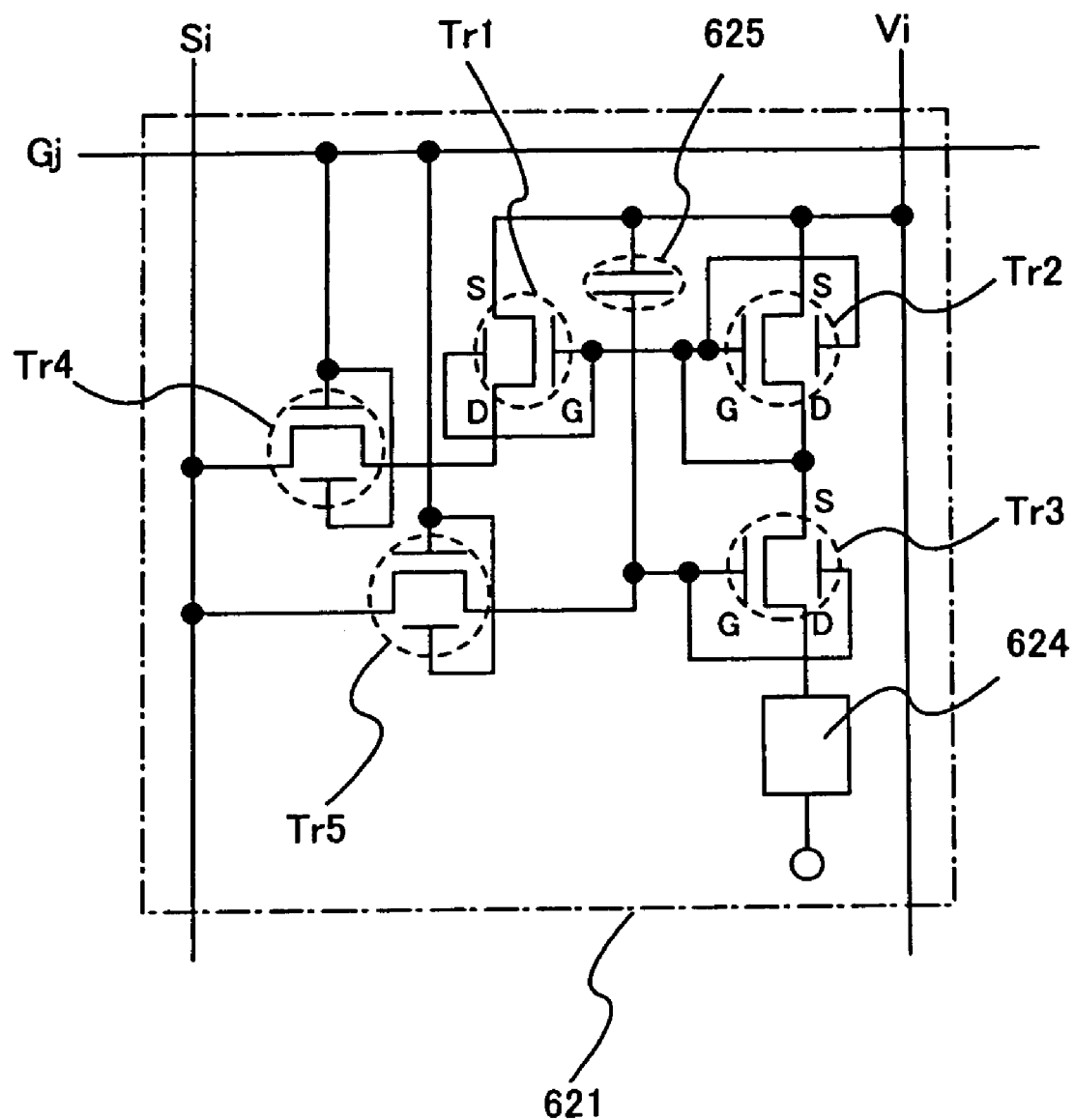
FIG. 26 is an equivalent circuit diagram of a pixel (Embodiment Mode 5)

FIG. 26 shows an example of detailed structure of the pixel 621 shown in FIG. 25A. The pixel 621 in FIG. 26 has a signal line Si (one of S1 to Sx), a scanning line Gj (one of G1 to Gy), a power supply line Vi (one of V1 to Vx), and a wiring to which a common voltage (Vcom) or an arbitrary voltage (V$_Y$) is applied.

Also, the pixel 621 has at least a transistor Tr1 (first driving transistor or first transistor), a transistor Tr2 (second driving transistor or second transistor), a transistor Tr3 (third driving transistor or third transistor), a transistor Tr4 (first switching transistor or fourth transistor), a transistor Tr5 (second switching transistor or fifth transistor), an OLED 624, and a storage capacitor 625. By employing the pixel structure shown in FIG. 26, the amount of current flowing into a light emitting element can be controlled without being influenced by TFT characteristics. In addition, the pixel structure of FIG. 26 can provide a current driving type light emitting device in which fluctuation in luminance between light emitting elements of pixels due to difference in TFT characteristics is reduced and insistence of image is hardly recognized.

In each of these transistors (Tr1, Tr2, Tr3, Tr4, and Tr5), wirings to which a common voltage (Vcom) or an arbitrary voltage ($V_Y$) is applied form channels over and under a semiconductor film (dual channels). In this way, fluctuation in threshold can be reduced and the OFF current can be lowered compared to the case in which only one electrode is provided. In the example shown here, all the wirings are directly connected to gate electrodes and $Vx=V_Y$ is satisfied. However, some or all of wirings may be set to a common voltage (Vcom) or ground voltage.

Gate electrodes of the transistor Tr4 and transistor Tr5 are both connected to the scanning line Gj.

The transistor Tr4 has a source region and a drain region one of which is connected to the signal line Si and the other of which is connected to a drain region of the transistor Tr1. The transistor Tr5 has a source region and a drain region one of which is connected to the signal line Si and the other of which is connected to a gate electrode of the transistor Tr3.

Gate electrodes of the transistor Tr1 and transistor Tr2 are connected to each other. Source regions of the transistor Tr1 and transistor Tr2 are both connected to the power supply line Vi.

A gate electrode of the transistor Tr2 is connected to its drain region. The drain region of Tr2 is connected to a source region of the transistor Tr3.

A drain region of the transistor Tr3 is connected to a pixel electrode of the OLED 624. The OLED 624 has an anode and a cathode. In this specification, when an anode is used as a pixel electrode, a cathode is called an opposite electrode whereas an anode called an opposite electrode when a cathode serves as a pixel electrode.

The level of electric potential of the power supply line Vi (power supply electric potential) is kept constant. The level of electric potential of the opposite electrode is also kept constant.

The transistor Tr4 may be an n-channel transistor or a p-channel transistor and the same applies to the transistor Tr5. However, the transistor Tr4 and the transistor Tr5 have to have the same polarity.

The transistor Tr1 may be an n-channel transistor or a p-channel transistor and the same applies to the transistors Tr2 and Tr3. However, the transistors Tr1, Tr2, and Tr3 have to have the same polarity. When the anode is used as the pixel electrode and the cathode serves as the opposite electrode, the transistors Tr1, Tr2, and Tr3 are p-channel transistors. On the other hand, when the anode is used as the opposite electrode and the cathode serves as the pixel electrode, the transistors Tr1, Tr2, and Tr3 are n-channel transistors.

The storage capacitor 625 is formed between the gate electrode of the transistor Tr3 and the power supply line Vi. The storage capacitor 625 is provided to maintain the voltage between the gate electrode and source region of the transistor Tr3 (gate voltage) more securely.

Alternatively, the storage capacitor may be formed between the gate electrodes of the transistors Tr1 and Tr2 and the power supply line to maintain the gate voltages of the transistors Tr1 and Tr2 more securely.

Either the above-described TFTs (Tr1 to Tr5) of the pixel portion or the TFTs (SW1 to 4, Inb1, and Inb2) of the driving circuits may be arranged to have the same channel length direction, which is matched to the laser beam scanning direction. However, it is desirable to give all TFTs of the pixel portion and of the driving circuits the same channel length direction and to make the channel length direction coincide with the laser beam scanning direction.

The present invention is not limited to the above crystallization method using laser light. Other laser crystallization methods, a crystallization technique using nickel as a metal element that accelerates crystallization of silicon, and a solid phase growth method and like other crystallization techniques may be employed in combination.

This embodiment mode may be combined freely with any one of Embodiment Modes 1 through 4.

Embodiment Mode 6

Figure 32:
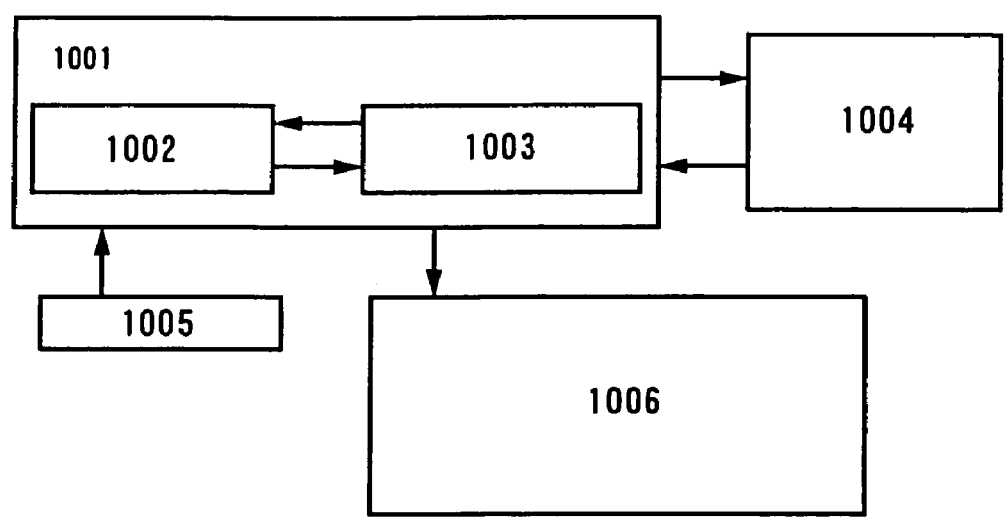
FIG. 32 is a block diagram showing Embodiment Mode 6.

An example of forming a CPU and a memory on a substrate having an insulating surface will be described with reference to FIG. 32.

Reference symbol 1001 denotes a central processing unit (called CPU), 1002, a control unit, 1003, a computing unit, 1004, a memory unit (memory), 1005, an input unit, and 1006, an output unit (display unit or the like).

The computing unit 1003 and the control unit 1002 constitute the central processing unit 1001. The computing unit 1003 is composed of an arithmetic logic unit (ALU), various registers, a counter, and other components. The ALU is for arithmetic operations such as addition and subtraction and for logical operations such as AND, OR, and NOT. The registers temporarily store computation data and results. The counter counts up the number of 1 inputted. Circuits that constitute the computing unit 1003, for example, an AND circuit, an OR circuit, a NOT circuit, a buffer circuit, and a register circuit, can be built from TFTs. The TFTs use as their active layers semiconductor films crystallized by continuous wave laser light in order to obtain high field effect mobility. In this embodiment also, the channel length direction of TFTs that constitute the computing unit 1003 is matched to the laser beam scanning direction.

The control unit 1002 executes command stored in the memory unit 1004 to control the operation of the entire device. The control unit 1002 is composed of a program counter, a command register, and a control signal generating unit. The control unit 1002 also can be built from TFTs, which use as their active layers semiconductor films crystallized by continuous wave laser light. In this embodiment also, the channel length direction of TFTs that constitute the control unit 1002 is matched to the laser beam scanning direction.

The memory unit 1004 is where data and command for calculation are stored, and the unit 1004 stores data and programs that are frequently executed in the CPU. The memory unit 1004 is composed of a main memory, an address register, and a data register. In addition to the main memory, the unit 1004 may have a cash memory. These memories are SRAM, DRAM, flash memories, or the like. When the memory circuit 1004 is built from TFTs, the TFTs may use as their active layers semiconductor films crystallized by continuous wave laser light. In this embodiment also, the channel length direction of TFTs that constitute the memory unit 1004 is matched to the laser beam scanning direction.

The input unit 1005 is a device for fetching data and programs in from the external. The output unit 1006 is a device for displaying results, typically a display device.

By matching the channel length direction of TFTs with the laser beam scanning direction, a CPU with less fluctuation can be constructed on an insulating substrate. It is also possible to build a CPU and a display unit on the same substrate. Preferably, the channel length direction of plural TFTs in respective pixels in the display unit also coincides with the laser beam scanning direction.

It is also possible to build a CPU, a display unit, and a memory on the same substrate although the circuit design and manufacture process is complicated.

According to the present invention, a semiconductor device with less fluctuation in electric characteristic can be constructed on an insulating substrate.

This embodiment mode may be combined freely with any one of Embodiment Modes 1 through 5. For instance, a display unit which has a TFT, pixel structure, and EL element shown in Embodiment Modes 1 through 5 can be manufactured on the same substrate where the CPU is fabricated.

More detailed description will be given on the present invention structured as above through the following embodiments, which show specific examples of applying the present invention to semiconductor devices represented by active matrix light emitting devices.

EMBODIMENTS

Embodiment 1

In this embodiment, steps of manufacturing a semiconductor device according to the present invention will be described. In addition, a method of manufacturing TFT's for a pixel portion will be described in detail here. Note that, this embodiment shows an example that a common voltage (Vcom) or an arbitrary voltage (Vx) is applied to a first electrode on TFT used as a switching element (switching TFT) and a first electrode and a second electrode are connected to each other on TFT controlling current which flows to the light emitting element (driving TFT). Further, although the method of manufacturing TFT's for the pixel portion is only described in this embodiment, TFT's for a driver circuit may also be manufactured simultaneously.

FIGS. 8A to 11 are cross-sectional views for explaining the light emitting device manufacturing steps. FIGS. 12A to 14 are corresponding top views thereof. For the convenience of explanation, common reference symbols are used therein.

Figure 8A:
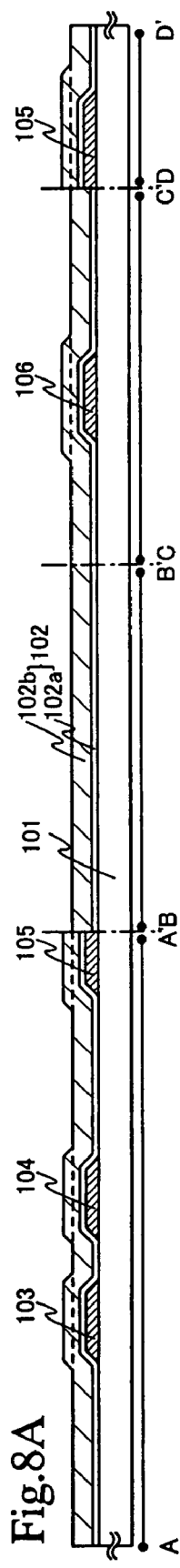
FIGS. 8A to 8D are sectional views illustrating a process of manufacturing a light emitting device (Embodiment 1)

In FIG. 8A, a substrate made of an arbitrary material can be used as a substrate 101 as long as the substrate has an insulating film and resists treatment temperature in later steps. Typically, a glass substrate, a quartz substrate, a ceramic substrate or the like can be used. Alternatively, a substrate such as a silicon substrate, a metal substrate or a stainless substrate having an insulating film formed on the surface thereof may be used. It is also possible to use a plastic substrate having heat resistance against the treatment temperature in this embodiment.

A first wiring 105 and first electrodes 103, 104 and 106 are formed on the insulating surface of the substrate 101. Each of the first wiring 105 and the first electrodes are formed out of a conductive material made of one or a plurality of types of elements selected from among Al, W, Mo, Ti and Ta. In this embodiment, tungsten (W) is used as the material of the first wiring 105. Alternatively, a conductive material having tungsten (W) layered on TaN may be used as each of the first wiring and the first electrodes.

After forming the first wiring 105 and the first electrodes 103, 104 and 106, a first insulating film 102 is formed. In this embodiment, the first insulating film 102 is formed by layering two insulating films (a first insulating film A 102*a* and a first insulating film B 102*b*). The first insulating film A 102*a* is formed out of a silicon oxide nitride film to have a thickness of 10 to 50 nm. The first insulating film B 102*b* is formed out of a silicon oxide film or a silicon oxide nitride film to have a thickness of 0.5 to 1 μm.

Figure 12A:
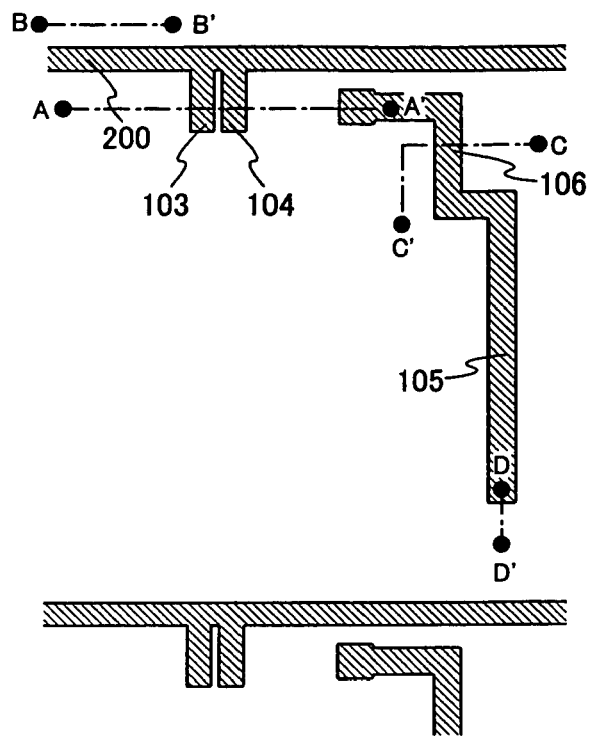
FIGS. 12A and 12B are top views illustrating a process of manufacturing a light emitting device (Embodiment 1)

FIG. 12A is a top view of a pixel portion shown in FIG. 8A. A cross-sectional view taken along line A–A', B–B', C–C', and D–D' corresponds to the FIG. 12A. Note that, the first electrodes 103 and 104 form a part of a common wiring 200. Further the first electrode 106 forms a part of the first wiring 105.

The surface of the first insulating film 102 has often irregularities resulting from the first wiring and the first electrodes formed prior to the first insulating film 102. It is preferable to flatten these irregularities. As a planarization method, the CMP method is used. As an abrasive material (slurry) for the CMP applied to the first insulating film 102, a KOH-added aqueous solution into which foamed silica particles obtained by pyrolysis of silicon chloride gas are dispersed, for example, may be used. By the CMP, the first insulating film 102 is removed by a thickness of about 0.1 to 0.5 μm to thereby flatten the surface thereof.

Figure 8B:
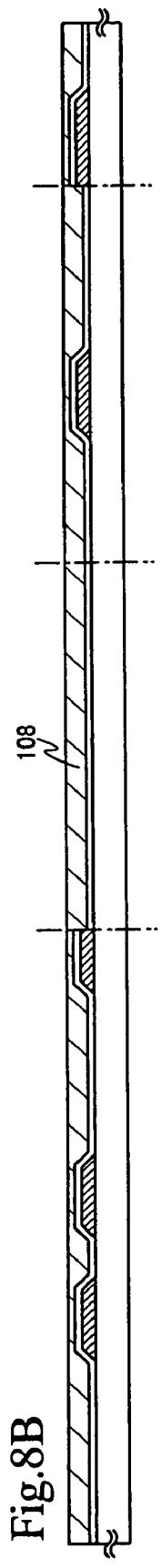

As a result, as shown in FIG. 8B, the flattened first insulating film 108 is formed. A semiconductor layer is formed on the first insulating film 108. The semiconductor layer is formed out of semiconductor of a crystal structure. The semiconductor layer can be obtained by crystallizing an amorphous semiconductor layer formed on the first insulating film 108. After being deposited, the amorphous semiconductor layer is crystallized by a heat treatment or laser irradiation. Although the material of the amorphous semiconductor layer is not limited to a specific one, the amorphous semiconductor layer is preferably formed out of silicon, silicon germanium ($Si_xGe_{1-x}$, where $0<x<1$, typically $x=0.001$ to 0.05) alloy or the like.

A semiconductor film having crystalline structure is formed by using a laser processing apparatus in FIG. 5 in accordance with the method described in Embodiment Mode 1. Further, the semiconductor film is distributed in accordance with Embodiment Mode 1, thereby matching the direction of the channel length of the semiconductor layer and the scanning direction of laser light.

Figure 8C:
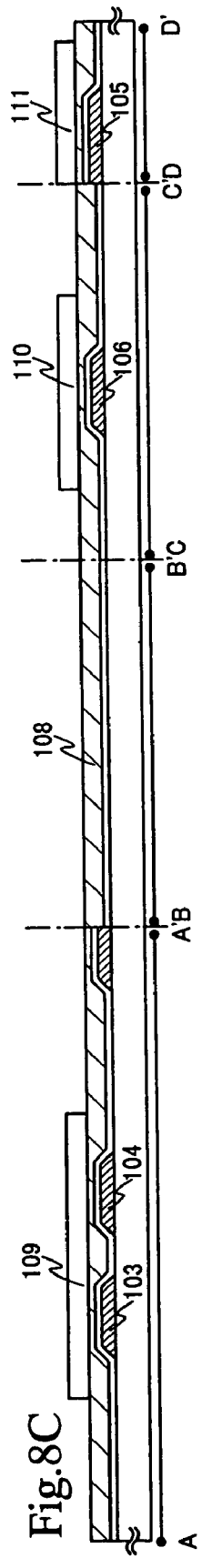

Thereafter, the semiconductor layer is etched to be divided into banded sections to thereby form semiconductor films 109 to 111 as shown in FIG. 8C.

Figure 12B:
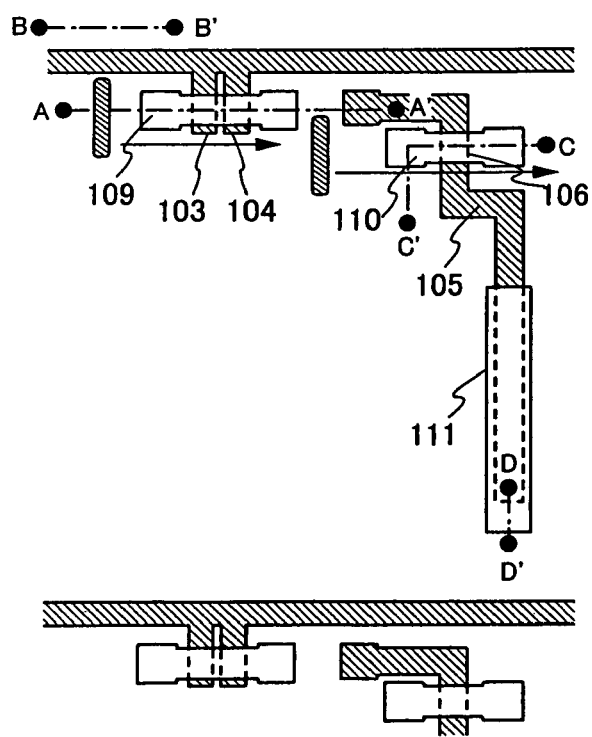

FIG. 12B is a top view of FIG. 8C. A cross-sectional view taken along line A–A', B–B', C–C', and D–D' in FIG. 8C corresponds to the FIG. 12B. Note that FIG. 12B shows a laser beam and the direction of scanning the laser beam. (direction of the arrow in FIG. 12)

The first electrodes 103 and 104 are overlapped with the semiconductor film 109 with the first insulating film 108 interposed therebetween. In addition, the first electrode 106 is overlapped with the semiconductor film 110 with the first insulating film 108 interposed therebetween. A semiconductor film 111 is provided to form a capacitance and overlapped with the first wiring 105 with the first insulating film 108 interposed therebetween.

Next, a second insulating film 112 which covers the semiconductor films 109 to 111 is formed. The second insulating film 112 is formed out of insulator containing silicon by a plasma CVD method or a sputtering method. The thickness of the second insulating film 112 is 40 to 150 nm.

Figure 8D:
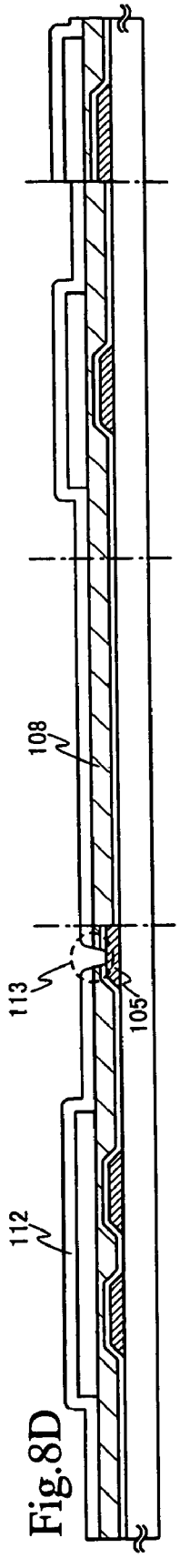

A contact hole 113 is formed on the first insulating film 108 and the second insulating film 112 so as to expose a part of the wiring 105 (FIG. 8D).

As shown in FIG. 9A, conductive films for forming a second gate electrode and a second wiring, are formed on the second insulating film 112. According to the present invention, the second gate electrode is formed by layering two or more conductive films. A first conductive film 120 provided on the second insulating film 112 is formed out of a nitride of high melting point metal such as molybdenum or tungsten. A second conductive film 121 provided on the first conductive film 120 is formed out of high melting point metal, low resistance metal such as copper or aluminum or polysilicon. More specifically, as the first conductive film, a metal nitride of one or a plurality of elements selected from among W, Mo, Ta and Ti is used. As the second conductive film, alloy of one or a plurality of elements selected from W, Mo, Ta, Ti, Al and Cu or n type polycrystalline silicon is used. For example, the first conductive film 120 may be formed out of TaN and the second conductive film 121 may be formed out of tungsten (W). If the second gate electrode or the second wiring is formed out of three layers of conductive films, the first layer may be an Mo film, the second layer may be an Al film and the third layer may be a TiN film. Alternatively, the first layer may be a W film, the second layer may be an Al film and the third layer may be a TiN film. By providing a multilayer wiring, the thickness of the wiring itself increases to make it possible to suppress wiring resistance.

A shown in FIG. 9B, the first etching treatment is conducted for the first conductive layer 120 and the second conductive layer 121 by using a mask 122. First shape type electrodes 123 to 129 each having tapered end sections (which electrodes consist of the first conductive films 123a to 129a and the second conductive films 123b to 129b, respectively) are formed by the first etching treatment. The surface of the second insulating film 112 is etched and thinned by a thickness of about 20 to 50 nm in the sections in which the second insulating film 112 is not covered with the first shape type electrodes 123 to 129.

The first doping treatment is carried out by an ion injection method or an ion doping method for injecting ions without causing mass separation. In the doping, using the first shape type electrodes 124 to 126 and 129 as masks, first concentration, one conductive type impurity regions 151 to 153 are formed in the semiconductor films 109 to 111, respectively. The first concentration is set at $1 \times 10^{20}$ to $1.5 \times 10^{21}/cm^3$.

Next, the second etching treatment is carried out as shown in FIG. 9C without removing a mask made of resist. In the second etching treatment, second shape type electrodes 134 to 140 (which consist of first conductive films 134a to 140a and second conductive films 134b to 140b, respectively) are formed by subjecting the second conductive film to anisotropic etching. The second shape type electrodes 134 to 140 are formed so that the widths thereof are reduced by the second etching treatment and the end sections thereof are located inward of the first concentration, one conductive type impurity regions 151 to 153 (second impurity regions). As shown in the next step, the length of an LDD is determined according to each reduced width. The second shape type electrodes 134 to 140 function as second electrodes, respectively.

Figure 13A:
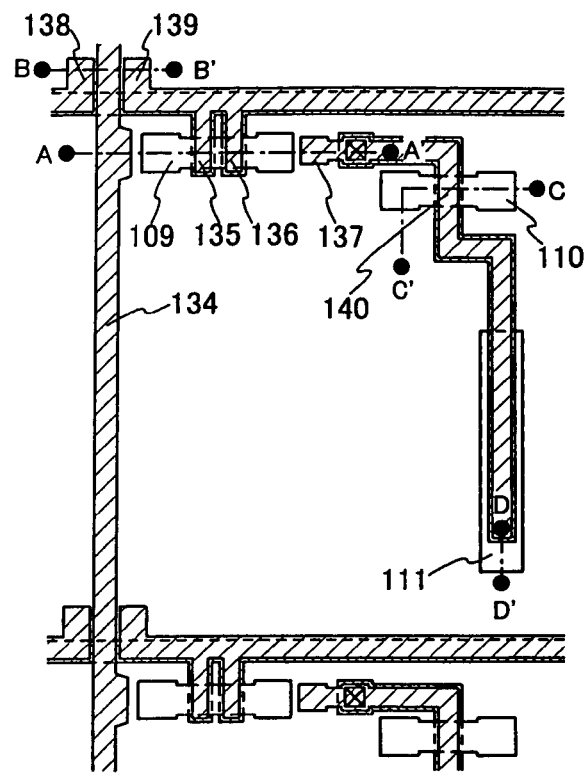
FIGS. 13A and 13B are top views illustrating a process of manufacturing a light emitting device (Embodiment 1)

FIG. 13A is a top view of FIG. 9C. A cross-sectional view taken along line A–A', B–B', C–C', and D–D' in FIG. 9C corresponds to the FIG. 13A. The second shape type electrodes 135 and 136 form a part of an electrode 138 and 139 functioning as a gate wiring. The second shape type electrodes 135 and 136 are overlapped with the first electrodes 103 and 104, respectively, with the first insulating film 108, the semiconductor layer 109 and the second insulating film 112 interposed therebetween. The second shape type electrode 140 is overlapped with the first electrode 106 with the first insulating film 108, the semiconductor layer 110 and the second insulating film 112 interposed therebetween.

In addition, the second shape type electrode 140 forms a part of the electrode 137 functioning as the second wirings. The second wirings 137 is overlapped with the first wiring 105 with the second insulating film 112, the semiconductor layer 111 and the first insulating film 108 interposed therebetween. The second wiring 137 is connected to the first wiring 105 through the contact hole 113. The electrode 134 functions as source wirings.

In this state, the second doping treatment is carried out to thereby inject one conductive type impurities into the semiconductor films 109 to 111 (FIG. 9C). Second concentration, one conductive type impurity regions (first impurity regions) 155, 156, 158, 159, 161, 162, 164, 165, 168, 169, 171, 172, 175, and 176 are formed by the second doping treatment. First impurity regions 156, 158, 162, 164, 169, 171, and 175 are formed to be overlapped with the first conductive films 135a to 137a and 140a which constitute the second shape type electrodes 135 to 137 and 140 in a self-aligning manner, respectively. Since the impurities doped by the ion doping method are passed through the first conductive films 135a to 137a and 140a and then added to the semiconductor films, the number of ions which reach the semiconductor films decreases and the ion concentration of each semiconductor film, quite naturally, becomes low. The concentration is $1 \times 10^{17}$ to $1 \times 10^{19}/cm^3$. Moreover, the first impurity regions 155, 159, 161, 165, 168, 172, and 176 are formed not to be overlapped with the first conductive films 135a to 137a and 140a which constitute the second shape type electrodes 135 to 137 and 140 in self-aligning manner, respectively.

Further, the second impurity regions 154, 160, 166, 167, 173, and 177 having higher impurity concentration than that of the channel forming regions 157, 163, 170, and 174 and the first concentration, one conductive type impurity regions 151 to 153 are formed by the second doping treatment.

Next, as shown in FIG. 10A, masks 143 made of resist are formed. Using the masks 143, the third doping treatment is carried out. In this third doping treatment, third impurity regions 144 to 150 of a conductive type opposite to one conductive type of a third concentration are formed in the semiconductor films 110, respectively. The third impurity regions are divided into the a regions 146 and 148 where overlapping with the second shape type electrode 140 and a regions 144 to 145, and 149 to 150 where not overlapping with the second shape type electrode 140. Then, the impurity element is added to the third impurity regions 144 to 150 in a concentration range of $1.5 \times 10^{20}$ to $1.5 \times 10^{21}/cm^3$.

As a result of the above steps, the impurity doped regions intended for valence electron control are formed in the respective semiconductor films. The first electrodes 103 to 104 and 106, and the second shape type electrodes 135, 136 and 140 function as gate electrodes at positions at which the electrodes cross the semiconductor films, respectively.

Thereafter, a step of activating the impurity elements doped into the respective semiconductor films is executed. In this activation treatment, gas heating type instantaneous heat annealing is employed. The heat treatment is carried out at a temperature of 400 to 700° C. in a nitrogen atmosphere, typically at a temperature of 450 to 500° C. In addition to the heat annealing, laser annealing using the second higher harmonic wave (532 nm) of a YAG laser is available. If the impurities are activated by the irradiation of a laser beam, the laser beam is applied to the semiconductor films using the second higher harmonic wave (532 nm) of the YAG laser. Needless to say, the RTA method which uses a lamp light source instead of laser light is also applicable. In the RTA method, the lamp light source is radiated from the both sides or one side of a substrate to thereby heat the semiconductor films.

Thereafter, as shown in FIG. 10B, a passivation film 180 made of silicon nitride is formed to have a thickness of 50 to 100 nm by the plasma CVD method, a heat treatment is carried out at a temperature of 410° C. using a clean oven and the semiconductor films are hydrogenated with hydrogen emitted from the silicon nitride film.

Next, a third insulating film 181 made of an organic insulating material is formed on the passivation film 180. The reason for using the organic insulating material is to flatten the surface of the third insulating film 181. To obtain a more completely flattened surface, the surface of the third insulating film 181 is preferably subjected to a planarization treatment by the CMP method. If the CMP is used in combination with the planarization, a silicon oxide film formed by the plasma CVD method, an SOG (Spin on Glass) film or a PSG film formed by a coating method, or the like can be used as the third insulating film 181. The passivation film 180 may be regarded as a part of the third insulating film 181.

As shown in FIG. 10C, contact holes are formed on the second insulating film 112, a passivation film 180, and the third insulating film 181. And then, wirings 182 to 186 are formed. The wirings are formed to be laminated a titanium film and an aluminum film.

Figure 13B:
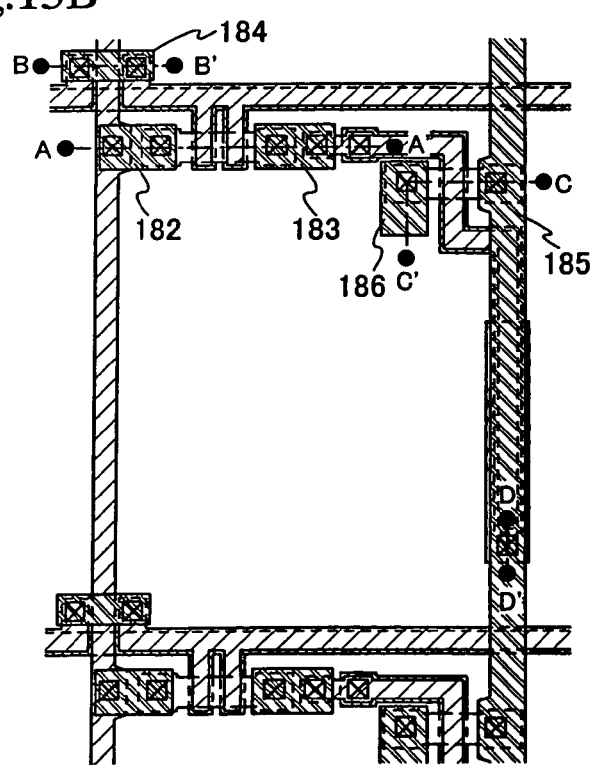

FIG. 13B show a top view of FIG. 10C. A sectional view taken along line A–A', B–B', C–C', and D–D' in FIG. 4C corresponds to FIG. 13B.

The wiring 182 is connected to the source wiring 134 and the second impurity region 166 respectively. The wiring 183 is connected to the second impurity region 166 and the first wiring 137 respectively. The wiring 184 is connected to the gate wirings 138 and 139 respectively. The wiring 185 functions as the power supply line and is connected to the third impurity region 167 and the second impurity region 177 respectively. The wiring 186 is connected to the third impurity region 173.

In the steps described so far, if the one conductive type impurity region is n-type region and the impurity region of the conductive type opposite to one conductive type is p-type region, an n-channel TFT 202 as a switching TFT and p-channel TFT 203 as a driver circuit are formed respectively. Note that, although the n-channel TFT is used for the switching TFT and p-channel TFT is used for the driver circuit in this embodiment, present invention is not limited to this structure. The p-channel TFT and n-channel TFT may be used as the switching TFT and the driving TFT respectively. However, if an anode of EL elements is used as the pixel electrode, it is preferable that the p-channel TFT is used to the driver circuit. If a cathode of EL elements is used as the pixel electrode, the n-channel TFT is used to the driver circuit.

Figure 11:
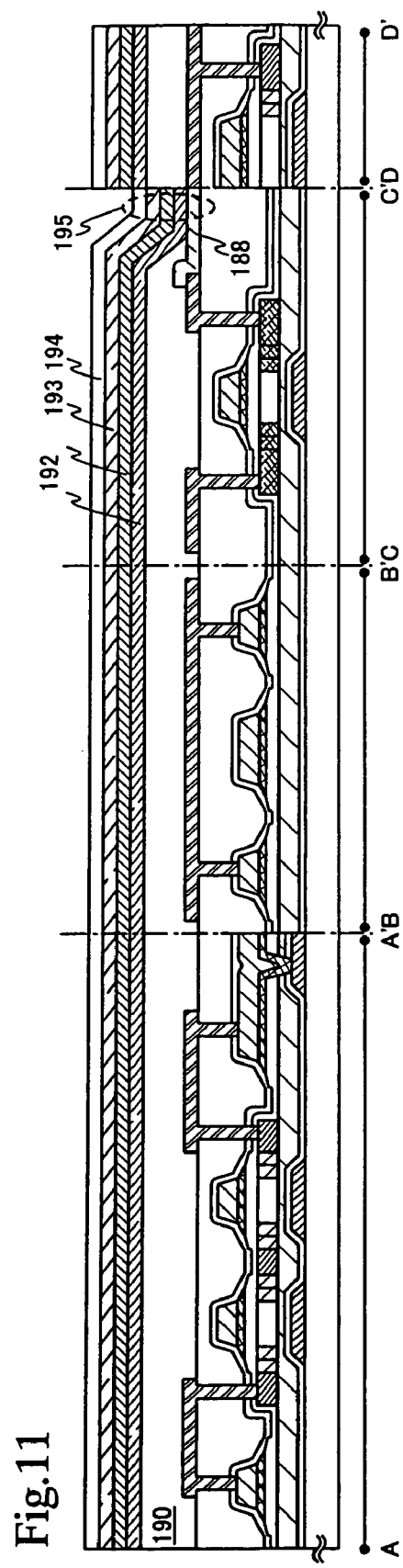
FIG. 11 is a sectional view illustrating a process of manufacturing a light emitting device (Embodiment 1)
Figure 14:
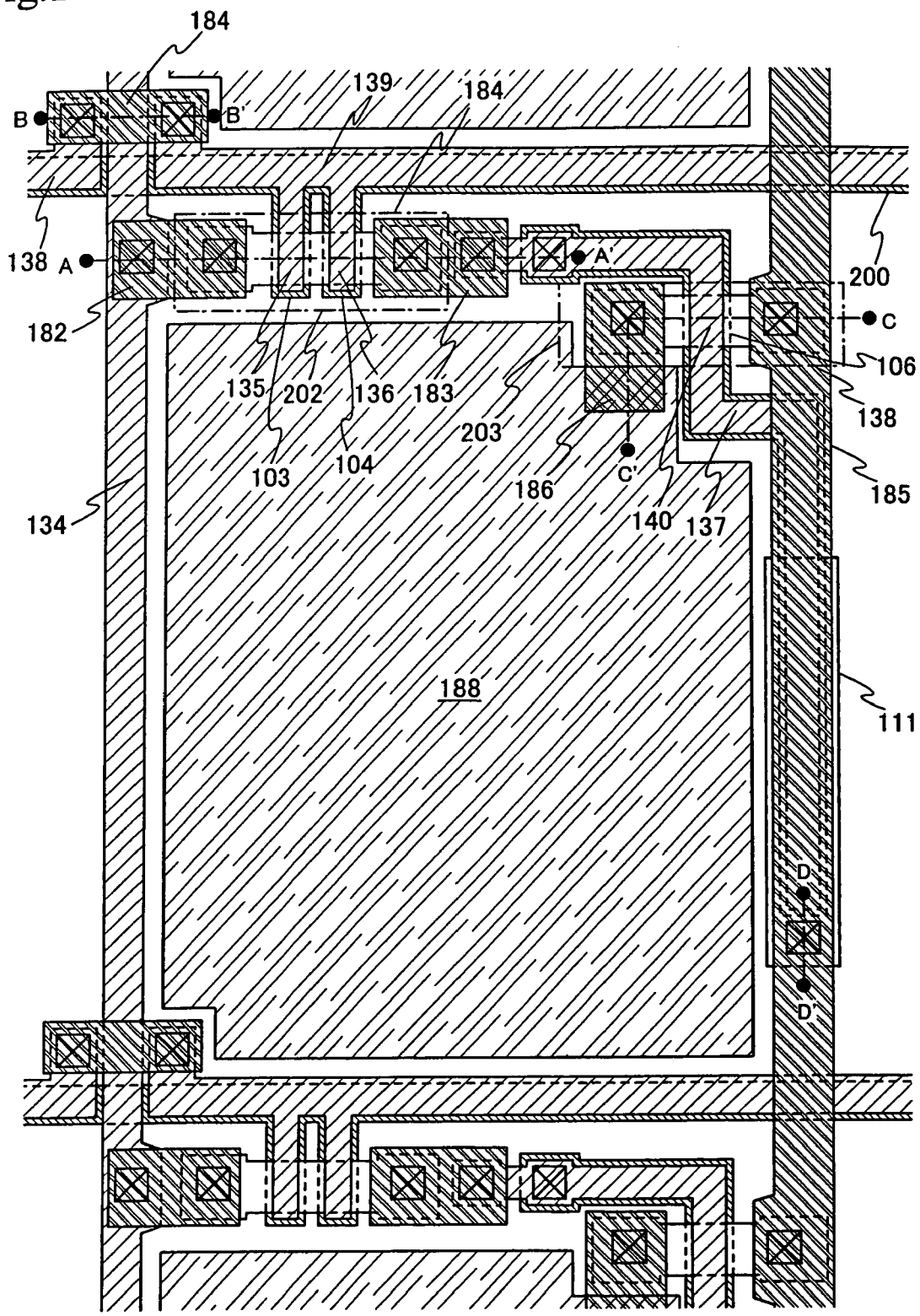
FIG. 14 is a top view of a pixel of a light emitting device (Embodiment 1)

As shown in FIG. 11, a transparent conductive film containing indium oxide or tin oxide as its main component is formed with a thickness of 60 to 120 nm on the surface of the flatten third insulating film 181. Then, the transparent conductive film is etched to form a pixel electrode (third electrode) 188 connecting to the wirings 186. FIG. 14 shows a top view of FIG. 11 immediately after the pixel electrode 188 is formed. A sectional view taken along the lines A–A', B–B', C–C', and D–D' in FIG. 14 corresponds to the FIG. 11.

In the n-channel TFT 202, the first impurity regions 156, 158, 162, and 164 function as LDD respectively, and the second impurity regions 164 and 166 function as a source or drain region respectively. This n-channel TFT 202 is in a form wherein two TFTs are connected to each other in series so as to sandwich the second impurity region 160. The length, in the channel length direction, of the LDD is form 0.5 to 2.5 µm, preferably 1.5 µm. A main purpose of such a construction of the LDD is to prevent deterioration of the TFTs based on hot carrier effect. In the p-channel TFT 203, the third impurity regions 167 and 163 function as a source or drain region.

In this embodiment, by always applying a constant voltage (common voltage) to the common wiring 200, the common voltage is applied to the first electrodes 103 and 104. This constant voltage is set to be lower than a threshold voltage in case of the n-channel TFT and higher than the threshold voltage in case of the p-channel TFT. By applying the common voltage to the first electrode, the threshold irregularity of the TFT can be suppressed compared with the TFT which includes only one electrode. It is also possible to suppress OFF current. The decrease of OFF current rather than the increase of ON current influences the TFT which is formed as a switching element in the pixel portion of the semiconductor device. The above-stated structure is, therefore, advantageous to this TFT.

Further, in this embodiment, by forming a pair of electrodes 106 and 140 electrically connected to each other through the semiconductor film therebetween on the driving TFT 203, the thickness of the semiconductor film is substantially halved, the formation of a depleted region is accelerated following the application of a gate voltage, making it possible to improve the field effect mobility and to lower the sub-threshold coefficient. As a result, by using the TFT of such a structure in the driving TFT, it is possible to decrease driving voltage. In addition, current driving capability is improved and the TFT can be thereby made smaller in size (channel width thereof can be particularly made smaller). It is thus possible to improve the integration density of the semiconductor device.

A capacitance is formed in the section in which the first wirings 105 and the first insulating film 108, and the semiconductor layer 111 are overlapped with one another. A capacitance is also formed in the section in which the second wiring 137, the second insulating film 112, and the semiconductor layer 111 are overlapped with one another.

Further, as shown in FIG. 11, a partition layer 190 which covers the n-channel TFT 202 and the p-channel TFT 203, is formed on the third insulating film 181. Since it is difficult to perform a wet treatment (such as etching with chemicals or washing) in an organic compound layer or a cathode, the partition layer 190 formed out of a photosensitive resin material is provided on a third insulating film adjusting to the position of the pixel electrode 188. The partition layer 190 is formed out of an organic resin material such as polyimide, polyamide, polyimide amide or acryl. This partition layer 190 is formed to cover the end sections of the pixel electrode. In addition, each of the end sections of the partition layer 190 is formed to have a taper angle of 45 to 60 degrees.

An active matrix driven type light emitting device shown herein is constituted by arranging light emitting elements in a matrix. The light emitting element 195 consists of an anode, a cathode and an organic compound layer formed between the anode and the cathode. If the pixel electrode 188 is formed out of a transparent conductive film, the pixel electrode 188 serves as the anode. The organic compound layer 192 is formed out of a combination of a hole transport material having relatively high hole mobility, an electron transport material opposite to the hole transport material, a light emitting material and the like. These materials may be formed into respective layers or mixed with one another.

The organic compound material is formed as thin film layers having a total thickness of about 100 nm. To this end, the surface of the ITO conductive thin film formed as the anode should have improved flatness. If flatness is low, the anode or the ITO film is short-circuited with the cathode formed on the organic compound layer at the worst. As another method for preventing short-circuit, a method of forming an insulating film having a thickness of 1 to 5 nm may be adopted. As the insulating film, a film made of polyimide, polyimide amide, polyamide, acryl or the like can be used. If an opposed electrode (fourth electrode) 193 is formed out of alkali metal such as MgAg or LiF or alkaline-earth metal, the opposed electrode 193 can function as the cathode.

The opposed electrode 193 is formed out of a material containing magnesium (Mg), lithium (Li) or calcium (Ca) having a low work function. Preferably, the opposed electrode 193 containing MgAg (a material of mixture of Ag and Mg with a mixture ratio of Mg:Ag=10:1) is used. In addition to the MgAg electrode, an MgAgAl electrode, a LiAl electrode or a LiFAl electrode is available. An insulating film 194 consists of silicon nitride, oxide nitride aluminum, oxide aluminum indicated as AlNxOy, or a single layer, a laminated layer thereof selected from a DLC film is formed on the opposed electrode 193 with a thickness of 2 to 30 nm, preferably 5 to 10 nm. The DLC film can be formed by the plasma CVD method. Even at a temperature of not higher than 100° C., the DLC film can be formed to cover the end sections of the partition layer 190 with good covering property. The internal stress of the DLC film can be lessened by mixing argon in small quantities into the DLC film. The DLC film can be, therefore, used as a protection film. In addition, the DLC film has high gas barrier property against $CO$, $CO_2$, $H_2O$ and the like as well as oxygen, so that the DLC film is suited as the insulating film 194 which functions as a barrier film.

Note that, a source wiring and a drain wiring are formed simultaneously, and then a wiring to supply the drain current for the driving TFT to the pixel electrode and power-supply wiring are formed simultaneously. A thickness of the wiring becomes thicker, the step difference caused by the wirings is increased. When, the step difference is increased, the possibility, to which the wirings fabricated in the later step are disconnected and the element characteristic is deteriorated, is improved. Therefore, the thickness of wiring should be thinner than the thickness of wiring fabricated in the previous steps. Because the power supply wiring functions to supply the current in the light emitting elements, it is preferable to thicken the film thickness and to lower resistance. The power supply wiring is fabricated after the source wiring and drain wiring are formed in the light emitting device of this embodiment. Therefore, the film thickness of the power supply wiring can be made thicker, and resistance can be lowered.

The source wiring and the gate wiring are simultaneously formed under the third insulating film, and the pixel electrode is formed on the third insulating film in this specification. Therefore, it is possible that the source wiring and the pixel electrode are overlapped with each other without connecting the source wiring and the pixel electrode directly even if the insulating film in not newly formed. Accordingly, the light emitting area of the light emitting element can be further widened.

Although an example that the common voltage is applied to a switching TFT 202 and the first electrode and the second electrode of driving TFT 203 are connected to each other is shown in this embodiment, present invention in not limited to this structure. The first electrode and the second electrode of switching TFT 202 may be connected to each other, and the common voltage may also be applied to the first electrode of the driving TFT 203.

Moreover, although, the switching TFT has the double gate structure (structure which contains an active layer including two channel forming regions connected with the series) in the light emitting device of this embodiment, present invention is not limited to this structure. The switching TFT may take a single structure or a multi gate structure such as a triple gate structure (structure which contains an active layer including the two channel forming regions or more connected with the series). Moreover, instead of single gate structure, the driving TFT may take the multi gate structure such as the double gate structure and triple gate structure (structure which contains an active layer including the two channel forming regions or more connected with the series).

According to Embodiment 1, regions functioning as channels (channel formation regions) of plural thin film transistors in a pixel are arranged so as to have the same channel length direction and the channel length direction is matched to the scanning direction in laser light irradiation. Therefore the crystal growth direction coincides with the carrier moving direction and high field effect mobility can be obtained.

After air tightness is improved by a processing such as packaging, connectors (flexible print circuits: FPC's) are attached to connect terminals pulled out from the elements of circuits formed on the substrate to external signal terminals, whereby the semiconductor device is completed as a product.

Figure 18A:
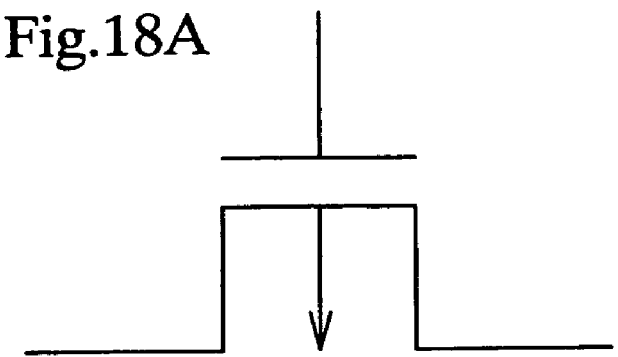
FIGS. 18A to 18C are equivalent circuit diagrams of a TFT of the present invention.
Figure 18B:
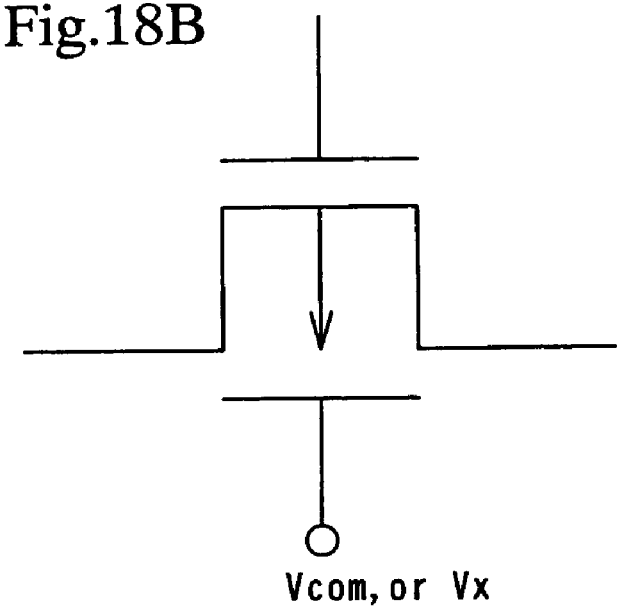
Figure 18C:
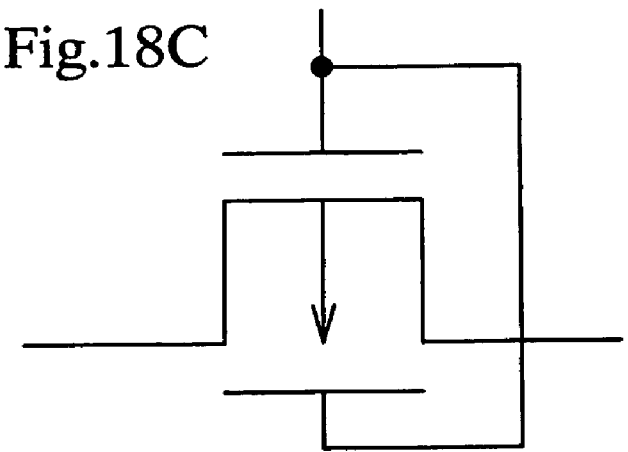

The circuit diagram of the TFTs is explained with FIG. 18. Here, only p-channel TFT is typically shown. As to n-channel TFT, the direction of an arrow becomes the reverse of p-channel TFT. FIG. 18A shows a general circuit diagram of TFTs which has only one electrode. On the other hand, FIG. 18B shows a circuit diagram of TFTs of Embodiment 1 in which there are two electrodes with a semiconductor film sandwiched therebetween, and, one of two electrodes is applied a constant voltage (a common voltage (Vcom) or an arbitrary voltage (Vx)). FIG. 18C shows another circuit diagram of TFTs of Embodiment 1 in which there are two electrodes with a semiconductor film sandwiched therebetween, and the two electrodes are electrically connected to each other.

In addition, Embodiment 1 can be freely combined with Embodiments Modes 1 to 6.

Embodiment 2

In this embodiment, the construction of a pixel of the light emitting device of the present invention different from that in the embodiment 1 will be explained.

Figure 15:
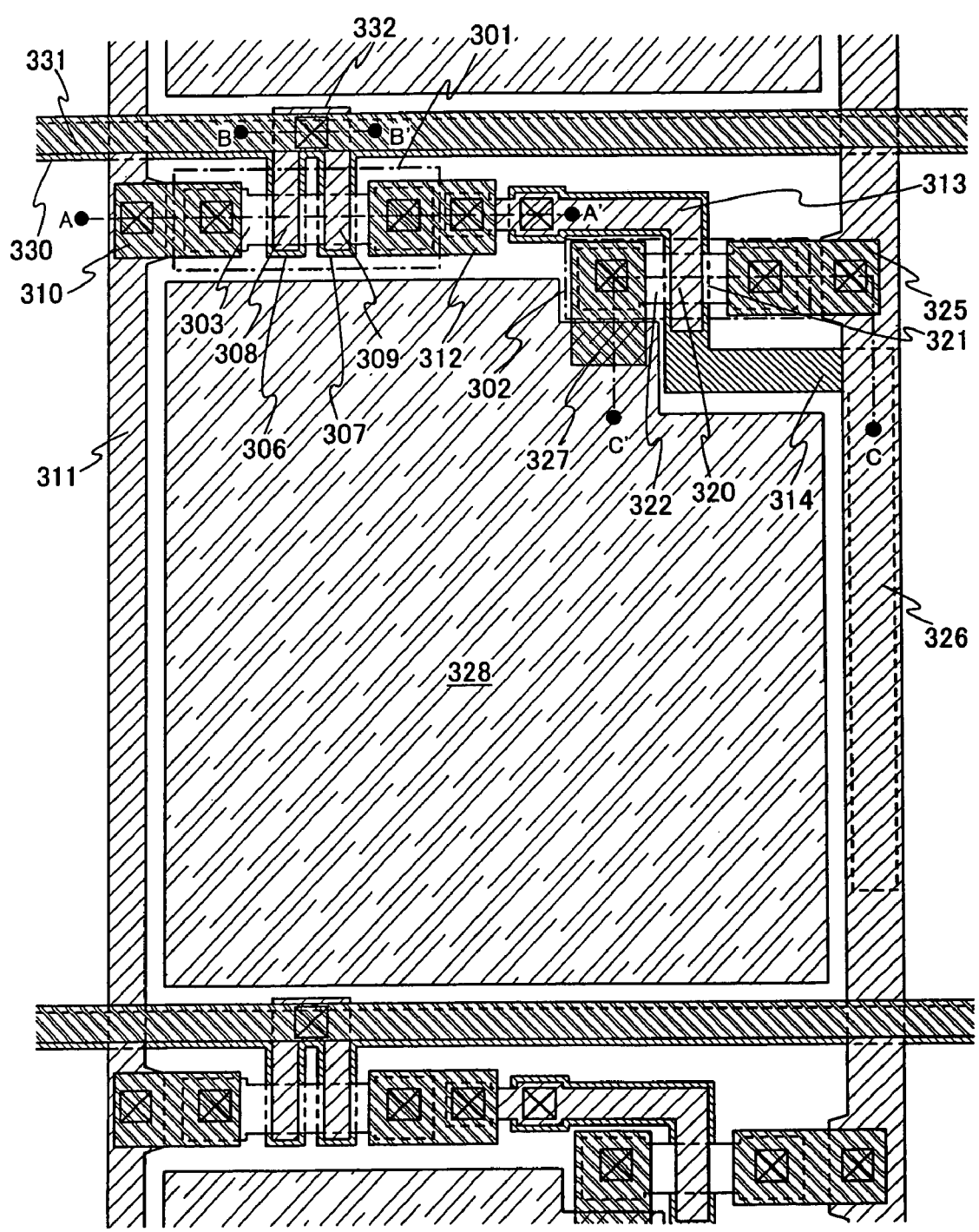
FIG. 15 is a top view of a pixel of a light emitting device (Embodiment 2)
Figure 16:
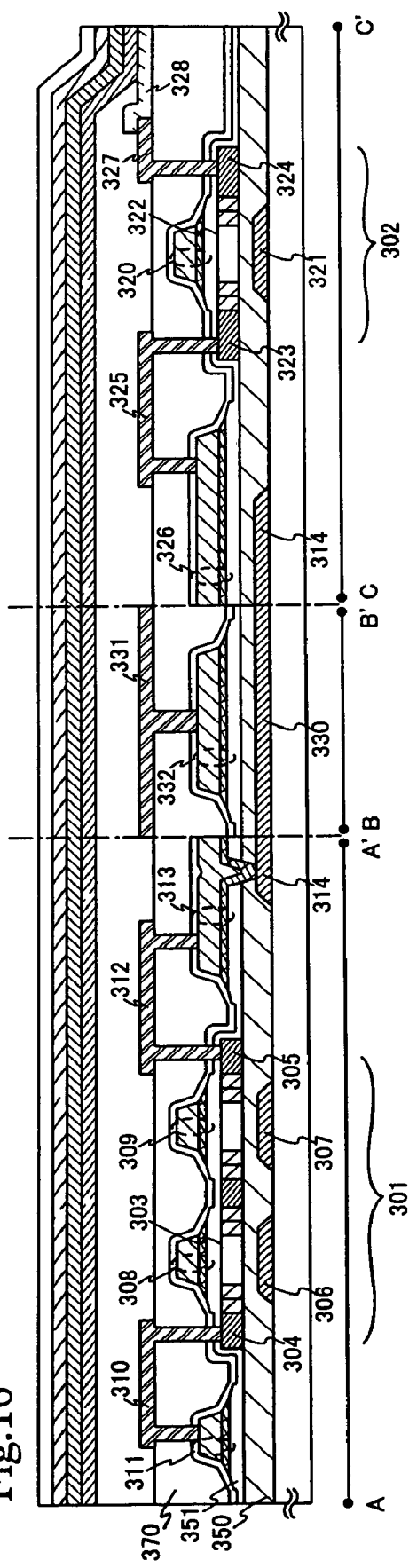
FIG. 16 is a sectional view of a pixel of a light emitting device (Embodiment 2)

FIG. 15 shows a top view of the pixel of the light emitting device of Embodiment 2. FIG. 16 shows a sectional view taken along line A–A', B–B' and C–C' of FIG. 15. A partition wall layer, an organic light emitting layer, a cathode and a protecting film manufactured in the process subsequent to the formation of a pixel electrode are omitted to clarify the construction of the pixel in FIG. 15.

Reference numeral 301 designates a TFT for switching, and an n-channel TFT is used in Embodiment 2. Reference numeral 302 designates a TFT for driving, and a p-channel TFT is used in Embodiment 2. The TFT for switching and the TFT for driving may be set to the n-channel TFT and the p-channel TFT.

The TFT 301 for switching has first electrodes 306 and 307, a first insulating film 350 abutting on the first electrodes 306 and 307, a semiconductor film 303 abutting on the first insulating film 350, a second insulating film 351 abutting on the semiconductor film 303, and second electrodes 308 and 309 abutting on the second insulating film 351.

One of source and drain areas 304 and 305 arranged in the semiconductor film 303 is connected to a source wiring 311 through a wiring 310, and the other is connected to a second wiring 313 through a wiring 312. The second wiring 313 is connected to a first wiring 314 through a contact hole.

The first electrodes 306 and 307 are overlapped with the second electrodes 308 and 309 through the first insulating film 350, the semiconductor film 303 and the second insulating film 351.

The TFT 302 for driving has a first electrode 321, a first insulating film 350 abutting on the first electrode 321, a semiconductor film 322 abutting on the first insulating film 350, a second insulating film 351 abutting on the semiconductor film 322, and a second electrode 320 abutting on the second insulating film 351.

The first electrode 321 is one portion of the first wiring 314, and the second electrode 320 is one portion of the second wiring 313.

One of source and drain areas 323 and 324 arranged in the semiconductor film 322 is connected to a power line 326 through a wiring 325, and the other is connected to a pixel electrode 328 through a wiring 327.

The first electrode 321 is overlapped with the second electrode 320 through the first insulating film 350, the semiconductor film 322 and the second insulating film 351.

A storage capacitor is formed in a portion in which the power line 326 and the first wiring 314 are overlapped with each other through the first insulating film 350 and the second insulating film 351.

Reference numeral 330 designates a common wiring, and a constant voltage is applied to the common wiring 330. A wiring 332 partially has the second electrodes 308, 309, and is connected to a gate wiring 331 through a contact hole formed in the first insulating film 350 and the second insulating film 351.

In Embodiment 2, a common voltage is applied to the first electrode in the TFT 301 for switching even in the TFTs within the same pixel. The dispersion of a threshold value and an off-electric current can be restrained by applying the common voltage to the first electrode in comparison with the case of one electrode.

Further, the TFT 302 for driving through which an electric current larger than that of the TFT for switching flows, electrically connects the first and second electrodes. A depletion layer is rapidly spread by applying the same voltage to the first and second electrodes as in a case in which the thickness of the semiconductor film is substantially thinned. Accordingly, a sub-threshold coefficient can be reduced and electric field effect mobility can be improved. Accordingly, the on-electric current can be increased in comparison with the case of one electrode. Further, the dispersion of the threshold value can be restrained in comparison with the case of one electrode. Accordingly, a driving voltage can be reduced by using the TFT of this structure in a driving circuit. Further, since the on-electric current can be increased, the size (particularly channel width) of the TFT can be reduced. Therefore, integration density can be improved.

The present invention is not limited to this construction. The first and second electrodes may be connected in the TFT for switching, and the common voltage may be also applied to the first electrode in the TFT for driving.

In the light emitting device of Embodiment 2, TFT for switching has a double gate structure (a structure including an active layer having two channel forming areas connected in series). However, Embodiment 2 is not limited to this construction. The TFT for switching may have a single gate structure, and may also have a multigate structure (a structure including an active layer having two or more channel forming areas connected in series) such as a triple gate structure, etc. Further, the TFT for driving may have a multigate structure (a structure including an active layer having two or more channel forming areas connected in series) such as a double gate structure, a triple gate structure, etc. instead of the single gate structure.

In Embodiment 2, the source wiring and the power line are simultaneously formed, and the gate wiring and a wiring for supplying the drain electric current of the TFT for driving to the pixel electrode are then simultaneously formed. Since the source wiring and the power line are formed below a third insulating film 370 and the pixel electrode is formed on the third insulating film, the source wiring, the power line and the pixel electrode can be overlapped without direct connection even when no insulating film is newly arranged. Accordingly, the light emitting area of a light emitting element can be further widened.

According to Embodiment 2, regions functioning as channels (channel formation regions) of plural thin film transistors in a pixel are arranged so as to have the same channel length direction and the channel length direction is matched to the scanning direction in laser light irradiation. Therefore the crystal growth direction coincides with the carrier moving direction and high field effect mobility can be obtained.

In addition, Embodiment 2 can be freely combined with Embodiment Modes 1 to 6.

Embodiment 3

In the Embodiment 3, a circuit structure of the semiconductor device corresponding to that of Embodiment 1 is described. Note that the TFT for switching in Embodiment 1 has a double gate structure, for the simplification, a single gate structure of TFT for switching is described here as a equivalent circuit.

Figure 17:
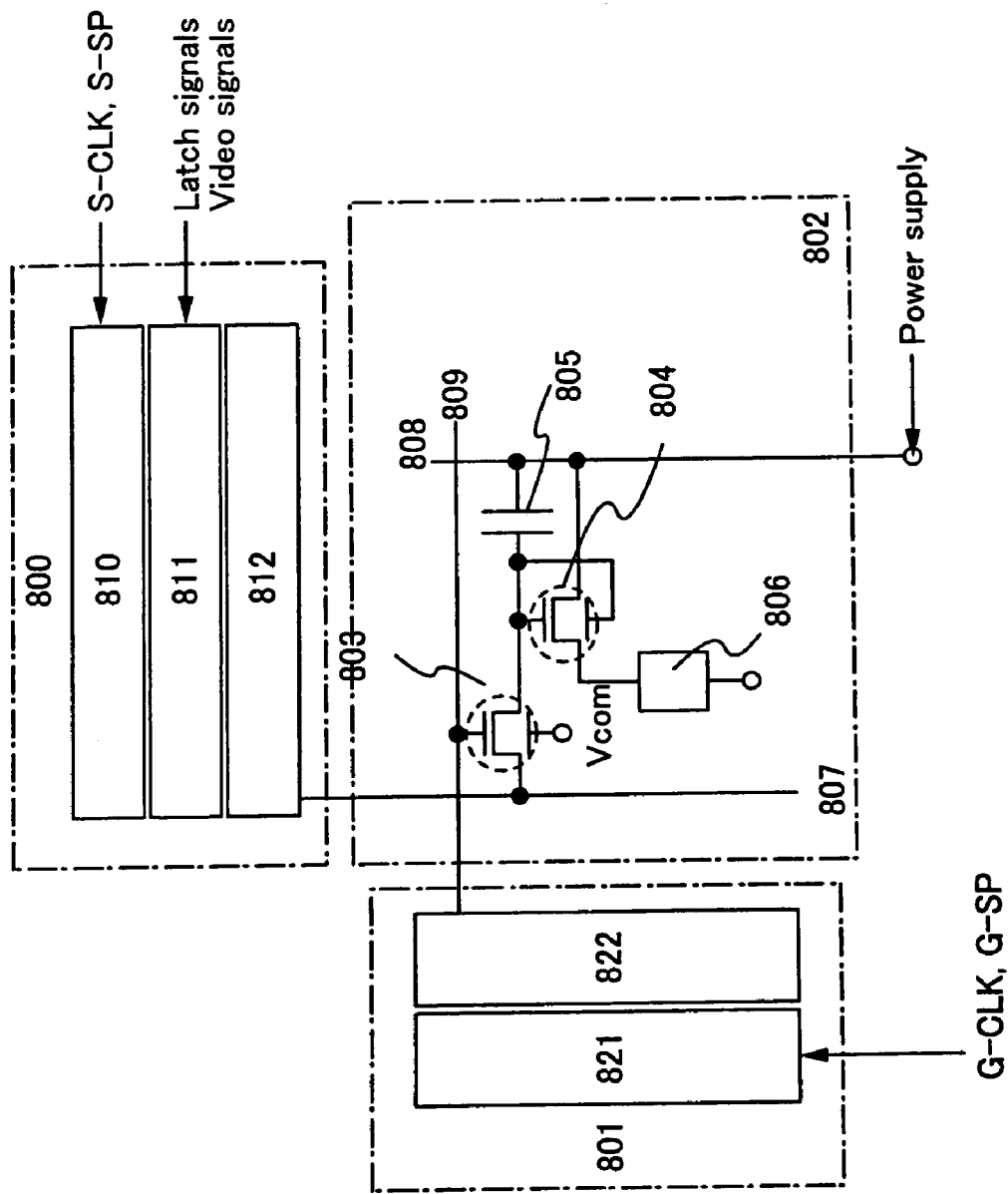
FIG. 17 is an equivalent circuit diagram of a light emitting device (Embodiment 3)

FIG. 17 shows a block diagram of a light emitting device according to the present invention. The structure of the light emitting device will be described with reference to FIG. 17 while taking the driver circuit of a light emitting device which displays images using digital video signals as an example. The light emitting device shown in FIG. 17 includes a data line driver circuit 800, a scanning line driver circuit 801 and a pixel portion 802.

In the pixel portion 802, a plurality of source wirings, a plurality of gate wirings and a plurality of power supply lines are formed. A region surrounded by the source wirings, the gate wirings and the power supply lines corresponds to pixels. In FIG. 17, only the pixel which has one source wiring 807, one gate wiring 809 and one power supply line 808 is typically shown among a plurality of pixels. Each pixel includes a switching TFT 803 which serves as a switching element, a driving TFT 804, a storage capacitor 805 and a light emitting element 806.

The gate electrode of the switching TFT 803 is connected to the gate wiring 809. The source and drain regions of the switching TFT 803 are connected to the source wiring 807 and the gate electrode of the driving TFT 804, respectively.

The source and drain regions of the driving TFT 804 are connected to the power supply line 808 and the light emitting element 806, respectively. The gate electrode of the driving TFT 804 and the power supply line 808 form the storage capacitor 805.

The data line driver circuit 800 includes a shift register 810, a first latch 811 and a second latch 812. A clock signal (S-CLK) and a start pulse signal (S-SP) for the data line driver circuit are applied to the shift register 810. Latch signals and video signals for determining latch timing are applied to the first latch 811.

When the clock signal (S-CLK) and the start pulse signal (S-SP) are inputted into the shift register 810, a sampling signal which determines video signal sampling timing is generated and inputted into the first latch 811.

Alternatively, the sampling signal from the shift register 810 may be buffered and amplified by a buffer or the like and then inputted into the first latch 811. Since many circuits or circuit elements are connected to the wiring into which the sampling signal is inputted, the wiring has a high load capacitance (parasitic capacitance). This buffer is effective to prevent the "delay" of the rise or fall of the timing signal caused by the high load capacitance.

The first latch 811 includes a plurality of stages of latches. The first latch 811 samples the inputted video signal simultaneously with the sampling signal inputted thereinto and the sampled video signal is sequentially stored in the respective stages of latches.

A period required until the video signal is written to all the stages of latches in the first latch 811 is referred to as line period. Actually, however, this line period to which a horizontal retrace line period is added, is often referred to as line period.

When one line period is finished, a latch signal is inputted into the second latch 812. During this time, the video signals written and held in the first latch 811 are all outputted to the second latch 812, and written to and held in all stages of latches in the second latch 812.

The first latch 811 which is completed with outputting the video signals to the second latch 812 sequentially writes another video signal based on the sampling signal from the shift register 810.

In the second line period, the video signals written to and held in the second latch 812 are inputted into the source wiring.

Meanwhile, the scanning line driver circuit 801 includes a shift register 821 and a buffer 822. A clock signal (G-CLK) and a start pulse signal (G-SP) for the scanning line driver circuit are applied to the shift register 821.

When the clock signal (G-CLK) and the start pulse signal (G-SP) are inputted into the shift register 821, a select signal which determines gate wiring select timing is generated in the shift register 821 and inputted into the buffer 822. The select signal inputted into the buffer 822 is buffered and amplified and then inputted into the gate wiring 809.

When the gate wiring 809 is selected, the switching TFT 803 having a gate electrode connected to the selected gate wiring 809 is turned on. The video signals inputted into the source wiring are inputted into the gate electrode of the driving TFT 804 through the switching TFT 803 which is turned on.

The switching of the driving TFT 804 is controlled based on information of 1 or 0 held by the video signals inputted into the gate electrode thereof. When the driving TFT 804 is turned on, the potential of the power supply line 808 is applied to the pixel electrode of the light emitting element 806 thereby the light emitting element 806 emits light. When the driving TFT 804 is turned off, the potential of the power supply line 808 is not applied to the pixel electrode of the light emitting element 806 and the light emitting element 806 does not emit light.

In the circuits of the data line driver circuit 800 and those of the scanning line driver circuit 801 provided in the light emitting device shown in FIG. 17, the first and second electrodes of each TFTs are electrically connected to each other. By applying the same voltage to the first and second electrodes, the formation of a depleted layer is accelerated substantially as in the case of making the semiconductor film of the TFT thin. It is, therefore, possible to lower the sub-threshold coefficient and also improve the field effect mobility of the TFT. Furthermore, compared with a TFT which includes only one electrode, the TFT which includes two electrodes can suppress threshold irregularity. Accordingly, compared with a TFT which includes only one electrode, the TFT can increase ON current. It is thereby possible to decrease driving voltage. In addition, since ON current can be increased, the TFT can be made small in size (the channel width thereof can be particularly made small). It is thereby possible to improve the integration density of the TFT.

Furthermore, in the pixel portion 802, a common voltage Vcom is applied to one of the first and second electrodes of the switching TFT 803 used as a switching element. In addition, replace of common voltage Vcom, a voltage Vx can be applied. By doing so, it is possible to suppress threshold irregularity and to suppress OFF current compared with the TFT which includes only one electrode.

On the driving TFT 804 for supplying a current to the light emitting element 806, the first electrode is electrically connected to the second electrode. As a result, it is possible to increase ON current compared with the TFT which includes only one electrode. The structure of the driving TFT is not limited to this structure. It is also possible that a common voltage is applied to either of the first and second electrodes without electrically connecting the first electrode to the second electrode. Alternatively, a thin film transistor of an ordinary structure in which only one electrode is provided, may be included in the driving TFT.

Embodiment 4

This embodiment describes an example of a pixel structure which is different from Embodiment 1. The description is given with reference to FIGS. 19A and 19B and FIG. 20. In the example of Embodiment 1, each pixel has two TFTs (a driving TFT and a switching TFT). This embodiment shows an example in which each pixel has three TFTs (a driving TFT, a switching TFT, and an erasing TFT).

Figure 19A:
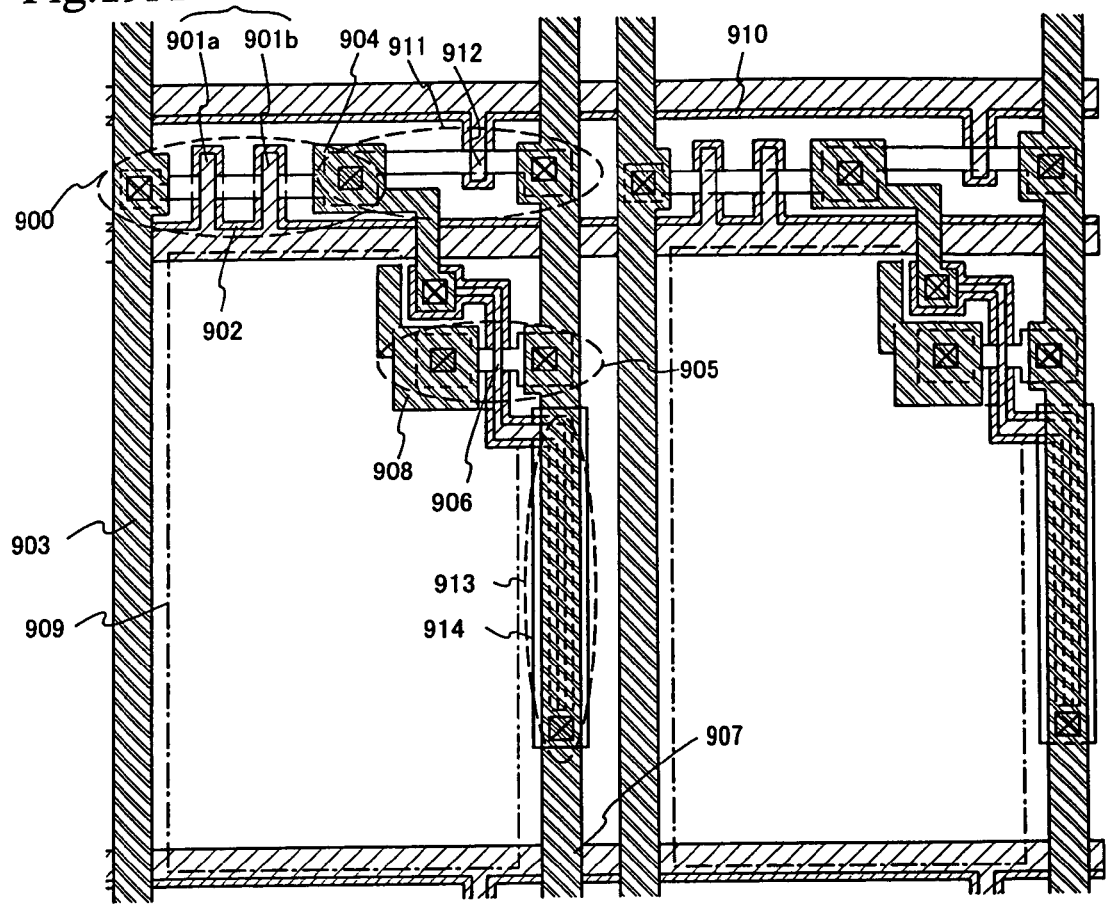
FIGS. 19A and 19B are top views of a pixel of a light emitting device (Embodiment 4)
Figure 19B:
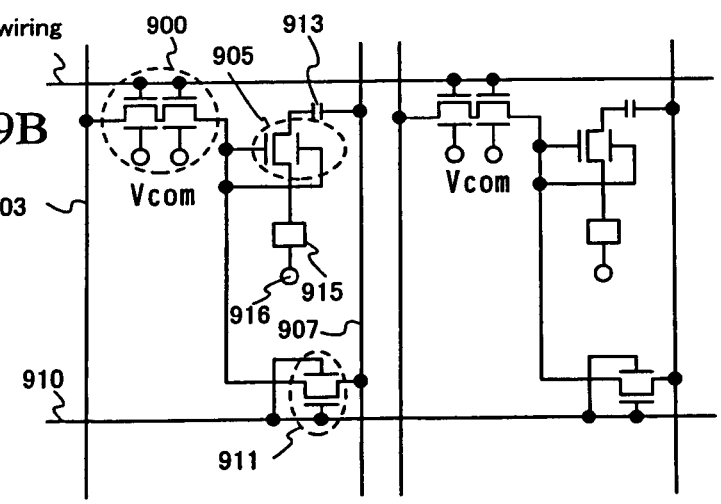

A detailed top structure of a pixel portion of a light emitting device in this embodiment is shown in FIG. 19A. A circuit diagram thereof is shown in FIG. 19B. FIGS. 19A and 19B use common reference symbols and can be cross-referred.

In FIGS. 19A and 19B, a switching TFT 900 provided on a substrate is formed from the switching (n-channel) TFT 202 of FIG. 10C. See the explanations about the switching (n-channel) TFT 202 for the structure and manufacture method of the switching TFT 900 (the explanations will not be repeated here). A wiring denoted by 902 is a first gate electrode arranged below a semiconductor layer and is connected to a common voltage (Vcom). Second gate electrodes 901 (901a and 901b) arranged above the semiconductor layer are gate wirings of the switching TFT 900.

In this embodiment, the TFT 900 has a double gate structure in which two channel formation regions are formed. However, the TFT may take a single gate structure which has one channel formation region or a triple gate structure which has three channel formation regions.

The switching TFT 900 has a source connected to a source wiring 903 and a drain connected to a drain wiring 904. The drain wiring 904 is electrically connected to a second gate electrode 906 of a driving TFT 905. A first gate electrode of the driving TFT 905 is arranged below a semiconductor layer and connected to the second gate electrode 906.

The driving TFT 905 is formed from the driving (p-channel) TFT 203 of FIG. 10C. See the explanations about the driving (p-channel) TFT 203 for the structure and manufacture method of the driving TFT 905 (the explanations will not be repeated here). In this embodiment, although the TFT 905 has a single gate structure, a double gate structure or a triple gate structure may be taken.

The driving TFT 905 has a source electrically connected to a current supplying line 907 and has a drain electrically connected to a drain wiring 908. The drain wiring 908 is electrically connected to a anode 909 that is indicated by the dotted line.

A wiring denoted by 910 (first gate electrode) is a gate wiring electrically connected to a second gate electrode 912 of an erasing TFT 911. Though a connection portion is not shown in the drawing, the first gate electrode 910 arranged below a semiconductor layer is connected to the second gate electrode 912. The erasing TFT 911 has a source electrically connected to the current supplying line 907 and a drain electrically connected to the drain wiring 904.

The erasing TFT 911 is formed from the switching (n-channel) TFT 202 of FIG. 10C. For the structure of the TFT 911, see the explanation about the switching (n-channel) TFT 202.

Although the TFT 911 in this embodiment has a single gate structure, a double gate structure or a triple gate structure may be taken.

A storage capacitor (condenser) is formed in a region denoted by 913. The condenser 913 is formed from a semiconductor film 914 electrically connected to the current supplying line 907, an insulating film (not shown in the drawing) which is the same layer as a gate insulating film, and the second gate electrode 906. A capacitance composed of the gate electrode 906, a layer (not shown in the drawing) which is the same layer as a first interlayer insulating film, and the current supplying line 907 may also be used as a storage capacitor.

A light emitting element 915 shown in the circuit diagram of FIG. 19B is composed of the anode 909, an organic compound layer (not shown in the drawing) formed on the anode 909, and a cathode (not shown in the drawing) formed on the organic compound layer. In the present invention, the anode 909 is connected to the source region or drain region of the driving TFT 905.

The cathode of the light emitting element 915 is given an opposite electric potential. The current supplying line 907 is given a power supply electric potential. The difference between the opposite electric potential and the power supply electric potential is kept at a level high enough to allow the light emitting element to emit light when the power supply electric potential is given to the anode. The power supply electric potential and the opposite electric potential are provided from a power supply, such as an external IC, attached to the light emitting device of the present invention.

In this specification, a power supply for providing an opposite electric potential is particularly called an opposite power supply 916.

Figure 20:
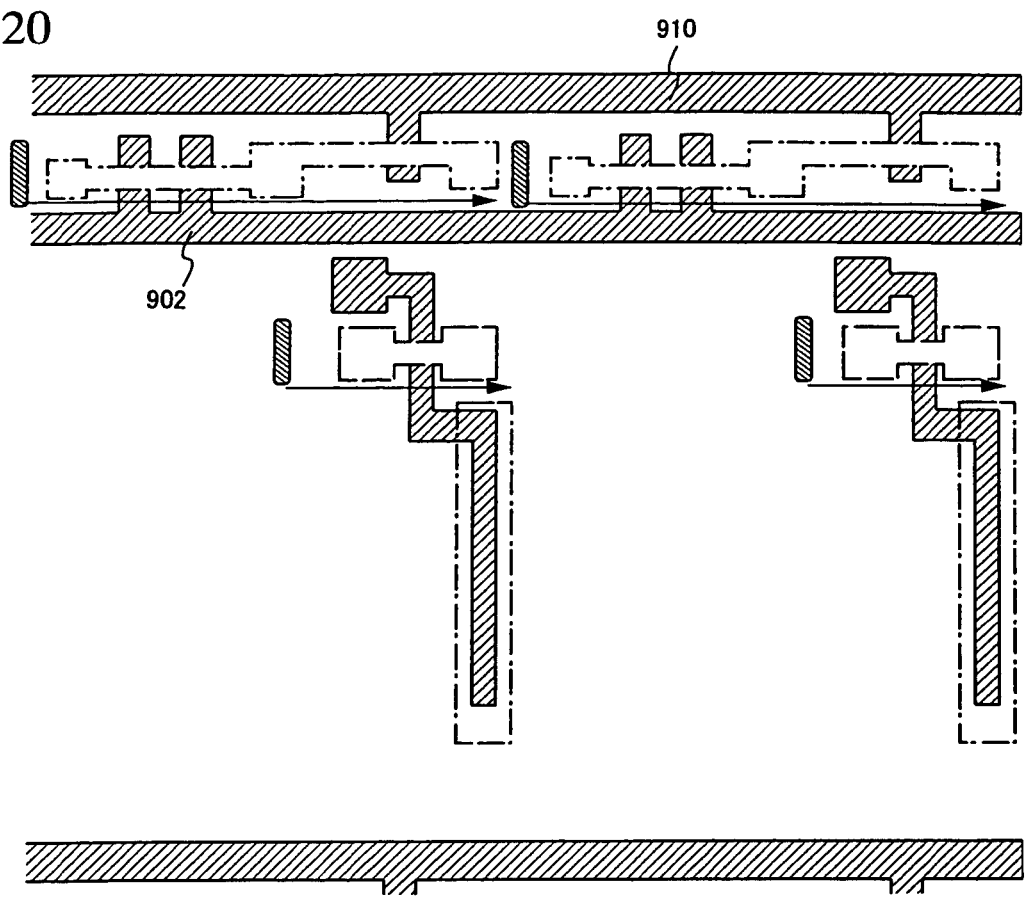
FIG. 20 is a top view as well as a circuit diagram illustrating the arrangement of a semiconductor layer and the scanning direction of laser light (Embodiment 4)

FIG. 20 shows arrangement of the semiconductor layers of the pixel of FIGS. 19A and 19B, a laser beam for irradiating the pixel with laser light, and the laser beam scanning direction (indicated by the arrow in the drawing). The crystal growth direction and the carrier moving direction thus can be matched to each other and high field effect mobility can be obtained.

Although this embodiment shows an example of applying the present invention to a pixel that has three TFTs, the present invention is also applicable to a pixel that has four or more TFTs.

This embodiment may be combined freely with any one of Embodiment Modes 1 through 6.

Embodiment 5

In this embodiment, in the present invention, a characteristic of a TFT in the case where a first electrode and a second electrode are electrically connected to each other will be described.

Figure 21A:
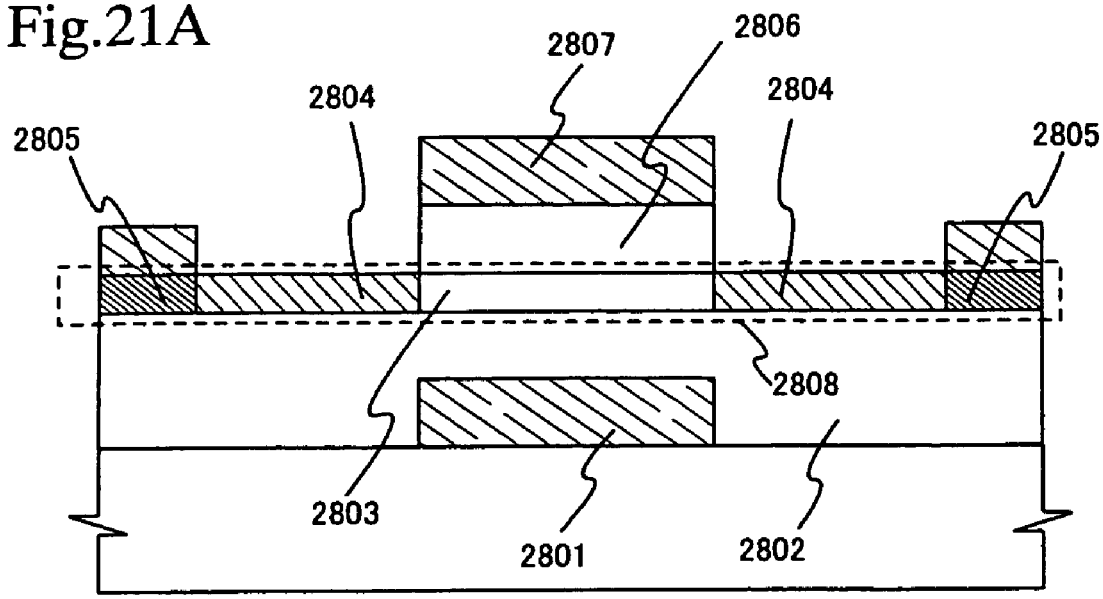
FIGS. 21A and 21B are diagrams showing structures of TFTs used in simulation (Embodiment 5)
Figure 21B:
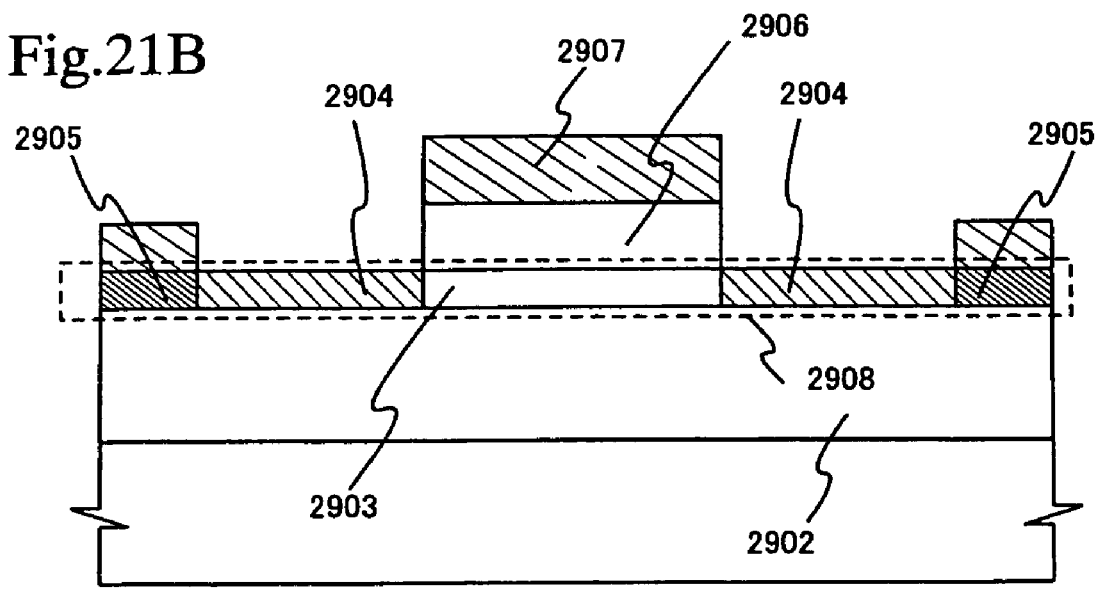
Figure 22:
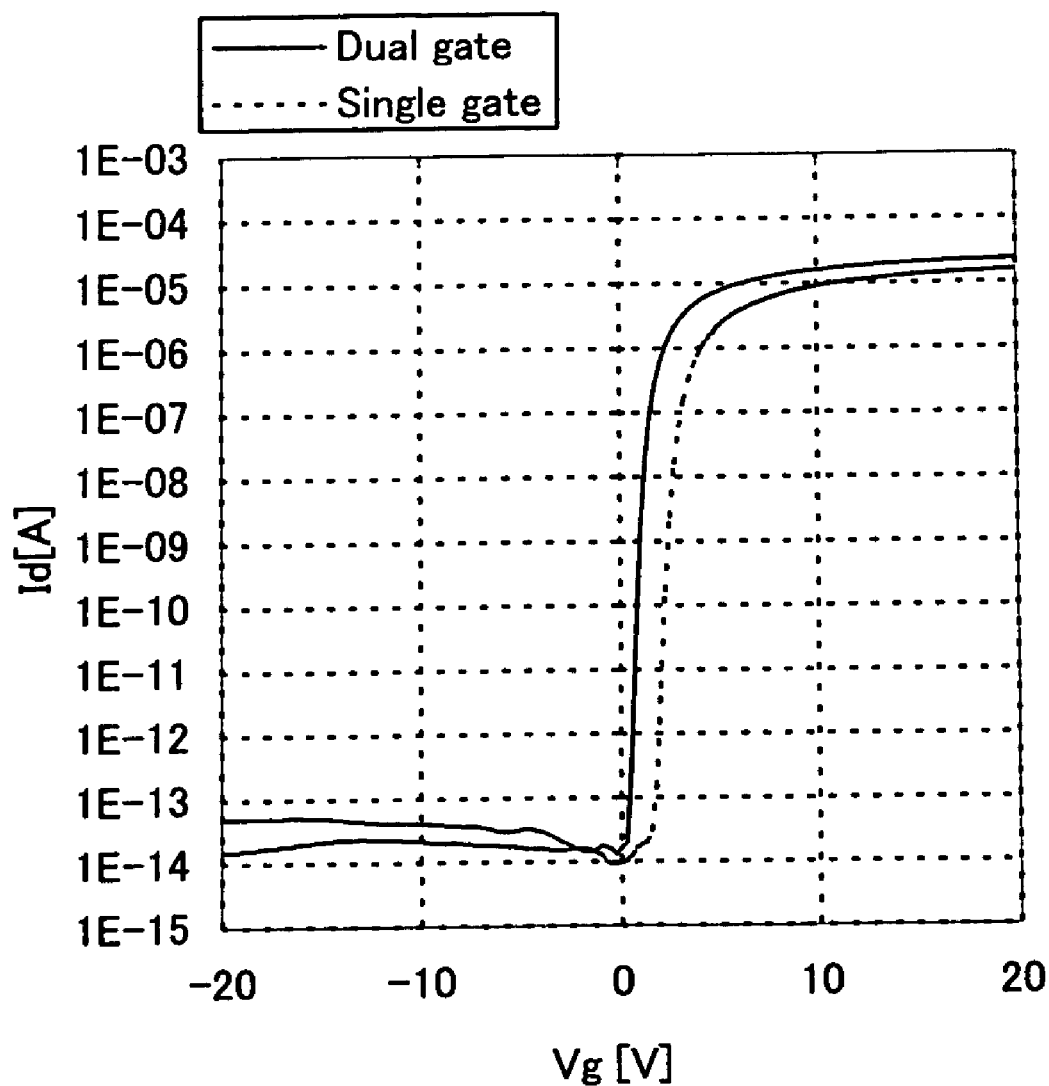
FIG. 22 is a graph showing a TFT characteristic obtained by the simulation (Embodiment 5)

FIG. 21A is a cross sectional view of a TFT according to the present invention, in which the first electrode and the second electrode are electrically connected with each other. Also, for comparison, FIG. 21B is a cross sectional view of a TFT having only a single electrode. FIG. 22 shows a relationship between a gate voltage and a drain current in the respective TFTs shown in FIGS. 21A and 22B, which is obtained by simulation.

The TFT shown in FIG. 21A includes a first electrode 2801, a first insulating film 2802 which is in contact with the first electrode 2801, a semiconductor film 2808 which is in contact with the first insulating film 2802, a second insulating film 2806 which is in contact with the semiconductor film 2808, and a second electrode 2807 which is in contact with the second insulating film 2806. The semiconductor film 2808 has a channel-forming region 2803, first impurity regions 2804 which are in contact with the channel-forming region 2803, and second impurity regions 2805 which are in contact with the first impurity regions 2804.

The first electrode 2801 and the second electrode 2807 are overlapped with each other so as to sandwich the channel-forming region 2803 therebetween. The same voltage is applied to the first electrode 2801 and the second electrode 2807.

The first insulating film 2802 and the second insulating film 2806 are made of silicon oxide. Also, the first electrode and the second electrode are made of Al. The channel length is 7 μm. The channel width is 4 μm. The thickness of the first insulating film in a region in which the first (gate) electrode is overlapped with the channel-forming region is 110 μm. The thickness of the second insulating film in a region in which the second (gate) electrode is overlapped with the channel-forming region is 110 μm. The thickness of the channel-forming region is 50 nm. The length of the first impurity region in a channel length direction is 1.5 μm.

The channel-forming region 2803 is doped with an impurity for providing a p-type at $1\times10^{17}/cm^3$. The first impurity regions are doped with an impurity for providing an n-type at $3\times10^{17}/cm^3$. The second impurity regions are doped with an impurity for providing an n-type at $5\times10^{19}/cm^3$.

The TFT shown in FIG. 21B includes a first insulating film 2902, a semiconductor film 2908 which is in contact with the first insulating film 2902, a second insulating film 2906 which is in contact with the semiconductor film 2908, and a second electrode 2907 which is in contact with the second insulating film 2906. The semiconductor film 2908 has a channel-forming region 2903, first impurity regions 2904 which are in contact with the channel-forming region 2903, and second impurity regions 2905 which are in contact with the first impurity regions 2904.

The second electrode 2907 is overlapped with the channel-forming region 2903.

The first insulating film 2902 and the second insulating film 2906 are made of silicon oxide. Also, the second electrode is made of Al. The channel length is 7 µm. The channel width is 4 µm. The thickness of the second insulating film in a region in which the second (gate) electrode is overlapped with the channel-forming region is 110 µm. The thickness of the channel-forming region is 50 nm. The length of the first impurity region in a channel length direction is 1.5 µm.

The channel-forming region 2903 is doped with an impurity for providing a p-type at $1\times10^{17}/cm^3$. The first impurity regions are doped with an impurity for providing an n-type at $3\times10^{17}/cm^3$. The second impurity regions are doped with an impurity for providing an n-type at $5\times10^{19}/cm^3$.

In FIG. 22, the abscissa indicates a gate voltage and the ordinate indicates a drain current. A value of the drain current with respect to the gate voltage in the TFT shown in FIG. 21A indicates a solid line and a value of the drain current with respect to the gate voltage in the TFT shown in FIG. 21B indicates a broken line.

From FIG. 22, the mobility of 139 $cm^2/Vs$ and the S value of 0.118 V/dec is obtained in the TFT shown in FIG. 21A. Also, the mobility of 86.3 $cm^2/Vs$ and the S value of 0.160 V/dec is obtained in the TFT shown in FIG. 21B. Thus, when the first electrode and the second electrode are provided and electrically connected with each other, the mobility becomes larger and the S value becomes small as compared with the case where only the single electrode is provided.

Embodiment 6

In the example shown in Embodiment 1, a semiconductor film which has a crystal structure is formed by the method of Embodiment Mode 1 using the laser processing apparatus of FIG. 5. This embodiment shows an example of the second laser light irradiation treatment for reducing the unevenness (also called as ridges) on the surface of the semiconductor film which is formed by the laser light used in crystallization and for further improving the levelness.

The first laser light irradiation is performed to a semiconductor film in an atmosphere containing oxygen to crystallize the semiconductor film. Then, an oxide film formed by the first laser light irradiation is removed, and second laser light irradiation is carried out in an atmosphere that contains less or no oxygen (at a higher energy density than that of the first laser light irradiation). In this way, the levelness of the semiconductor film is improved. The second laser light irradiation is conducted in an inert atmosphere (e.g., nitrogen or argon) or in vacuum.

Specifically, the laser light irradiation treatment shown in Embodiment 1 (treatment using the apparatus of FIG. 5) is carried out in an atmosphere containing oxygen to form a semiconductor film which has a crystal structure and then an oxide film on its surface is removed to conduct the second laser irradiation treatment (treatment using the apparatus of FIG. 5) in a nitrogen atmosphere for leveling the surface of the semiconductor film. In the second laser irradiation treatment also, it is desirable to set the laser light scanning direction to the channel length direction.

An example of the second laser light include gas laser such as an excimer laser, an Ar laser, or a Kr laser, solid-state laser such as a YAG laser, a $YVO_4$ laser, a YLF laser, a $YAlO_3$ laser, a glass laser, a ruby laser, an alexandrite laser, and a Ti:sapphire laser, or semiconductor laser. The solid-state laser employed is one that uses a crystal such as YAG, $YVO_4$, YLF, or $YAlO_3$ doped with Cr, Nd, Er, Ho, Ce, Co, Ti, or Tm. The mode of laser oscillation may be continuous wave type or pulse oscillation type. The shape of the laser beam may be linear, rectangular, circular, or elliptical. The wavelength used is suitably chosen from fundamental wave, second harmonic, and third harmonic. The laser beam may run longitudinally, laterally, or obliquely, or may run to and fro.

In the example shown in this embodiment, the first laser light and the second laser light are obtained from the laser irradiation treatment apparatus of FIG. 5. However there is no particular limitation, and the first laser light may be light outputted from the laser irradiation treatment apparatus of FIG. 5 whereas the second laser light is one outputted from excimer laser irradiation treatment apparatus. Alternatively, the first laser light may be light outputted from excimer laser irradiation treatment apparatus whereas the second laser light is one outputted from the laser irradiation treatment apparatus of FIG. 5.

This embodiment structured as above is not particularly limited and may employ other means for leveling a semiconductor film in addition to leveling the semiconductor film by the second laser light. For example, an etchant, etching using a reaction gas (typically dry etching), heat treatment at high temperature (900 to 1200° C.) in a reduction atmosphere (typically hydrogen), treatment for polishing chemically and mechanically (typically CMP), and the like can be used to level the semiconductor film.

According to the technique shown in this embodiment for leveling a semiconductor film by irradiating laser light more than once, the semiconductor film is leveled further and an insulating film formed later to serve as a gate insulating film can be made thin. Therefore the mobility of the TFT can be improved. With the improved levelness of the semiconductor film, the TFT formed from the semiconductor film is reduced in OFF current.

This embodiment may be combined freely with any one of Embodiment Modes 1 through 6 and Embodiments 1 through 5.

Embodiment 7

EL modules formed by performing the present invention can complete various electronic devices in which the EL modules are used for example, in display portion. In other words, all the electronic device in which EL modules are mounted can be completed thereby. Further, CPUs and the like can be manufactured simultaneously with the display portion on one substrate by performing the present invention, further more, miniaturization of devices and reduction of manufacturing cost can also be realized.

Following can be given as such electronic devices: video cameras; digital cameras; head mounted displays (goggle type displays); car navigation systems; car stereos; personal computers; portable information terminals (mobile computers, mobile phones or electronic books etc.) etc. Examples of these are shown in FIGS. 23 and 24.

Figure 23A:
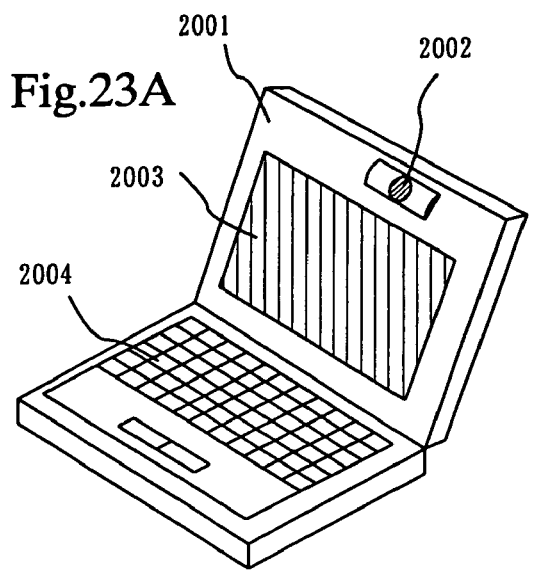
FIGS. 23A to 23F are diagrams showing examples of electronic equipment.

FIG. 23A is a personal computer which comprises: a main body 2001; an image input section 2002; a display section 2003; and a keyboard 2004 etc. Further, CPUs which constitute computer can be formed on an insulting substrate, and can be manufactured with the display section 2003 on the same insulting substrate where the display section 2003 is formed.

Figure 23B:
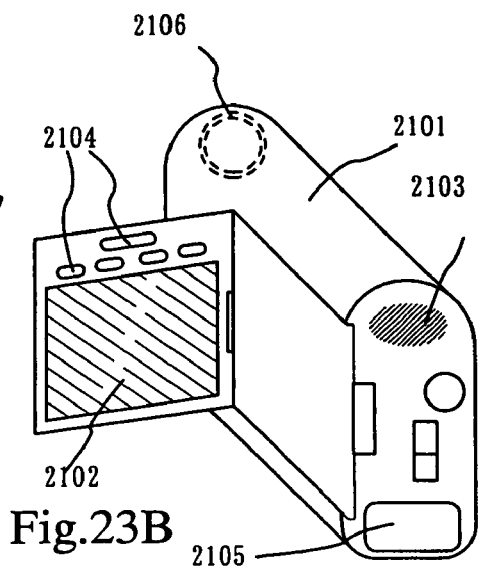

FIG. 23B is a video camera which comprises: a main body 2101; a display section 2102; a voice input section 2103; operation switches 2104; a battery 2105 and an image receiving section 2106 etc.

Figure 23C:
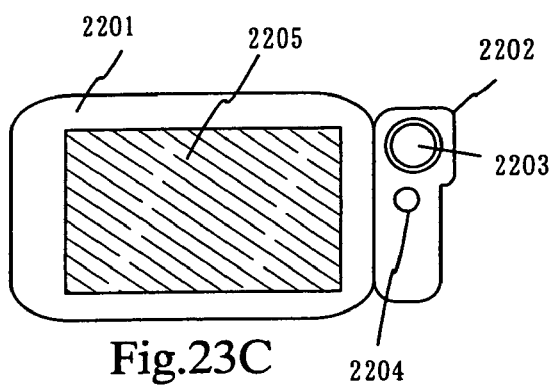

FIG. 23C is a mobile computer which comprises: a main body 2201; a camera section 2202; an image receiving section 2203; operation switches 2204 and a display section 2205 etc. Further, CPUs which constitute computer can be formed on an insulting substrate, and can be manufactured with the display section 2205 on the same insulting substrate where the display section 2205 is formed.

Figure 23D:
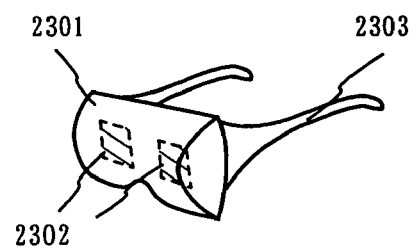

FIG. 23D is a goggle type display which comprises: a main body 2301; a display section 2302; and an arm section 2303 etc.

Figure 23E:
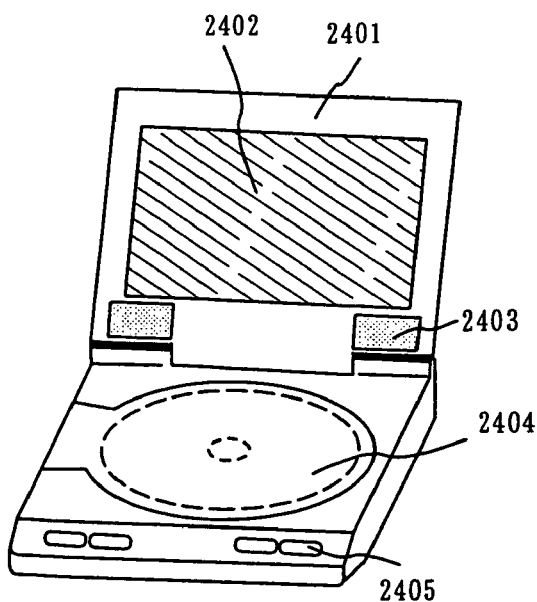

FIG. 23E is a player using a recording medium in which a program is recorded (hereinafter referred to as a recording medium) which comprises: a main body 2401; a display section 2402; a speaker section 2403; a recording medium 2404; and operation switches 2405 etc. This device uses DVD (digital versatile disc), CD, etc. for the recording medium, and can perform music appreciation, film appreciation, games and use for Internet.

Figure 23F:
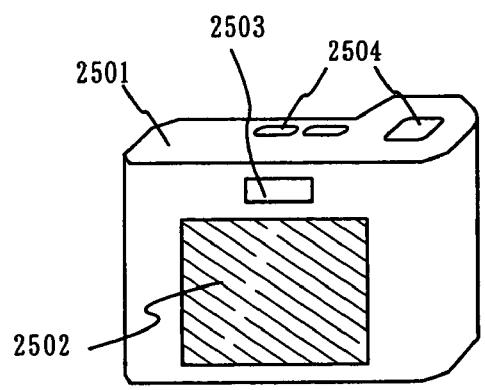

FIG. 23F is a digital camera which comprises: a main body 2501; a display section 2502; a view finder 2503; operation switches 2504; and an image receiving section (not shown in the figure) etc.

Figure 24A:
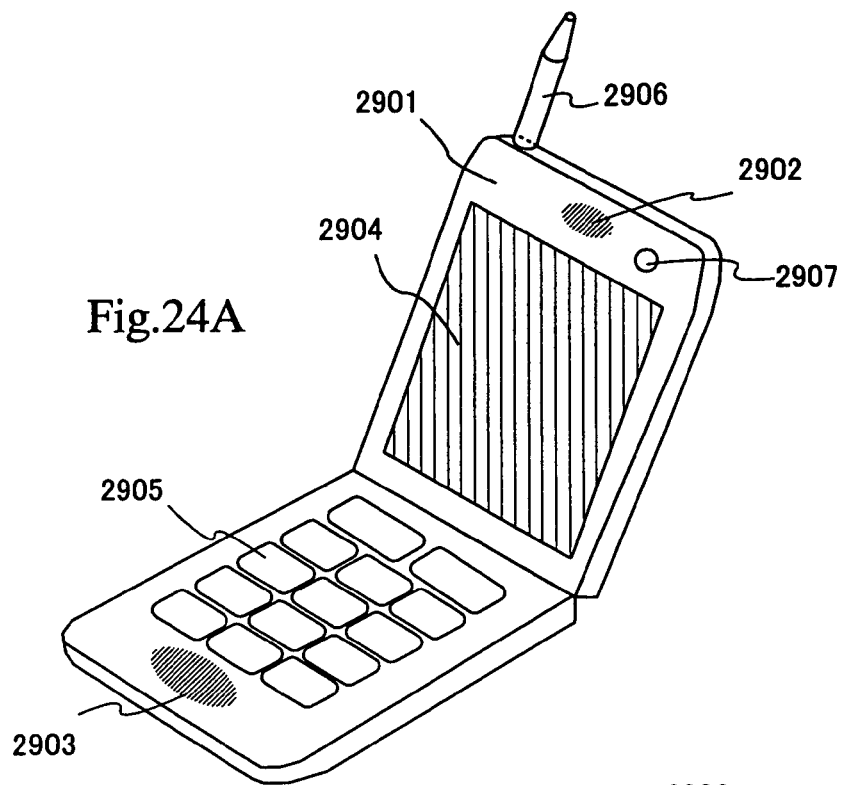
FIGS. 24A to 24C are diagrams showing examples of electronic equipment.

FIG. 24A is a mobile phone which comprises: a main body 2901; a voice output section 2902; a voice input section 2903; a display section 2904; operation switches 2905; an antenna 2906; and an image input section (CCD, image sensor, etc.) 2907 etc. Further, CPUs which constitute computer can be formed on an insulting substrate, and can be manufactured with the display section 2904 on the same insulting substrate where the display section 2904 is formed. Thereby the mobile phone with CPUs included in completing.

Figure 24B:
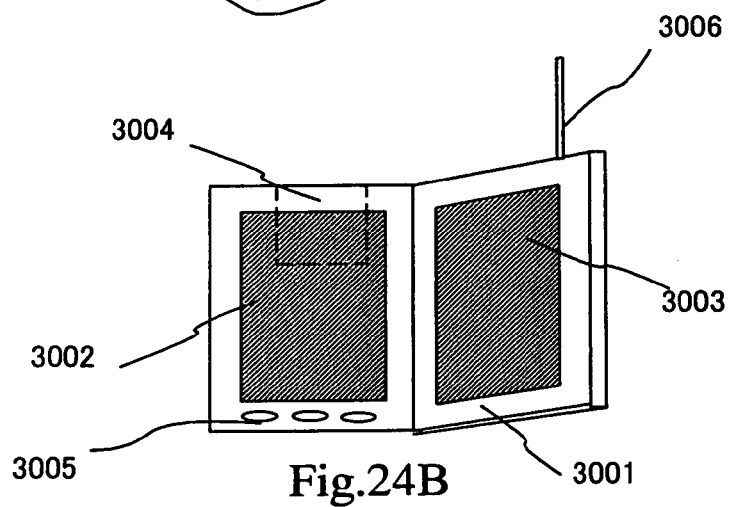

FIG. 24B is a portable book (electronic book) which comprises: a main body 3001; display sections 3002 and 3003; a recording medium 3004; operation switches 3005 and an antenna 3006 etc.

Figure 24C:
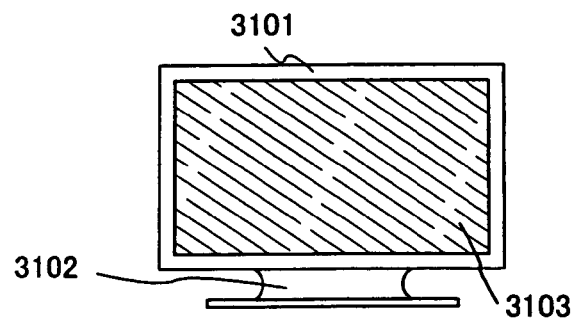

FIG. 24C is a display which comprises: a main body 3101; a supporting section 3102; and a display section 3103 etc.

In addition, the display shown in FIG. 24C has small and medium-sized or large-sized screen, for example sizes of 5 to 20 inches. Further, to manufacture the display section with such sizes, it is preferable to mass-produce by gang printing by using a substrate with one meter on a side.

As described above, the applicable range of the present invention is extremely large, and the invention can be applied to electronic devices in various fields. Note that the electronic apparatuses in Embodiment 7 can be achieved by utilizing any one of combinations with Embodiment Modes 1 to 6, Embodiments 1 to 6.

Embodiment 8

In Embodiment 8, an example of using an electrophoresis display device as a display portion illustrated in Embodiment 7. Typically, the electrophoresis display device is applied to a display portion 3002 or a display portion 3003 of a portable book (electronic book) shown in FIG. 24B.

The electrophoresis display device is also referred to as an electronic paper, and has advantages of readability that is the same as paper, a low power consumption in comparison with other display devices, and shape of thin and light.

The electrophoresis display device can takes various forms, and a plurality of micro capsules containing a first particle with plus electric charge and a second particle with minus electric charge are dispersed in the solvent or solute. The particles in the micro capsule are moved to opposite directions each other by applying electric field to the micro capsules, and the color of particles gathered to one side are displayed. Note that each of the first particle and the second particle contains a dye. The particles do not move without electric field. Further, the color of the first particle is different from that of the second particle (including colorless).

Thus, the electrophoresis display device uses so-called dielectric migration effect that a material with a high dielectric constant moves to high electric field region. The electrophoresis display device does not require a reflection plate and a counter substrate that are necessary for a liquid crystal display device so that the thickness and weight are halved.

The above dispersed micro capsules in solvent is referred to as an electronic ink. The electronic ink can be printed on a surface of glass, plastic, cloth and paper. Further, by using a color filter or a particle with a pigment, a color display also is possible.

An active matrix type display device can be completed by providing appropriately the above-mentioned plural micro capsules between two electrodes over the active matrix substrate. If an electric field is applied to the micro capsules, the device can display images.

For example, by applying the present invention, an active matrix substrate on which thin film transistors connected to one of electrodes in a pixel are arranged so as to have the same channel length direction, can be used. Further, the channel length direction is matched to the scanning direction in laser light irradiation and the crystal growth direction coincides with the carrier moving direction and high field effect mobility can be obtained.

The first particle and the second particle in the micro capsule can be formed by one of the following materials or a compound material selected from the following materials; conductive materials, insulating materials, semiconductor materials, magnetism materials, liquid crystal materials, ferroelectric materials, electro luminescent materials, electrochromic materials, and magnetic electrophoresis materials.

This embodiment can be freely combined with Embodiment Mode 1, Embodiment 1, or Embodiment 7.

Embodiment 9

Figure 28:
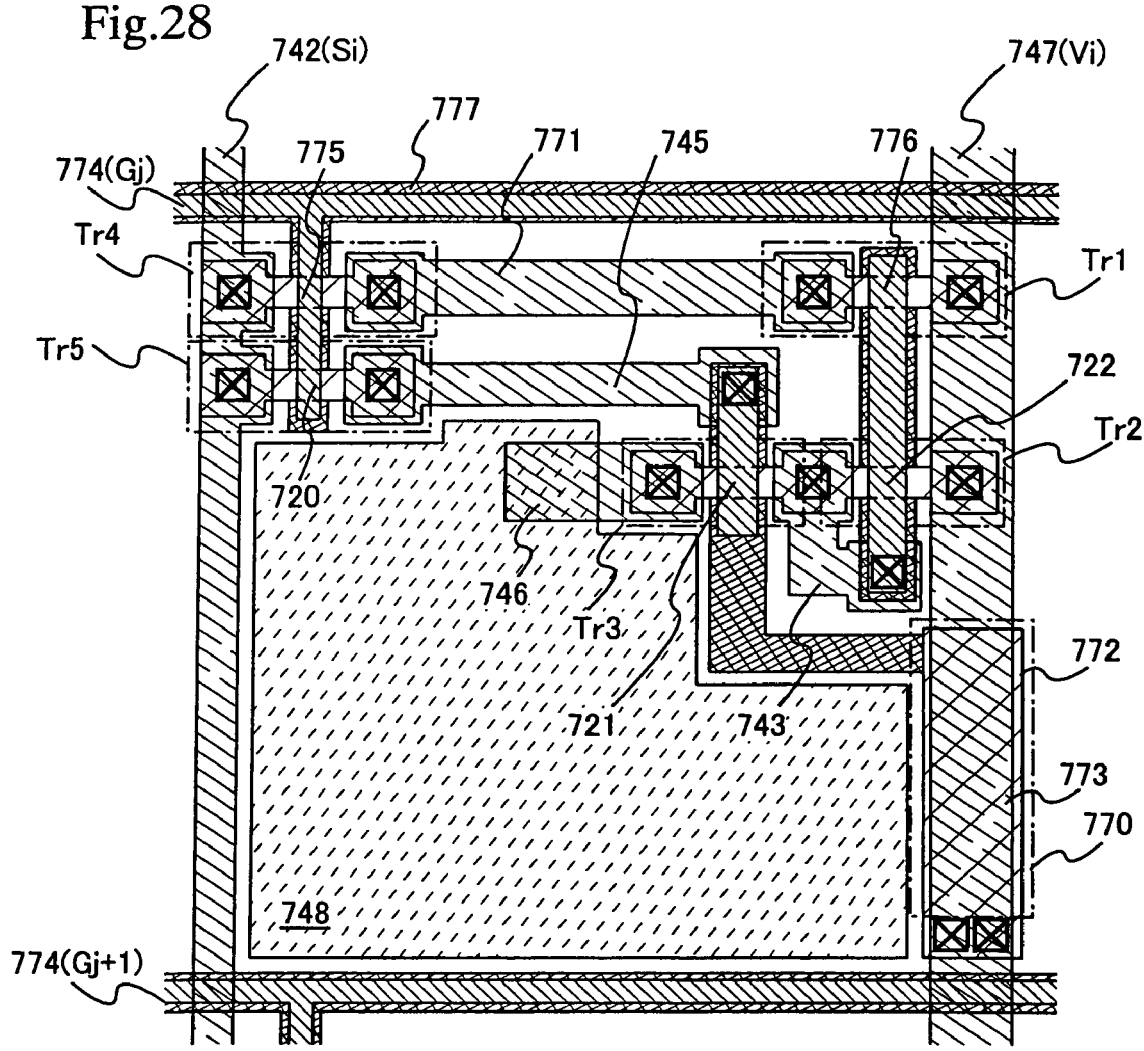
FIG. 28 is a top view of a pixel of a light emitting device (Embodiment 9)
Figure 29:
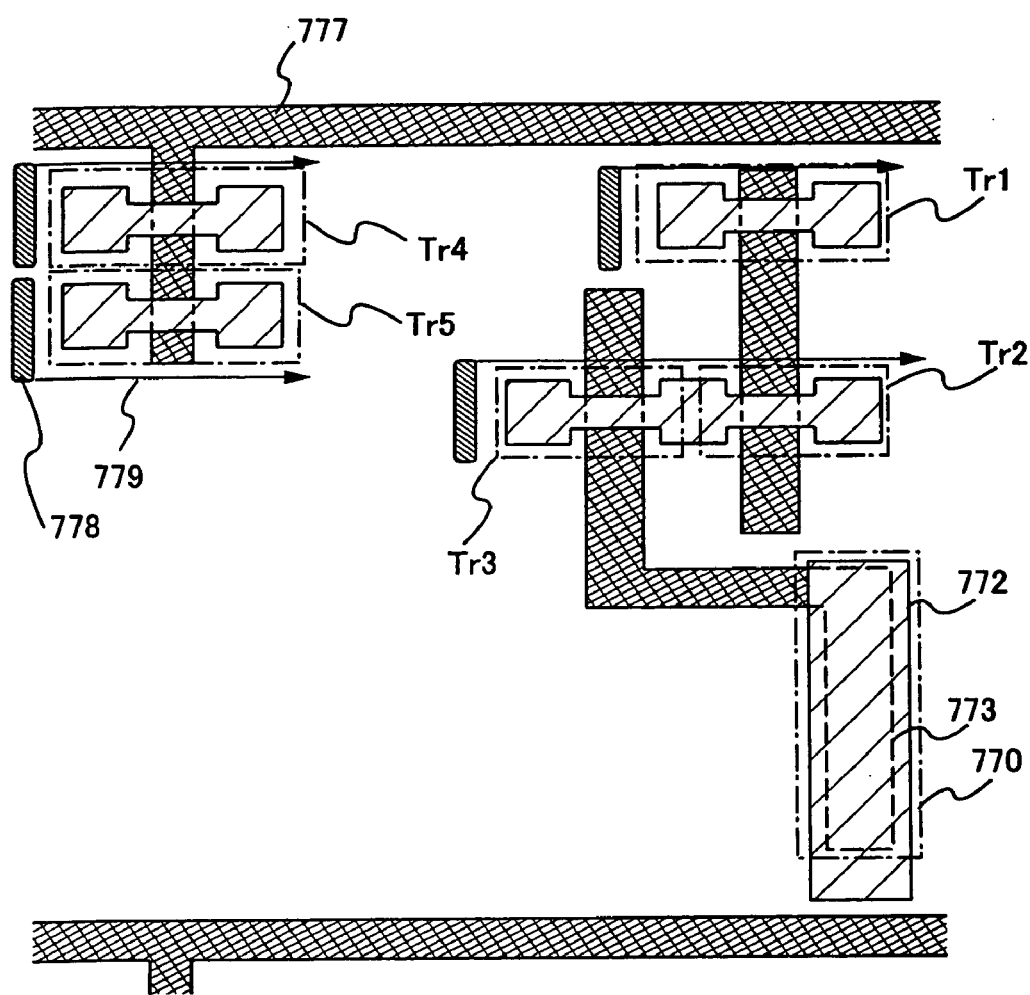
FIG. 29 is a top view illustrating the arrangement of a semiconductor layer and the scanning direction of laser light (Embodiment 9)

With reference to FIGS. 28 and 29, a description will be given on an example of pixel top view corresponding to the circuit diagram (FIG. 26) shown in Embodiment Mode 5.

One pixel has at least a transistor Tr1 (first driving transistor or first transistor), a transistor Tr2 (second driving transistor or second transistor), a transistor Tr3 (third driving transistor or third transistor), a transistor Tr4 (first switching transistor or fourth transistor), a transistor Tr5 (second switching transistor or fifth transistor), an OLED, and a storage capacitor. These TFTs (Tr1, Tr2, Tr3, Tr4, and Tr5) are obtained by following Embodiment Mode 1 or Embodiment 1.

As shown in FIG. 26 that is an equivalent circuit diagram of FIG. 28, in each of the transistors Tr1 to Tr5, wirings (including 777) for forming channels (dual channels) over and under a semiconductor film are directly connected to gate electrodes. In other words, two gate electrodes sandwich the semiconductor film. In this way, fluctuation in threshold can be reduced and the OFF current can be lowered compared to the case in which only one electrode is provided.

The transistor Tr4 has a gate electrode 775 that is a part of a scanning line 774. The gate electrode 775 is connected to a gate electrode 720 of the transistor Tr5. Of impurity regions in a semiconductor layer of the transistor Tr4, one is connected to a connection wiring 742 that functions as a signal line Si and the other is connected to a connection wiring 771. Similarly, of impurity regions in a semiconductor layer of the transistor Tr5, one is connected to a connection wiring 742 that functions as a signal line Si and the other is connected to a connection wiring 775.

The transistor Tr1 has a gate electrode 776, which is connected to a gate electrode 722 of the transistor Tr2. Of impurity regions in a semiconductor layer of the transistor Tr1, one is connected to the connection wiring 771 and the other is connected to a connection wiring 747 that functions as a power supply line Vi.

The connection wiring 743 is connected to an impurity region common to the transistor Tr2 and the transistor Tr3, and is connected to the gate electrode 722 of the transistor Tr2.

Denoted by 770 is a storage capacitor, which has a semiconductor layer 772, a gate insulating film 706, and a capacitance wiring 773. The semiconductor layer 772 has an impurity region connected to a connection wiring 747 that serves as a power supply line.

The pixel electrode 748 is in contact with and overlaps a connection wiring 746. This brings an electric connection between the pixel electrode and a drain region of the transistor Tr3.

FIG. 29 shows semiconductor layers, which are to serve as active layers of the transistors, immediately after the semiconductor layers are formed. The semiconductor layers of the transistors are arranged in one direction. The semiconductor layers are arranged in one direction and the channel length direction coincides with the laser light scanning direction. In this way, the crystal growth direction matches the carrier moving direction and high field effect mobility is obtained. FIG. 29 also shows a laser beam 778 and a laser scanning direction 779.

This embodiment may be combined freely with any one of Embodiment Modes 1 through 6 and Embodiments 1 through 8.

Embodiment 10

This embodiment describes the structures of driving circuits (a signal line driving circuit and a scanning line driving circuit) in a light emitting device of the present invention which is driven by an analog method.

Figure 30A:
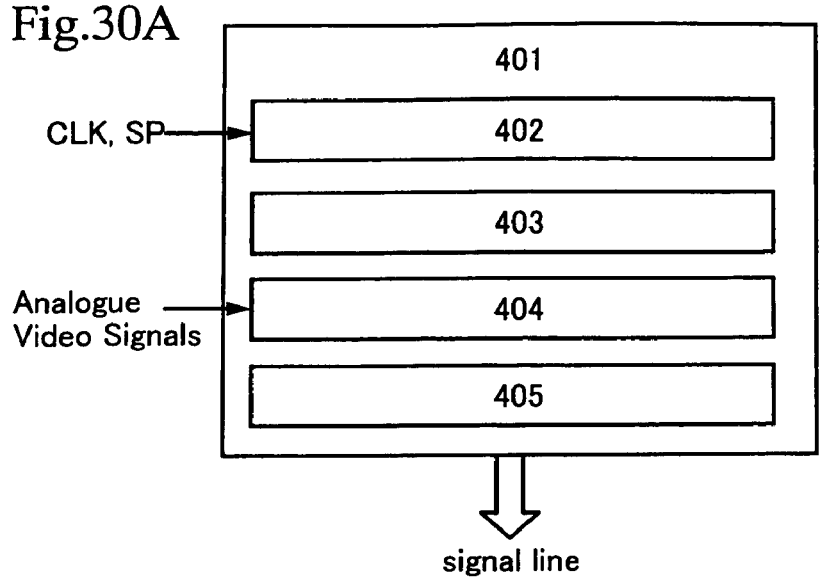
FIGS. 30A and 30B are detailed diagrams of a signal line driving circuit in an analog driving method (Embodiment 10)

FIG. 30A is a block diagram of a signal line driving circuit 401 of this embodiment. Denoted by 402 is a shift register, 403, a buffer, 404, a sampling circuit, and 405, a current converter circuit. In this embodiment also, wirings for forming channels above and below a semiconductor film (dual channels) are directly connected to gate electrodes and Vx=V$_Y$ is satisfied. The switches (SW) and inverters (Inb) shown in FIG. 27B are used. Although SW and Inb of FIG. 27B are used in the example shown here, some or all of wirings may be set to a common voltage (Vcom) or ground voltage.

Clock signals (CLK) and start pulse signals (SP) are inputted to the shift register 402. Upon receiving clock signals (CLK) and start pulse signals (SP), the shift register 402 generates timing signals.

The timing signals generated are amplified, or buffered and amplified, in the buffer 403 and then inputted to the sampling circuit 404. The buffer 403 too may have wirings for forming channels (dual channels) over and under a semiconductor film. Regions functioning as channels (channel formation regions) of a plurality of thin film transistors in the buffer 403 may be arranged so as to have the same channel length direction. If the scanning direction in laser light irradiation is set in this channel length direction, the crystal growth direction is matched to the carrier moving direction and high field effect mobility can be obtained. Timing signals may be amplified by a level shifter instead of a buffer. Alternatively, the circuit may have a buffer and a level shifter both.

Figure 30B:
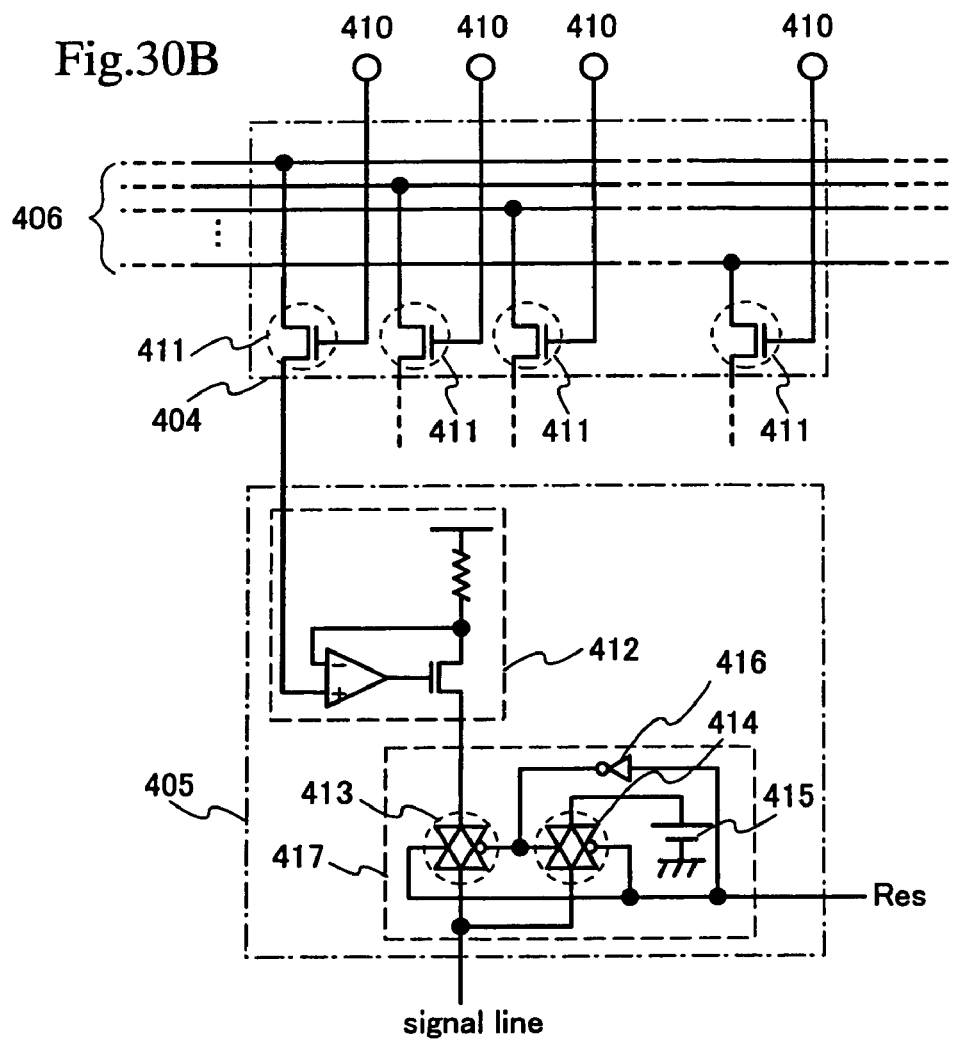

FIG. 30B shows specific structures of the sampling circuit 404 and current converter circuit 405. The sampling circuit 404 has a terminal 410 connected to the buffer 403.

The sampling circuit 404 has a plurality of switches 411. Analog video signals are inputted to the sampling circuit 404 from video signal lines 406. The switches 411 sample the analog video signals in sync with timing signals and input them to the downstream current converter circuit 405. The only current converter circuit 405 shown in FIG. 30B is one that is connected to one of the switches 411 of the sampling circuit 404. However, the current converter circuit 405 of FIG. 30B is connected downstream to each of the switches 411.

The switches 411 in this embodiment each have one transistor. However, the switches 411 are not limited to the structure of this embodiment as long as analog video signals are sampled in sync with timing signals.

The analog video signals sampled are inputted to a current output circuit 412 of the current converter circuit 405. The current output circuit 412 outputs a current (signal current) in an amount suited to the voltage of a video signal inputted. The current output circuit in FIGS. 30A and 30B is composed of an amplifier and a transistor. However, the present invention is not limited thereto and any circuit can be employed for the circuit 412 as long as it can output a current in an amount suited to the voltage of a signal inputted.

The signal current is inputted to a reset circuit 417 of the current converter circuit 405. The reset circuit 417 has two analog switches 413 and 414, an inverter 416, and a power supply 415.

A reset signal (Res) is inputted to the analog switch 414. A reset signal (Res) inverted by the inverter 416 is inputted to the analog switch 413. The analog switches 413 and 414 operate in sync with an inverted reset signal and a reset signal, respectively. Therefore, when one of 413 and 414 is ON, the other is OFF.

When the analog switch 413 is ON, the signal current is inputted to its designated signal line. On the other hand, when the analog switch 414 is ON, the voltage of the power supply 415 is given to a signal line to reset the signal line. Desirably, the voltage of the power supply 415 is almost the same level as the voltage of the power supply line provided in the pixel, and closer the amount of current flowing in a signal line while resetting the signal line to 0, the better.

A signal line is desirably reset during a retrace period. However, it is possible to reset a signal line in periods other than the retrace period, if required, except a period during which an image is displayed.

A circuit capable of selecting a signal line, such as a decoder circuit, may be employed instead of the shift register.

Next, the structure of the scanning line driving circuit will be described.

The scanning line driving circuit has a shift register and a buffer. It may have a level shifter in some cases.

Timing signals are generated in the scanning line driving circuit when clock signals CLK and start pulse signals SP are inputted to its shift register. The timing signals generated are buffered and amplified in the buffer and then supplied to a designated scanning line.

Gates of transistors of one line of pixels are connected to each scanning line. Since transistors of one line of pixels have to be turned ON at once, the buffer used should be capable of allowing a large amount of current to flow.

A circuit capable of selecting a scanning line, such as a decoder circuit, may be employed instead of the shift register.

Voltages of scanning lines may be controlled by a plurality of scanning line driving circuits associated with the respective scanning lines. Alternatively, voltages of several or all scanning lines may be controlled by one scanning line driving circuit.

The signal line driving circuit and scanning line driving circuit for driving a light emitting device of the present invention are not limited to the structures shown in this embodiment. The structure of this embodiment may be combined freely with the structures shown in Embodiment Modes 1 through 6 and Embodiment 8 or 9.

Embodiment 11

This embodiment describes the structures of current input type pixels different from the one in Embodiment Mode 5. The description will be given with reference to FIGS. 31A and 31B.

Figure 31A:
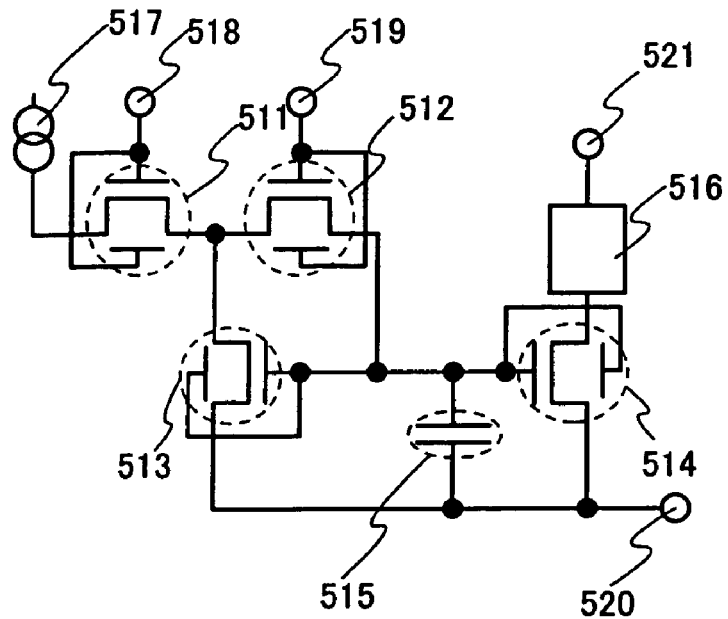
FIGS. 31A and 31B are equivalent circuit diagrams of pixels (Embodiment 11)

A pixel shown in FIG. 31A has TFTs 511, 512, 513, and 514, a storage capacitor 515, and a light emitting element 516. In each of the TFTs 511, 512, 513, and 514, a first gate electrode and a second gate electrode form channels (dual channels) over and under a semiconductor film. The TFTs 511, 512, 513, and 514 can be obtained by following Embodiment Mode 5 or Embodiment 1. As shown in Embodiment Mode 5, regions functioning as channels of the TFTs 511, 512, 513, and 514 are arranged so as to have the same channel length direction. Then the channel length direction is matched to the scanning direction in laser light irradiation to make the crystal growth direction coincide with the carrier moving direction and obtain high field effect mobility.

A gate of the TFT 511 is connected to a terminal 518. The TFT 511 has a source and a drain one of which is connected to a current source 517 and the other of which is connected to a drain of the TFT 513. A gate of the TFT 512 is connected to a terminal 519. The TFT 512 has a source and a drain one of which is connected to the drain of the TFT 513 and the other of which is connected to a gate of the TFT 513. The gate of the TFT 513 is connected to a gate of the TFT 514. Sources of the TFTs 513 and 514 are both connected to a terminal 520. A drain of the TFT 514 is connected to an anode of the light emitting element 516. A cathode of the light emitting element 516 is connected to a terminal 521. The storage capacitor 515 is provided to hold the gate-source voltage of the TFTs 513 and 514. Given voltages are applied to the terminals 520 and 521 by power supplies and the voltage of the terminal 520 is different from the voltage of the terminal 521.

The TFTs 511 and 512 are turned ON when voltages are applied to the terminals 518 and 519. Then the drain current of the TFT 513 is controlled by the current source 517. Here, the gate of the TFT 513 is connected to its drain. Therefore the TFT 513 operates in a saturation range and the drain current of the TFT 513 is expressed by $I=\mu C_o W/L(V_{GS}-V_{TH})^2/2$, wherein $V_{GS}$ represents the gate voltage, $\mu$ represents the mobility, $C_o$ represents the gate capacitance per unit area, W/L represents the ratio of a channel width W of the channel formation region to a channel length L, $V_{TH}$ represents the threshold, and I represents the drain current.

In the above expression, $\mu$, $C_o$, W/L, and $V_{TH}$ are all fixed values unique to each transistor. It is understood from the above expression that the drain current of the TFT 513 is changed by the gate voltage $V_{GS}$. Therefore, according to the above expression, the gate voltage $V_{GS}$ in a level suited to the drain current is generated in the TFT 513.

At this point, the gate voltage of the TFT 514 is kept at the same level as the gate voltage of the TFT 513 since the TFTs 513 and 514 are connected to each other through their gates and sources.

Therefore the drain current of the TFT 513 is in proportion to the drain current of the TFT 514. When $\mu$, $C_o$, W/L, and $V_{TH}$ of the TFT 513 are identical with those of the TFT 514, the TFTs 513 and 514 have the same drain current. The drain current flowing in the TFT 514 is supplied to the light emitting element 516, which emits light at a luminance suited to the amount of the drain current.

The light emitting element 516 continues to emit light after the TFTs 511 and 512 are turned OFF by voltages given to the terminals 518 and 519 as long as the gate voltage of the TFT 514 is held by the storage capacitor 515.

As has been described, the pixel shown in FIG. 31A has a measure to convert a current supplied to the pixel into a voltage to hold the voltage and a measure to cause a current to flow into a light emitting element in an amount suited to the level of the voltage held. The pixel has a converter unit that is the measure to convert a current supplied to the pixel into a voltage to hold the voltage, a driving unit that is the measure to cause a current to flow into a light emitting element in an amount suited to the level of the voltage held, and a light emitting element. A current supplied to the pixel is converted into a voltage by the converter unit, and the voltage is given to the driving unit. The driving unit supplies a current to the light emitting element in an amount suited to the voltage given.

Specifically, in FIG. 31A, the TFT 512, the TFT 513, and the storage capacitor 515 correspond to the measure to convert a supplied current into a voltage to hold the voltage. The TFT 514 corresponds to the measure to cause a current to flow into a light emitting element in an amount suited to the level of the voltage held.

Figure 31B:
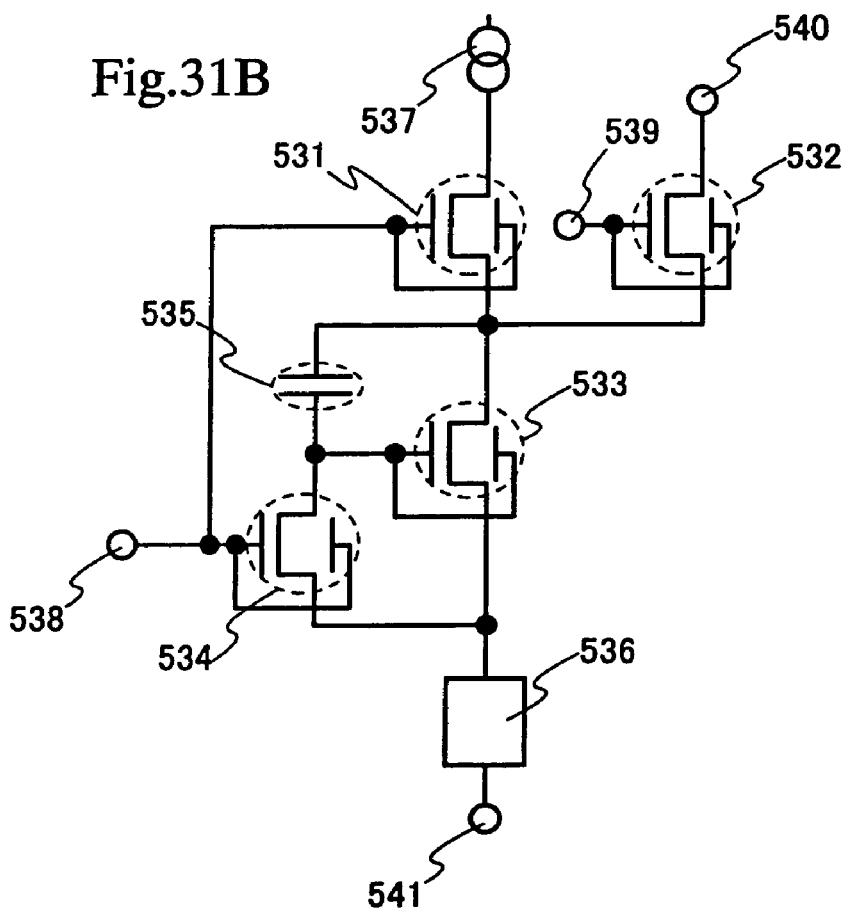

Another pixel structure is shown in FIG. 31B.

A pixel shown in FIG. 31B has TFTs 531, 532, 533, and 534, a storage capacitor 535, and a light emitting element 536. In each of the TFTs 531, 532, 533, and 534, a first gate electrode and a second gate electrode form channels (dual channels) over and under a semiconductor film. The TFTs 531, 532, 533, and 534 can be obtained by following Embodiment Mode 1 or Embodiment 1. As shown in Embodiment Mode 1, regions functioning as channels of the TFTs 531, 532, 533, and 534 are arranged so as to have the same channel length direction. Then the channel length direction is matched to the scanning direction in laser light irradiation to make the crystal growth direction coincide with the carrier moving direction and obtain high field effect mobility.

A gate of the TFT 531 is connected to a terminal 538. The TFT 531 has a source and a drain one of which is connected to a current source 537 and the other of which is connected to a source of the TFT 533. A gate of the TFT 534 is connected to the terminal 538. The TFT 534 has a source and a drain one of which is connected to a gate of the TFT 533 and the other of which is connected to a drain of the TFT 533. A gate of the TFT 532 is connected to a terminal 539. The TFT 532 has a source and a drain one of which is connected to a terminal 540 and the other of which is connected to the source of the TFT 533. A drain of the TFT 534 is connected to an anode of the light emitting element 536. A cathode of the light emitting element 536 is connected to a terminal 541. The storage capacitor 535 is provided to hold the gate-source voltage of the TFT 533. Given voltages are applied to the terminals 540 and 541 by power supplies and the voltage of the terminal 540 is different from the voltage of the terminal 541.

The TFT's 531 and 534 are turned ON when a voltage is applied to the terminal 538 and the TFT 532 is turned OFF when a voltage is given to the terminal 539. Then the drain current of the TFT 533 is controlled by the current source 537. Here, the gate of the TFT 533 is connected to its drain. Therefore the TFT 533 operates in a saturation range and the drain current of the TFT 533 is expressed by the above expression. It is understood from the above expression that the drain current of the TFT 533 is changed by the gate voltage $V_{GS}$. Therefore, according to the above expression, the gate voltage $V_{GS}$ in a level suited to the drain current is generated in the TFT 533.

The drain current flowing in the TFT 533 is supplied to the light emitting element 536, which emits light at a luminance suited to the amount of the drain current.

After the TFTs 531 and 534 are turned OFF by a voltage given to the terminal 538, the TFT 532 is turned ON by a voltage given to the terminal 539. At this point, the light emitting element 536 continues to emit light at the same luminance as when the TFTs 531 and 534 are ON as long as the gate voltage of the TFT 533 is held by the storage capacitor 535.

As has been described, the pixel shown in FIG. 31B has a measure to convert a current supplied to the pixel into a voltage, to hold the voltage, and to cause a current to flow into a light emitting element in an amount suited to the level of the voltage held. In short, the pixel shown in FIG. 31B has a single measure that covers the functions of the two measures provided in the pixel of FIG. 31A. In FIG. 31B, the single measure covers the function of the converter unit and the function of the driving unit. A current supplied to the pixel is converted into a voltage by the measure that is the converter unit as well as the driving unit, and then the measure supplies a current to the light emitting element in an amount suited to the voltage.

Specifically, in FIG. 31B, the TFT 533, the TFT 534, and the storage capacitor 535 correspond to the measure to convert a supplied current into a voltage, to hold the voltage, and to cause a current to flow into a light emitting element in an amount suited to the level of the voltage held.

When pixels are structured as shown in FIG. 31A or 31B, the amount of current flowing into a light emitting element can be controlled by a current source even if TFT characteristics such as threshold and ON current are fluctuated between pixels. Therefore fluctuation in luminance between light emitting elements of pixels can be prevented.

In general, lowering of luminance due to degradation of an organic light emitting material is smaller when a light emitting element emits light while keeping the current between electrodes constant than when a light emitting element emits light while keeping the voltage between electrodes constant. Accordingly, in the case of the current input type pixels shown in FIGS. 31A and 31B as examples, the amount of current flowing into a light emitting element can always be kept at a desired value and therefore lowering of luminance due to degradation of the light emitting element can be reduced.

The luminance of a light emitting element is in proportion to the amount of current flowing into its organic light emitting layer. In a current input type light emitting device, the amount of current flowing into a light emitting element can be kept constant even if the temperature of the organic light emitting layer is changed by the outside temperature or heat generated from the light emitting panel itself. Therefore a change in luminance of light emitting element can be prevented and an increase in current consumption accompanying a temperature rise can be avoided.

In the examples shown in FIGS. 31A and 31B, the first gate electrode and the second gate electrode are directly connected and $Vx=V_Y$ is satisfied. However, some or all of wirings may be set to a common voltage (Vcom) or ground voltage.

The structure of this embodiment may be combined freely with the structures shown in Embodiment Modes 1 through 6 and Embodiments 1 through 10.

According to the present invention, regions functioning as channels (channel formation regions) of plural thin film transistors in a pixel are arranged so as to have the same channel length direction and the channel length direction is matched to the scanning direction in laser light irradiation. Therefore the crystal growth direction coincides with the carrier moving direction and high field effect mobility can be obtained.

According to the present invention, TFT characteristics can be improved (specifically, increase in ON current and reduction in OFF current) and fluctuation in characteristic among TFTs can be reduced. In particular, fluctuation in ON current ($I_{on}$) of a TFT that is electrically connected to an EL element in a pixel to supply a current to the EL element can be reduced.

What is claimed is:

1. A light emitting device comprising:
   at least one pixel formed on an insulating surface, the pixel comprising:
   a light emitting element comprising an anode, a cathode, and a light emitting layer including an organic compound; and
   at least first and second thin film transistors,
   wherein the first thin film transistor is electrically connected to the anode or the cathode,
   wherein the first and second thin film transistors have the same channel length direction,
   wherein the channel length direction of the first and second thin film transistors is the same as a scanning direction of laser light irradiated to semiconductor layers of the first and second thin film transistors,
   wherein the first and second thin film transistors include crystals grown continuously in the scanning direction of the laser light, and
   wherein the second thin film transistor comprises a source region and a drain region one of which is electrically connected to a gate electrode of the first thin film transistor.

2. A light emitting device according to claim 1, wherein the device further comprises a buffer including a plurality of thin film transistors is provided in a driver circuit on the insulating surface, and the plurality of thin film transistors are arranged to have the same channel length.

3. A light emitting device according to claim 1, wherein the oscillation mode of the laser light is either continuous wave type or pulse oscillation type.

4. A light emitting device as claimed in claim 1, wherein the laser light is emitted from one or plural kinds selected from the group consisting of a YAG (yttrium aluminum garnet) laser, a YVO$_4$ (yttrium vanadate) laser, a YLF (yttrium lithium fluoride) laser, a YAlO$_3$ (yttrium alumina) laser, a glass laser, a ruby laser, an alexandrite laser, and a Ti:sapphire laser.

5. A light emitting device according to claim 1, wherein the laser light is emitted from one or plural kinds selected from the group consisting of an excimer laser, an Ar laser, and a Kr laser.

6. A light emitting device according to claim 1, wherein each of the first and second thin film transistors has a first electrode formed on the insulating surface, a first insulating film that covers the first electrode, a semiconductor layer formed on the first insulating film, a second insulating film that covers the semiconductor layer, and a second electrode formed on the second insulating film.

7. A light emitting device according to claim 6, wherein the second electrode is a gate electrode and the second insulating film is a gate insulating film.

8. A light emitting device according to claim 6, wherein the semiconductor layer comprises two impurity regions and a channel formation region sandwiched between the two impurity regions, and the first electrode and the second electrode overlap each other with the channel formation region interposed therebetween.

9. A light emitting device according to claim 6, wherein the first electrode is a gate electrode electrically connected to the second electrode.

10. A light emitting device according to claim 6, wherein the first electrode is connected to a fixed electric potential.

11. A light emitting device according to claim 6, wherein the first insulating film is leveled by chemical mechanical polishing.

12. A light emitting device according to claim 1, wherein the light emitting device is one selected from the group consisting of a video camera, a digital camera, a goggle type display, a navigation system for vehicles, a personal computer, and a portable information terminal.

13. A light emitting device comprising:
at least one pixel formed on an insulating surface, the pixel comprising:
a light emitting element comprising an anode, a cathode, and a light emitting layer including an organic compound; and
at least first, second, and third thin film transistors,
wherein the first thin film transistor is electrically connected to the anode or the cathode of the light emitting element,
wherein the first, second, and third thin film transistors are arranged to have the same channel length direction,
wherein the channel length direction of the first, second, and third thin film transistors is the same as a scanning direction of laser light irradiated to semiconductor layers of the first, second, and third thin film transistors, and
wherein the first, second, and third thin film transistors include crystals grown continuously in the scanning direction of the laser light, and
wherein the second thin film transistor comprises a source region and a drain region one of which is electrically connected to a gate electrode of the first thin film transistor.

14. A light emitting device according to claim 13, wherein the device further comprises a buffer including a plurality of thin film transistors is provided in a driver circuit on the insulating surface, and the plurality of thin film transistors are arranged to have the same channel length.

15. A light emitting device according to claim 13, wherein the oscillation mode of the laser light is either continuous wave type or pulse oscillation type.

16. A light emitting device as claimed in claim 13, wherein the laser light is emitted from one or plural kinds selected from the group consisting of a YAG (yttrium aluminum garnet) laser, a YVO$_4$ (yttrium vanadate) laser, a YLF (yttrium lithium fluoride) laser, a YAlO$_3$ (yttrium alumina) laser, a glass laser, a ruby laser, an alexandrite laser, and a Ti:sapphire laser.

17. A light emitting device according to claim 13, wherein the laser light is emitted from one or plural kinds selected from the group consisting of an excimer laser, an Ar laser, and a Kr laser.

18. A light emitting device according to claim 13, wherein each of the first to third thin film transistors has a first electrode formed on the insulating surface, a first insulating film that covers the first electrode, a semiconductor layer formed on the first insulating film, a second insulating film that covers the semiconductor layer, and a second electrode formed on the second insulating film.

19. A light emitting device according to claim 18, wherein the second electrode is a gate electrode and the second insulating film is a gate insulating film.

20. A light emitting device according to claim 18, wherein the semiconductor layer comprises two impurity regions and a channel formation region sandwiched between the two impurity regions, and the first electrode and the second electrode overlap each other with the channel formation region interposed therebetween.

21. A light emitting device according to claim 18, wherein the first electrode is a gate electrode electrically connected to the second electrode.

22. A light emitting device according to claim 18, wherein the first electrode is connected to a fixed electric potential.

23. A light emitting device according to claim 18, wherein the first insulating film is leveled by chemical mechanical polishing.

24. A light emitting device according to claim 13, wherein the light emitting device is one selected from the group consisting of a video camera, a digital camera, a goggle type display, a navigation system for vehicles, a personal computer, and a portable information terminal.

25. A light emitting device comprising:
at least one pixel formed on an insulating surface, the pixel comprising:
a light emitting element comprising an anode, a cathode, and a light emitting layer including an organic compound; and
first, second, and third thin film transistors,
wherein the first thin film transistor is electrically connected to the anode or the cathode of the light emitting element,
wherein the first, second, and third thin film transistors are arranged to have the same channel length direction,
wherein the channel length direction of the first, second, and third thin film transistors is the same as a scanning direction of laser light irradiated to semiconductor layers of the first, second, and third thin film transistors,
wherein a semiconductor layer of the second thin film transistor and a semiconductor layer of the third thin film transistor are formed in the same semiconductor island, wherein the first, second, and third thin film transistors include crystals grown continuously in the scanning direction of the laser light, and wherein the second thin film transistor comprises a source region and a drain region one of which is electrically connected to a gate electrode of the first thin film transistor.

26. A light emitting device according to claim 25, wherein the device further comprises a buffer including a plurality of thin film transistors provided in a driver circuit on the insulating surface and the plurality of thin film transistors are arranged to have the same channel length.

27. A light emitting device according to claim 25, wherein the oscillation mode of the laser light is either continuous wave type or pulse oscillation type.

28. A light emitting device as claimed in claim 25, wherein the laser light is emitted from one or plural kinds selected from the group consisting of a YAG (yttrium aluminum garnet) laser, a $YVO_4$ (yttrium vanadate) laser, a YLF (yttrium lithium fluoride) laser, a $YAlO_3$ (yttrium alumina) laser, a glass laser, a ruby laser, an alexandrite laser, and a Ti:sapphire laser.

29. A light emitting device according to claim 25, wherein the laser light is emitted from one or plural kinds selected from the group consisting of an excimer laser, an Ar laser, and a Kr laser.

30. A light emitting device according to claim 25, wherein each of the first to third thin film transistors has a first electrode formed on the insulating surface, a first insulating film that covers the first electrode, a semiconductor layer formed on the first insulating film, a second insulating film that covers the semiconductor layer, and a second electrode formed on the second insulating film.

31. A light emitting device according to claim 30, wherein the second electrode is a gate electrode and the second insulating film is a gate insulating film.

32. A light emitting device according to claim 30, wherein the semiconductor layer of at least one of first to third thin film transistors comprises two impurity regions and a channel region sandwiched between the two impurity regions, and the first electrode and the second electrode overlap each other with the channel region interposed therebetween.

33. A light emitting device according to claim 30, wherein the first electrode is a gate electrode electrically connected to the second electrode.

34. A light emitting device according to claim 30, wherein the first electrode is connected to a fixed electric potential.

35. A light emitting device according to claim 30, wherein the first insulating film is leveled by chemical mechanical polishing.

36. A light emitting device according to claim 25, wherein the light emitting device is one selected from the group consisting of a video camera, a digital camera, a goggle type display, a navigation system for vehicles, a personal computer, and a portable information terminal.

37. A light emitting device comprising:
at least one pixel formed on an insulating surface, the pixel comprising:
a light emitting element comprising an anode, a cathode, and a light emitting layer including an organic compound;
first, second, third, and fourth thin film transistors,
wherein the first thin film transistor is electrically connected to the anode or the cathode of the light emitting element, wherein the first, second, third, and fourth thin film transistors are arranged to have the same channel length direction, and wherein the channel length direction of the first, second, third, and fourth thin film transistors is the same as a scanning direction of laser light irradiated to semiconductor layers of the first, second, third, and fourth thin film transistors.

38. A light emitting device according to claim 37, wherein the device further comprises a buffer including a plurality of thin film transistors provided in a driver circuit on the insulating surface and the plurality of thin film transistors are arranged to have the same channel length.

39. A light emitting device according to claim 37, wherein the oscillation mode of the laser light is either continuous wave type or pulse oscillation type.

40. A light emitting device as claimed in claim 37, wherein the laser light is emitted from one or plural kinds selected from the group consisting of a YAG (yttrium aluminum garnet) laser, a $YVO_4$ (yttrium vanadate) laser, a YLF (yttrium lithium fluoride) laser, a $YAlO_3$ (yttrium alumina) laser, a glass laser, a ruby laser, an alexandrite laser, and a Ti:sapphire laser.

41. A light emitting device according to claim 37, wherein the laser light is emitted from one or plural kinds selected from the group consisting of an excimer laser, an Ar laser, and a Kr laser.

42. A light emitting device according to claim 37, wherein each of the first to third thin film transistors has a first electrode formed on the insulating surface, a first insulating film that covers the first electrode, a semiconductor layer formed on the first insulating film, a second insulating film that covers the semiconductor layer, and a second electrode formed on the second insulating film.

43. A light emitting device according to claim 42, wherein the second electrode is a gate electrode and the second insulating film is a gate insulating film.

44. A light emitting device according to claim 42, wherein the semiconductor layer of at least one of first to third thin film transistors comprises two impurity regions and a channel region sandwiched between the two impurity regions, and the first electrode and the second electrode overlap each other with the channel region interposed therebetween.

45. A light emitting device according to claim 42, wherein the first electrode is a gate electrode electrically connected to the second electrode.

46. A light emitting device according to claim 42, wherein the first electrode is connected to a fixed electric potential.

47. A light emitting device according to claim 42, wherein the first insulating film is leveled by chemical mechanical polishing.

48. A light emitting device according to claim 37, wherein the light emitting device is one selected from the group consisting of a video camera, a digital camera, a goggle type display, a navigation system for vehicles, a personal computer, and a portable information terminal.

49. A light emitting device comprising:
at least one pixel formed on an insulating surface, the pixel comprising:
a light emitting element comprising an anode, a cathode, and a light emitting layer including an organic compound; first, second, third, fourth, and fifth thin film transistors,
wherein the first thin film transistor is electrically connected to the anode or the cathode of the light emitting element, wherein the first, second, third, fourth, and fifth thin film transistors are arranged to have the same channel length direction, and wherein the channel length direction of the first, second, third, fourth, and fifth thin film transistors is the same as a scanning direction of laser light irradiated to semiconductor layers of the first, second, third, fourth, and fifth thin film transistors.

50. A light emitting device according to claim 49, wherein the device further comprises a buffer including a plurality of thin film transistors provided in a driver circuit on the insulating surface and the plurality of thin film transistors are arranged to have the same channel length.

51. A light emitting device according to claim 49, wherein the oscillation mode of the laser light is either continuous wave type or pulse oscillation type.

52. A light emitting device as claimed in claim 49, wherein the laser light is emitted from one or plural kinds selected from the group consisting of a YAG (yttrium aluminum garnet) laser, a $YVO_4$ (yttrium vanadate) laser, a YLF (yttrium lithium fluoride) laser, a $YAlO_3$ (yttrium alumina) laser, a glass laser, a ruby laser, an alexandrite laser, and a Ti:sapphire laser.

53. A light emitting device according to claim 49, wherein the laser light is emitted from one or plural kinds selected from the group consisting of an excimer laser, an Ar laser, and a Kr laser.

54. A light emitting device according to claim 49, wherein each of the first to third thin film transistors has a first electrode formed on the insulating surface, a first insulating film that covers the first electrode, a semiconductor layer formed on the first insulating film, a second insulating film that covers the semiconductor layer, and a second electrode formed on the second insulating film.

55. A light emitting device according to claim 54, wherein the second electrode is a gate electrode and the second insulating film is a gate insulating film.

56. A light emitting device according to claim 54, wherein the semiconductor layer of at least one of first to third thin film transistors comprises two impurity regions and a channel region sandwiched between the two impurity regions, and the first electrode and the second electrode overlap each other with the channel region interposed therebetween.

57. A light emitting device according to claim 54, wherein the first electrode is a gate electrode electrically connected to the second electrode.

58. A light emitting device according to claim 54, wherein the first electrode is connected to a fixed electric potential.

59. A light emitting device according to claim 54, wherein the first insulating film is leveled by chemical mechanical polishing.

60. A light emitting device according to claim 49, wherein the light emitting device is one selected from the group consisting of a video camera, a digital camera, a goggle type display, a navigation system for vehicles, a personal computer, and a portable information terminal.

* * * * *